United States Patent
Huang et al.

(10) Patent No.: US 12,154,965 B2
(45) Date of Patent: Nov. 26, 2024

(54) CARRIER BARRIER LAYER FOR TUNING A THRESHOLD VOLTAGE OF A FERROELECTRIC MEMORY DEVICE

(71) Applicant: Taiwan Semiconductor Manufacturing Company, Ltd., Hsinchu (TW)

(72) Inventors: Rainer Yen-Chieh Huang, Changhua County (TW); Hai-Ching Chen, Hsinchu (TW); Yu-Ming Lin, Hsinchu (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 106 days.

(21) Appl. No.: 17/882,034

(22) Filed: Aug. 5, 2022

(65) Prior Publication Data
US 2022/0375947 A1    Nov. 24, 2022

Related U.S. Application Data

(62) Division of application No. 17/319,461, filed on May 13, 2021, now Pat. No. 11,769,815.
(Continued)

(51) Int. Cl.
*H01L 29/78* (2006.01)
*H01L 21/28* (2006.01)
(Continued)

(52) U.S. Cl.
CPC ...... *H01L 29/516* (2013.01); *H01L 29/40111* (2019.08); *H01L 29/41725* (2013.01);
(Continued)

(58) Field of Classification Search
CPC ............ H01L 29/516; H01L 29/40111; H01L 29/6684; H01L 29/78391; H01L 29/7843
(Continued)

(56) References Cited

U.S. PATENT DOCUMENTS 6,707,082 B2 *  3/2004  Haneder ............... H01L 29/516
                                                    257/388
6,737,689 B1 *  5/2004  Schlosser ............. H01L 29/516
                                                    438/785
(Continued)

OTHER PUBLICATIONS

Notice of Allowance dated May 2, 2023 for U.S. Appl. No. 17/319,461.
(Continued)

*Primary Examiner* — Sheikh Maruf
(74) *Attorney, Agent, or Firm* — Eschweiler & Potashnik, LLC

(57) ABSTRACT

The present disclosure relates to an integrated circuit (IC) chip including a memory cell with a carrier barrier layer for threshold voltage tunning. The memory cell may, for example, include a gate electrode, a ferroelectric structure, and a semiconductor structure. The semiconductor structure is vertically stacked with the gate electrode and the ferroelectric structure, and the ferroelectric structure is between the gate electrode and the semiconductor structure. A pair of source/drain electrodes is laterally separated and respectively on opposite sides of the gate electrode, and a carrier barrier layer separates the source/drain electrodes from the semiconductor structure.

20 Claims, 31 Drawing Sheets

Related U.S. Application Data

(60) Provisional application No. 63/157,158, filed on Mar. 5, 2021.

(51) Int. Cl.

| | |
|---|---|
| *H01L 29/417* | (2006.01) |
| *H01L 29/51* | (2006.01) |
| *H01L 29/66* | (2006.01) |
| *H01L 51/30* | (2006.01) |
| *H10B 51/20* | (2023.01) |
| *H10B 51/30* | (2023.01) |

(52) U.S. Cl.
CPC ...... *H01L 29/6656* (2013.01); *H01L 29/6684* (2013.01); *H01L 29/78391* (2014.09); *H10B 51/20* (2023.02); *H10B 51/30* (2023.02)

(58) Field of Classification Search
USPC .......................................................... 257/295
See application file for complete search history.

(56) References Cited

U.S. PATENT DOCUMENTS

| | | | | |
|---|---|---|---|---|
| 8,541,767 | B2* | 9/2013 | Fang | H10N 70/8822 |
| | | | | 438/102 |
| 9,087,769 | B2* | 7/2015 | Kim | G11C 11/1657 |
| 9,978,868 | B2* | 5/2018 | Lai | H01L 29/516 |
| 10,121,882 | B1* | 11/2018 | Ho | H01L 29/516 |
| 2001/0042888 | A1 | 11/2001 | Willer et al. | |
| 2005/0059172 | A1* | 3/2005 | Kim | H01L 29/78391 |
| | | | | 257/E21.208 |
| 2005/0068822 | A1* | 3/2005 | Kijima | H01L 29/78391 |
| | | | | 257/E21.208 |
| 2006/0138508 | A1* | 6/2006 | Shimizu | H01L 21/02189 |
| | | | | 257/295 |
| 2006/0183274 | A1 | 8/2006 | Carcia et al. | |
| 2008/0093643 | A1 | 4/2008 | Park | |
| 2008/0224145 | A1* | 9/2008 | Ohmi | H01L 29/66825 |
| | | | | 257/295 |
| 2008/0251816 | A1* | 10/2008 | Tanaka | H01L 29/78391 |
| | | | | 257/295 |
| 2011/0316059 | A1* | 12/2011 | Ahn | H01L 29/78391 |
| | | | | 257/295 |
| 2015/0236120 | A1* | 8/2015 | Hashemi | H01L 21/823807 |
| | | | | 438/284 |
| 2016/0064510 | A1* | 3/2016 | Mueller | H10B 53/30 |
| | | | | 257/295 |
| 2017/0194378 | A1* | 7/2017 | Kim | H10B 63/30 |
| 2018/0166453 | A1 | 6/2018 | Mueller et al. | |
| 2018/0182860 | A1* | 6/2018 | Lee | H01L 21/823842 |
| 2019/0019802 | A1 | 1/2019 | Yoo et al. | |
| 2019/0067488 | A1* | 2/2019 | Tsai | H01L 29/66545 |
| 2019/0131420 | A1 | 5/2019 | Lu et al. | |
| 2019/0131458 | A1* | 5/2019 | Yoo | H01L 29/78391 |
| 2019/0198617 | A1* | 6/2019 | Li | H01L 29/7881 |
| 2019/0304987 | A1 | 10/2019 | Dong et al. | |
| 2019/0355826 | A1* | 11/2019 | Avci | H01L 29/42392 |
| 2020/0013871 | A1* | 1/2020 | An | H01L 29/516 |
| 2020/0091274 | A1* | 3/2020 | Sharma | H01L 29/4908 |
| 2020/0098930 | A1* | 3/2020 | Le | H01L 29/458 |
| 2020/0105898 | A1* | 4/2020 | Hsu | H01L 29/517 |

OTHER PUBLICATIONS

Non-Final Office Action dated Oct. 14, 2022 for U.S. Appl. No. 17/319,461.
Hasegawa, Masakatsu. "Ellingham Diagram." Treatise on Process Metallurgy, vol. 1, published in 2014.
Kwon et al. "Recent Progress in High Performance and Reliable n-type Transition Metal Oxide-Based Thin Film Transistors." Semicond. Sci. Technol. 30 (2015) 024002 (16pp), published on Jan. 19, 2015.
Beneq. "How ALD Works." The date of publication is unknown. Retrieved online on Dec. 11, 2020 from https://beneq.com/en/technology/ald/.
Kahraman, Aysegul. "Understanding of post deposition annealing and substrate temperature effects on structural and electrical properties of Gd2O3 MOS capacitor." Journal of Materials Science: Materials in Electronics vol. 29, pp. 7993-8001(2018), published on Feb. 22, 2018.
Sundqvist, Jonas "Entegris launch Fluorine-Free Tungsten (FFW) for 3D NAND." BALD Engineering, published on Aug. 27, 2016.
McCormick, Abraham. "Thin Film System TFS 500. Advanced tool for advanced ALD research." Published, Dec. 2007.
Wikipedia.org. "Atomic layer deposition." Published on Nov. 29, 2020.
Wikipedia.org "Fe FET" Published on Nov. 28, 2020.
Wikipedia.org. "Indium gallium zinc oxide" Published on Sep. 21, 2020.
Zan et al. "Achieving High Field-Effect Mobility in Amorphous Indium-Gallium-Zinc Oxide by Capping a Strong Reduction Layer." Adv. Mater. 2012, 24, 3509-3514, published on Jun. 8, 2012.
Onaya et al. "Improvement in ferroelectricity of HfxZr1—xO2 Thin Films Using Top and Bottom ZrO2 Nucleation Layers." APL Mater. 7, 061107 (2019); doi: 10.1063/1.5096626, published on Jun. 27, 2019.
Onaya et al. "Improvement in Ferroelectricity of HfxZr1%xO2 Thin Films Using ZrO2 Seed Layer." Applied Physics Express 10, 081501 (2017), published on Jul. 13, 2017.
Robertson, J. "Band structures and band offsets of high K dielectrics on Si" Applied Surface Science 190 !2002) 2±10, published in 2002.
Hays et al. "Energy band offsets of dielectrics on InGaZnO4" Applied Physics Reviews 4, 021301 (2017), published on Apr. 18, 2017.
Hays et al. "Band offsets in HfSiO4/IGZO heterojunctions" J. Vac. Sci. Technol. B 33(6), Nov./Dec. 2015, published on Nov. 19, 2015.
Hays et al. "Effect of deposition conditions and composition on band offsets in atomic layer deposited HfxSi1—xOy on InGaZnO4" J. Vac. Sci. Technol. B 35(1), Jan./Feb. 2017, published on Jan. 11, 2017.
Materlik et al. "The Origin of Ferroelectricity in HfxZr1—xO2: A Computational Investigation and a Surface Energy Model" Journal of Applied Physics 117, 134109 (2015), published on Apr. 7, 2015.
Dogan et al. "Causes of ferroelectricity in HfO2-based thin films: An ab initio perspective" Physical Chemistry Chemical Physics— May 2019, published on May 29, 2019.
Estandia et al. "Engineering Ferroelectric Hf0.5Zr0.5O2 Thin Films by Epitaxial Stress" ACS Applied Electronic Materials, 1, 1449 (2019), published on Jul. 3, 2019.
Huang et al. "Performance tuning of InGaZnO thin-film transistors with a SninGaZnO electron barrier layer." Applied Physics Letters 102, 092108 (2013), published on Mar. 8, 2013.
Takechi et al. "Depth-profiling XPS analysis of He-plasma treated amorphous InGaZnO thin films for use in top-gate coplanar thin-film transistors" Japanese Journal of Applied Physics 58, 038005 (2019), published on Feb. 11, 2019.
U.S. Appl. No. 17/168,342, filed Feb. 5, 2021.
U.S. Appl. No. 17/168,361, filed Feb. 5, 2021.
Meng et al. "Robust SiNx/GaN MIS-HEMTs With Crystalline Interfacial Layer Using Hollow Cathode Peald" IEEE Electron Device Letters, vol. 39, No. 8, Aug. 2018, published on Jun. 20, 2018.
Bagdasaryan et al. "A new type of (TiZrNbTaHf)N/MoN nanocomposite coating: Microstructure and properties depending on energy of incident ions" Composites Part B: Engineering vol. 146, Aug. 1, 2018, pp. 132-144, published on Apr. 6, 2018.

* cited by examiner

CARRIER BARRIER LAYER FOR TUNING A THRESHOLD VOLTAGE OF A FERROELECTRIC MEMORY DEVICE

REFERENCE TO RELATED APPLICATIONS

This Application is a Divisional of U.S. application Ser. No. 17/319,461, filed May 13, 2021, which claims the benefit of U.S. Provisional Application No. 63/157,158, filed Mar. 5, 2021. The contents of the above-referenced Patent Applications are hereby incorporated by reference in their entirety.

BACKGROUND

Many modern-day electronic devices include non-volatile memory. Non-volatile memory is electronic memory that is able to store data when powered and also in the absence of power. A promising candidate for the next generation of non-volatile memory is ferroelectric random-access memory (FeRAM). FeRAM has a relatively simple structure and is compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
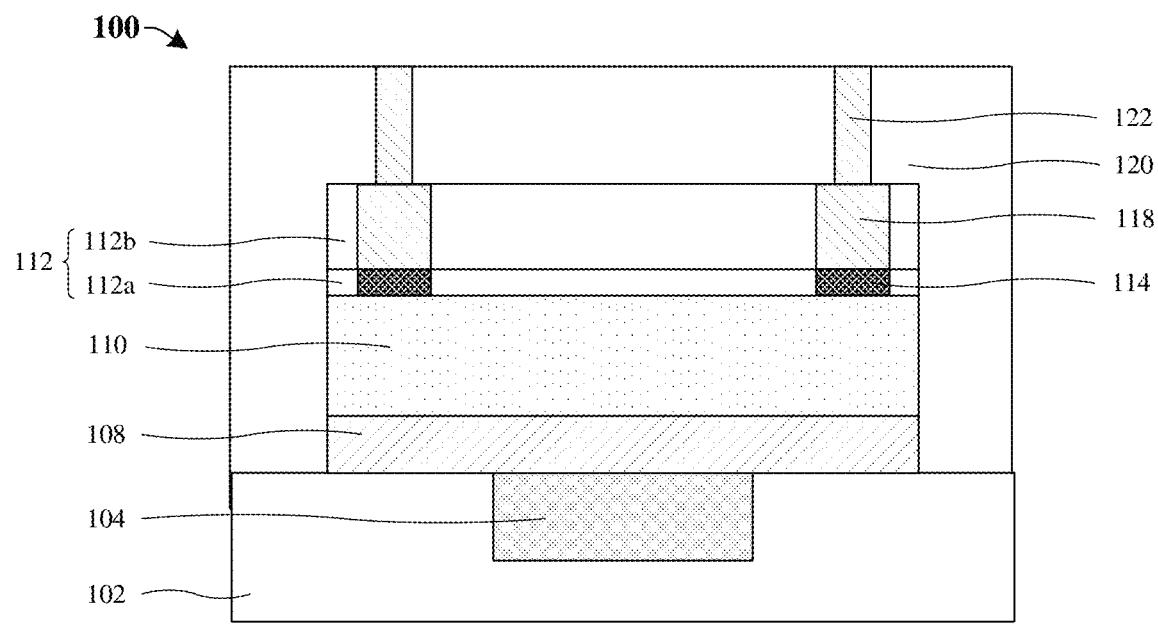
FIG. 1 illustrates a cross-sectional view of some embodiments of an integrated circuit (IC) chip in which a bottom gate ferroelectric field-effect transistor (FeFET) structure comprises a carrier barrier layer separating a pair of source/drain electrodes from a semiconductor structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Modern integrated circuit (IC) chips may include ferroelectric field-effect transistors (FeFETs) based on thin film transistors (TFT). A TFT-based FeFET includes a gate electrode, a ferroelectric layer, and a semiconductor structure vertically stacked with each other. The semiconductor structure may, for example, be or comprise amorphous indium gallium zinc oxide (a-IGZO) or some other suitable semiconductor material. Further, the TFT-based FeFET includes a pair of source/drain electrodes disposed respectively on opposite sides of the gate electrode.

A challenge with the TFT-based FeFET is that a threshold voltage and/or a turn-off voltage of the TFT-based FeFET may be negative. Thus, the TFT-based FeFET may depend on a constant negative voltage to maintain an off state, which may reduce power efficiency. Some solutions include tuning a composition and/or a thickness of the semiconductor structure. However, these solutions may can cause severe mobility and/or on-current degradation.

Various embodiments of the present disclosure are related to an IC chip comprising a FeFET, the FeFET comprising a carrier barrier layer arranged between a pair of source/drain electrodes and a semiconductor structure for tuning a threshold voltage of the IC chip. The FeFET comprises a gate electrode, a ferroelectric layer, and the semiconductor structure vertically stacked with each other. A pair of source/drain electrodes are over the semiconductor structure and are laterally spaced apart from one another. A carrier barrier layer is arranged between the pair of source/drain electrodes and the semiconductor structure.

By including the carrier barrier layer between the pair of source/drain electrodes and the semiconductor structure, a threshold voltage and/or a turn-off voltage of the transistor may be tuned. For example, in n-type devices, the carrier barrier layer may produce an electron barrier between the pair of source/drain electrodes and the semiconductor structure that may increase the threshold voltage of the transistor, and in p-type devices, the carrier barrier layer may produce a hole barrier between the pair of source/drain electrodes and the semiconductor structure that may increase the threshold voltage of the transistor. As a result of the increased threshold voltage, the FeFET may depend on little or zero voltage to maintain the FeFET in the off state, and hence a power consumption of the IC chip may be reduced. Further, this is accomplished with little to no effect on mobility and/or on-current, and can further lead to a decrease in leakage current.

FIG. 1 illustrates a cross-sectional view 100 of some embodiments of an IC chip in which a bottom gate FeFET structure comprises a carrier barrier layer 114 separating a pair of source/drain electrodes 118 from a semiconductor structure 110. A ferroelectric layer 108, the semiconductor structure 110, and a gate electrode 104 are vertically stacked over a substrate 102, such that the ferroelectric layer 108 is disposed between the gate electrode 104 and the semiconductor structure 110. The pair of source/drain electrodes 118 are laterally separated and respectively disposed on opposite sides of the gate electrode 104, and a carrier barrier layer 114 is disposed between the source/drain electrodes 118 and the semiconductor structure 110. The pair of source/drain electrodes 118 are disposed on an opposite side of the semiconductor structure 110 as the gate electrode 104.

A passivation structure 112 extends between sidewalls of the carrier barrier layer 114 and laterally separates a first segment of the carrier barrier layer 114 from a second segment of the carrier barrier layer 114. In some embodiments, the passivation structure 112 comprises a first passivation layer 112a disposed between sidewalls of the carrier barrier layer 114, and a second passivation layer 112b disposed over the first passivation layer 112a. In some embodiments, the second passivation layer 112b extends between sidewalls of the pair of source/drain electrodes 118 and laterally separates the source electrode from the drain electrode. In some embodiments, an inter-layer dielectric (ILD) structure 120 overlies the passivation structure 112 and the substrate 102. In further embodiments, a plurality of contacts 122 extend through the ILD structure 120 and contact the pair of source/drain electrodes 118.

During operation of the bottom gate FeFET structure, a remnant polarization of the ferroelectric layer 108 is employed to represent a bit of data. A first state of the remnant polarization may represent a binary 1, whereas a second state of the remnant polarization may represent a binary 0, or vice versa.

To write to the bottom gate FeFET structure, a set voltage or a reset voltage is applied from the gate electrode 104 to the semiconductor structure 110 (e.g., via the pair of source/drain electrodes 118). The set and reset voltages have opposite polarities and magnitudes in excess of a coercive voltage of the ferroelectric layer 108. The set voltage sets the remnant polarization of the ferroelectric layer 108 to the first state, whereas the reset voltage sets the remnant polarization to second state, or vice versa.

To read from the bottom gate FeFET structure, a read voltage less than the coercive voltage of the ferroelectric layer 108 is applied from the gate electrode 104 to a source one of the pair of source/drain electrodes 118. Depending on whether the semiconductor structure 110 conducts, the remnant polarization is in the first or second state.

More particularly, because the bottom gate FeFET structure is a FET, the semiconductor structure 110 selectively conducts depending upon whether a voltage applied to the gate electrode 104 exceeds a threshold voltage. Further, the ferroelectric layer 108 changes the threshold voltage based on a state of the remnant polarization. Therefore, the semiconductor structure 110 conducts based on the state of the remnant polarization when the read voltage is between the different threshold voltage states.

By including the carrier barrier layer 114 between the pair of source/drain electrodes 118 and the semiconductor structure 110, the carrier barrier layer 114 produces a carrier barrier between the pair of source/drain electrodes 118 and the semiconductor structure 110 that shifts a threshold voltage of the bottom gate FeFET, shifts an OFF voltage of the bottom gate FeFET, and reduces leakage current. In embodiments in which the bottom gate FeFET structure is n-type, the carrier barrier layer 114 is an electron barrier. In embodiments in which the bottom gate FeFET structure is p-type, the carrier barrier layer 114 is a hole barrier.

The carrier barrier layer 114 forms a Schottky barrier at a first interface with the source/drain electrodes 118, and the Schottky barrier height is greater than what it would be without the carrier barrier layer 114 (i.e., what it would be if the source/drain electrodes 118 and the semiconductor structure 110 formed the Schottky barrier). Hence, in embodiments in which the bottom gate FeFET structure is n-type and hence the carrier barrier layer 114 is an electron barrier, the bottom conduction band edge of the carrier barrier layer 114 has a higher energy than the fermi level of the source/drain electrodes 118 at the first interface. Further, the bottom conduction band edge of the carrier barrier layer 114 has a higher energy at the first interface than the semiconductor structure 110 would have if the semiconductor structure 110 instead formed the Schottky barrier with the source/drain electrodes 118. Further, in embodiments in which the bottom gate FeFET structure is p-type and hence the carrier barrier layer 114 is a hole barrier layer, the top valence band edge of the carrier barrier layer 114 has a lower energy than the fermi level of the source/drain electrodes 118 at the first interface. Further, the top valence band edge of the carrier barrier layer 114 has a lower energy at the first interface than the semiconductor structure 110 would have if the semiconductor structure 110 instead formed the Schottky barrier with the source/drain electrodes 118. In some embodiments, the Schottky barrier height ranges from about 0.30 electron volts (eV) to 0.50 eV, about 0.30 eV to 0.45 eV, about 0.35 eV to 0.50 eV, or another suitable value.

The greater Schottky barrier height from inclusion of the carrier barrier layer 114, lowers a rate that carriers (e.g., electrons for an n-type FeFET or holes for a p-type FeFET) flow from the pair of source/drain electrodes 118 to the semiconductor structure 110 and therefore shifts the threshold voltage. In embodiments in which the bottom gate FeFET structure is n-type, the shift is positive. In embodiments in which the bottom gate FeFET structure is p-type, the shift is negative. Additionally, as a thickness of the carrier barrier layer 114 increases, the magnitude of the shift increases. Similarly, as the thickness decreases, the magnitude decreases.

The carrier barrier layer 114 further serves as a barrier for carriers flowing from a source one of the source/drain electrodes 118 to a drain one of the source/drain electrodes 118 at a second interface between the semiconductor structure 110 and the carrier barrier layer 114. Hence, in embodiments in which the bottom gate FeFET structure is n-type and hence the carrier barrier layer 114 is an electron barrier, the bottom conduction band edge of the carrier barrier layer 114 has a higher energy at the second interface than the semiconductor structure 110 at the second interface. In some embodiments, the difference between the energy of the bottom conduction band edge of the carrier barrier layer 114 and that of the semiconductor structure 110 at the second interface is greater than what it would be without the carrier barrier layer 114 (i.e., what it would be if the source/drain electrodes 118 and the semiconductor structure 110 formed the barrier). Further, in embodiments in which the bottom gate FeFET structure is p-type and hence the carrier barrier layer 114 is a hole barrier, the top valence band edge of the carrier barrier layer 114 has a lower energy at the second interface than the semiconductor structure 110 at the second interface. In some embodiments, the difference between the energy of the top valence band edge of the carrier barrier layer 114 and that of the semiconductor structure 110 at the second interface is greater than what it would be without the carrier barrier layer 114 (i.e., what it would be if the source/drain electrodes 118 and the semiconductor structure 110 formed the barrier). Because the carrier barrier layer 114 serves as a barrier for carriers flowing in the semiconductor structure 110, leakage current is reduced, OFF current is reduced, and OFF voltage is shifted. The shift in the OFF voltage follows the shift in the threshold voltage. When the bottom gate FeFET structure is n-type, the shift is positive. When the bottom gate FeFET is p-type, the shift is negative.

To the extent that bottom gate FeFET is n-type and the threshold voltage and/or the OFF voltage would be negative without the carrier barrier layer 114, the positive shift may shift the threshold voltage and the OFF voltage positive. If the threshold voltage and/or the OFF voltage were negative, the bottom gate FeFET structure would depend on a constant voltage at the gate electrode 104 to maintain the bottom gate FeFET structure in an OFF state, which would reduce power efficiency. Therefore, by shifting the threshold voltage positive and the OFF voltage positive, the carrier barrier layer 114 may allow the bottom gate FeFET structure to maintain an OFF state at a reduced voltage or even in the absence of a voltage at the gate electrode 104, which may enhance power efficiency.

In some embodiments, the carrier barrier layer 114 is or otherwise comprises, for example, lightly tin-doped Indium-Gallium-Zinc-Oxide (SnIGZO), lightly magnesium-doped Indium-Gallium-Zinc-Oxide (MgIGZO), or some other suitable material(s) that form a Schottky barrier with the pair of source/drain electrodes 118. In some embodiments, the carrier barrier layer 114 has a thickness ranging from about 10 nanometers to 600 nanometers, about 10 nanometers to 250 nanometers, about 250 nanometers to 600 nanometers, about 50 nanometers to 350 nanometers, or some other suitable value. At too low of a thickness (e.g., less than about 10 nanometers), the carrier barrier layer 114 fails to form a suitable carrier barrier between the semiconductor structure 110 and the pair of source/drain electrodes 118. At too high of a thickness (e.g., greater than about 600 nanometers), the carrier barrier layer 114 prevents proper carrier (e.g., electrons, holes) flow to the pair of source/drain electrodes 118, thereby decreasing mobility. In some embodiments in which the bottom gate FeFET is n-type, a bottom conductive band edge of the carrier barrier layer 114 is greater than that of the semiconductor structure 110. In some embodiments in which the bottom gate FeFET is p-type, a top valence band edge of the carrier barrier layer 114 is less than that of the semiconductor structure 110.

In some embodiments, the bottom gate FeFET structure is a columnar structure, such that outer sidewalls of the semiconductor structure 110 and the ferroelectric layer 108 are vertically aligned and laterally between outer sidewalls of the substrate 102. In some embodiments, the gate electrode 104 is a buried electrode, such that it is disposed along inner sidewalls of the substrate 102.

In some embodiments, the semiconductor structure 110 is or comprises amorphous Indium-Gallium-Zinc-Oxide (a-IGZO) and/or some other suitable material, and/or has a thickness ranging from about 2 nanometers to 70 nanometers, 10 nanometers to 40 nanometers, or some other suitable value. In some embodiments, the semiconductor structure 110 is or comprises silicon, silicon germanium, a group III-V material, a group II-VI material, some other suitable semiconductor material, or any combination of the foregoing. The group III-V material may, for example, be or comprise gallium arsenide (e.g., GaAs), gallium arsenide indium (e.g., GaAsIn), some other suitable group III-V material, or any combination of the foregoing. The group II-VI material may, for example, be or comprise zinc oxide (e.g., ZnO), magnesium oxide (e.g., MgO), gadolinium oxide (e.g., GdO), some other suitable II-VI material, or any combination of the foregoing. In some embodiments, the pair of source/drain electrodes 118 and the plurality of contacts 122 are or otherwise comprise, for example, aluminum, titanium, tantalum, tungsten, gold, ruthenium, some other suitable conductive material(s), or any combination of the foregoing. In some embodiments, the ILD structure 120 and the substrate 102 are or comprise, for example, a nitride (e.g., silicon nitride, silicon oxynitride, etc.), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), any combination of the foregoing, or the like.

In some embodiments, the gate electrode 104 is or comprises titanium nitride (e.g., TiN), tantalum nitride (e.g., TaN), platinum (e.g., Pt), titanium (e.g., Ti), tantalum (e.g., Ta) tungsten (e.g., W), iron (e.g., Fe), nickel (e.g., Ni), beryllium (e.g., Be), chromium (e.g., Cr), cobalt (e.g., Co), antimony (e.g., Sb), iridium (e.g., Jr), molybdenum (e.g., Mo), osmium (e.g., Os), thorium (e.g., Th), vanadium (e.g., V), some other suitable metal(s), or any alloy or combination of the foregoing. In some embodiments, the gate electrode 104 has a thickness of about 15 nanometers, about 15-500 nanometers, or some other suitable thickness. In some embodiments, the gate electrode 104 has a smaller coefficient of thermal expansion than an overlying layer (e.g., the ferroelectric layer 108), such that the gate electrode 104 applies tensile stress on the overlying layer. In the event that the overlying layer is the ferroelectric layer 108, the tensile stress promotes the orthorhombic phase, which increases remanent polarization. In some embodiments, the passivation structure 112 is or comprises, for example, aluminum oxide, silicon oxide, some other suitable low-k dielectric material(s), or a combination of the foregoing.

In some embodiments, the ferroelectric layer 108 is or comprises hafnium zirconium oxide (e.g., HfZrO) and/or is doped with aluminum (e.g., Al), silicon (e.g., Si), lanthanum (e.g., La), scandium (e.g., Sc), calcium (e.g., Ca), barium (e.g., Ba), gadolinium (e.g., Gd), yttrium (e.g., Y), strontium (e.g., Sr), some other suitable element(s), or any combination of the foregoing to increase remanent polarization. In some embodiments, the ferroelectric layer 108 is or comprises $Hf_xZr_{1-x}O_2$ with x ranging from 0 to 1. For example, the ferroelectric layer 108 may be or comprise $Hf_{0.5}Zr_{0.5}O_2$.

In some embodiments, the ferroelectric layer 108 is or comprises aluminum nitride (e.g., AlN) doped with scandium (e.g., Sc) and/or some other suitable element(s). In some embodiments, the ferroelectric structure is or comprises a material with oxygen vacancies. In some embodiments, the ferroelectric layer 108 is some other suitable ferroelectric material. In some embodiments, the ferroelectric layer 108 has a ratio of orthorhombic, tetragonal, and cubic phases to orthorhombic, tetragonal, cubic, and monoclinic phases (e.g., (O+T+C)/(O+T+C+M)) that is greater than about 0.5 or some other suitable value. In some embodiments, the ferroelectric layer 108 has a thickness of about 0.1-100 nanometers, about 50-100 nanometers, about 0.1-50 nanometers, or some other suitable value. If the thickness is too large (e.g., greater than about 100 nanometers or some other suitable value), the orthorhombic phase may be thermodynamically unstable and hence the ferroelectric layer 108 may have low or non-existent remnant polarizations.

FIGS. 2A-2H illustrate cross-sectional views of some alternative embodiments of the IC chip of FIG. 1 in which the bottom gate FeFET structure is varied.

Figure 2A:
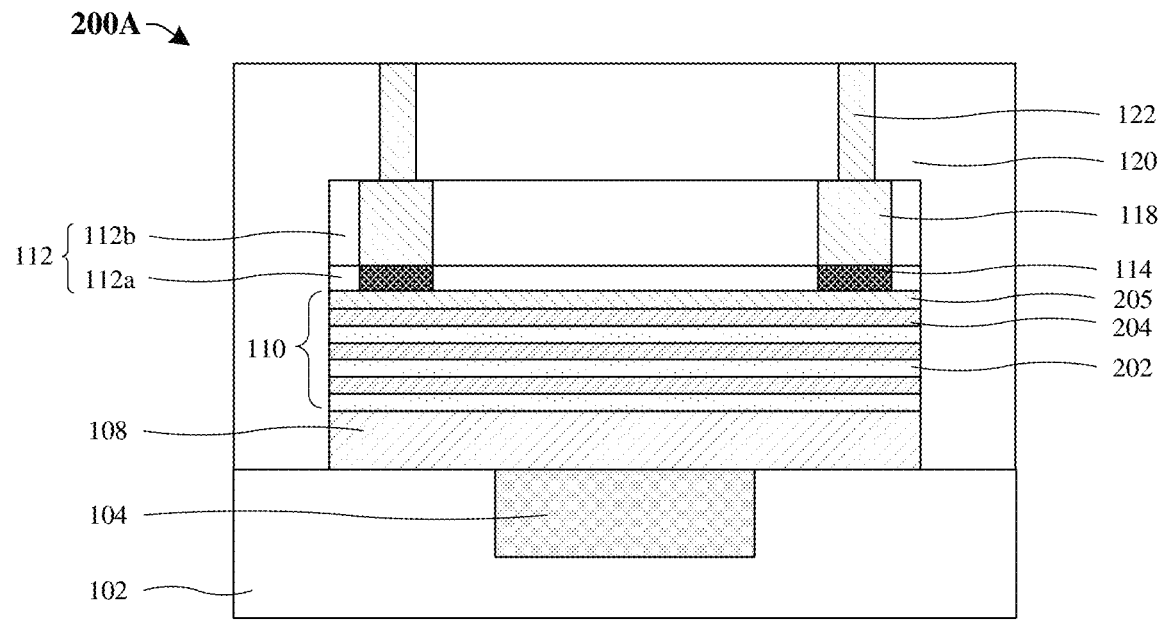
FIGS. 2A-2H illustrate cross-sectional views of some alternative embodiments of the IC chip of FIG. 1.

FIG. 2A illustrates a cross-sectional view 200A of some alternative embodiments of the IC chip of FIG. 1. The IC chip is as described in FIG. 1, but the semiconductor structure 110 is varied. The semiconductor structure 110 comprises an alternating stack of cocktail layers 202 comprising a mixture of first and second materials, and first semiconductor layers 204 comprising a third material different than the first and second material. A second semiconductor layer 205 overlies the alternating stack. In some embodiments, the second semiconductor layer 205 comprises the first material and not the second or third materials. In some embodiments, the first material has a stronger bonding energy to oxygen than the second or third materials. The stronger bonding energy of the first material reduces defects, such as oxygen vacancies, at a topmost surface of the semiconductor structure 110. The carrier barrier layer 114 is arranged within and extends through a passivation structure 112 to contact the second semiconductor layer 205 of the semiconductor structure 110.

In some embodiments, including the second material in the cocktail layer 202 causes positive bias instability, negative bias instability, and photo illumination issues due to an increase in the presence of defects (e.g., oxygen vacancies). Thus, the first material is included in the cocktail layer 202 in order to decrease the intrinsic channel concentration of defects in the semiconductor structure 110. Hence, a higher $I_{on}/I_{off}$ ratio is acquired and the $I_{off}$ current state is reduced. In some embodiments, the intrinsic channel concentration should be smaller than $10^{17}$ cm$^{-3}$ or some other suitable value. Because the first material has a stronger bonding energy, less defects and thus, less surface states (e.g., excess charges) are present at an interface between the first material of the cocktail layer 202 and the ferroelectric layer 108. In some embodiments, the second material of the cocktail layer 202 has a higher mobility than the first material of the cocktail layer 202 due to a weaker bond energy and an increase in metal ions in the second material. Thus, mobile charge carriers may have a higher mobility at an interface between the second material of the cocktail layer 202 and the ferroelectric layer 108. For these reasons, in some embodiments, the cocktail layer 202 comprises a mixture of the first and second materials to reduce defects but also to increase charge mobility at an interface between the semiconductor structure 110 and the ferroelectric layer 108, thereby increasing the reliability and switching speeds of the bottom gate FeFET structure.

In some embodiments, the third material of the first semiconductor layer 204 comprises a more crystalline material than the first and second materials. Thus, the first semiconductor layer 204 is spaced apart from the ferroelectric layer 108 because otherwise, an interface between the third material of the first semiconductor layer 204 and the ferroelectric layer 108 would be too rough and have potential adhesion and structural issues on the ferroelectric layer 108.

In some embodiments, the first material comprises gallium oxide, hafnium oxide, zirconium oxide, titanium oxide, aluminum oxide, tantalum oxide, strontium oxide, barium oxide, scandium oxide, magnesium oxide, lanthanum oxide, gadolinium oxide, or some other suitable metal oxide. In some embodiments, the second material comprises indium oxide, tin oxide, arsenic oxide, zinc oxide, or the like. In some embodiments, the third material comprises zinc oxide. Thus, for example, in some embodiments, the first material comprises gallium oxide; the second material comprises indium oxide; and the third material comprises zinc oxide, such that the semiconductor structure 110 comprises indium gallium zinc oxide (IGZO), which is a semiconducting material.

Figure 2B:
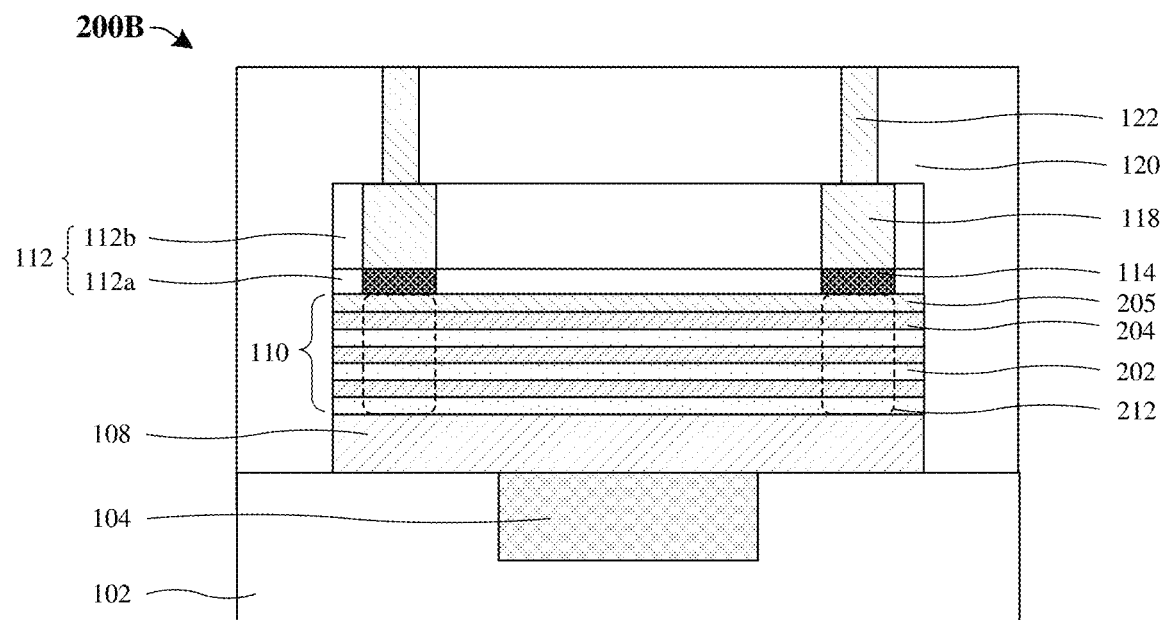

FIG. 2B illustrates a cross-sectional view 200B of some alternative embodiments of the IC chip of FIG. 1. The bottom gate FeFET structure is as described in FIG. 2A, except that it further comprises a plasma treated region 212 of the semiconductor structure 110 underlying the pair of source/drain electrodes 118. To the extent that the semiconductor structure 110 comprises amorphous IGZO, the plasma treated region 212 creates indium oxide vacancies and indium ions in the semiconductor structure 110, and the indium ions migrate to a top surface of the semiconductor structure 110, thereby rendering the top surface of the semiconductor structure 110 rich in Indium. This reduces the parasitic contact resistance between the semiconductor structure 110 and the pair of source/drain electrodes 118. Further, the indium oxide vacancies created by the plasma treated region 212 reduce a parasitic series resistance of the pair of source/drain electrodes 118 to the ferroelectric layer 108. In some embodiments, the plasma treated region 212 may be treated by, for example, helium, argon, hydrogen, or some other suitable material(s). In some embodiments, the plasma treated region 212 may extend into the semiconductor structure 110 by a distance ranging from about 0.5 nanometers to 70 nanometers, from about 2 nanometers to 35 nanometers, from about 35 nanometers to 70 nanometers, or some other suitable value.

Figure 2C:
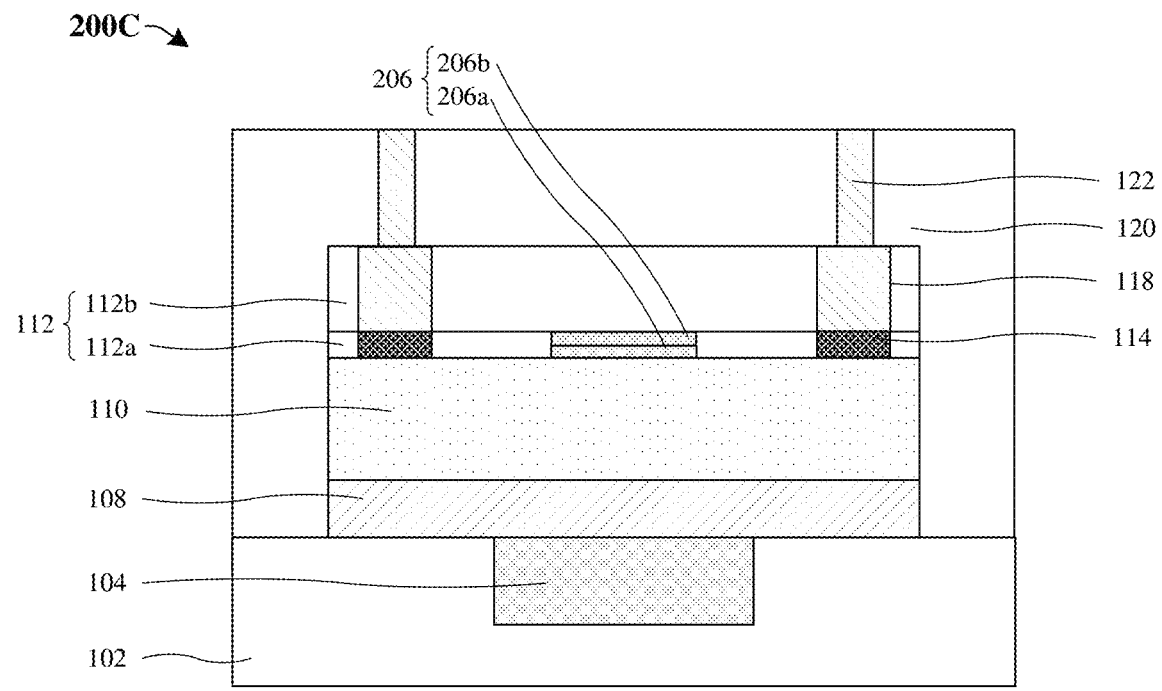

FIG. 2C illustrates a cross-sectional view 200C of some alternative embodiments of the IC chip of FIG. 1. The bottom gate FeFET structure is as described in FIG. 1, except that it further comprises a capping structure 206. The capping structure 206 is arranged over the semiconductor structure 110 and between the source/drain electrodes 118 to reduce defects (e.g., surface states, oxygen vacancies) at the topmost surface of the semiconductor structure 110. In some embodiments, the capping structure 206 extends through the passivation structure 112 to contact the semiconductor structure 110.

In some embodiments, the capping structure 206 comprises a first metal layer 206a comprising a first metal material. In some embodiments, the first metal material of the first metal layer 206a comprises one or more metals that has a strong oxidation ability. In other words, the first metal material has a high affinity for oxygen.

In some embodiments, the first metal layer 206a has a higher affinity for oxygen (e.g., a more negative Gibbs free energy) than the metal materials of the semiconductor structure 110. Thus, when the first metal layer 206a is formed directly on the second semiconductor layer 205, the first metal material may diffuse into the semiconductor structure 110 and bond with weakly bonded oxygen of the semiconductor structure 110 to reduce defects (e.g., oxygen vacancies, surface states, weakly bonded oxygen) in the semiconductor structure 110 and increase charge mobility in the semiconductor structure 110. The capping structure 206 further comprises a second metal layer 206b comprising a second metal material that is different than the first metal material of the first metal layer 206a. In some embodiments, the second metal layer 206b prevents oxidation of the first metal layer. In alternative embodiments, the second metal layer 206b may be omitted from the capping structure 206. For example, in some embodiments, the first metal layer 206a may comprise calcium, and the second metal layer 206b may comprise aluminum. In some embodiments, the first metal layer 206a and the second metal layer 206b may be or comprise, for example, hafnium, zirconium, titanium, aluminum, tantalum, magnesium, gadolinium, scandium, strontium, barium, some other suitable transition metal(s), or some other suitable material(s).

Therefore, in some embodiments, the capping structure 206 reduces defects (e.g., oxygen vacancies, surface states, weakly bonded oxygen) near the topmost surface of the semiconductor structure 110 to increase charge mobility of the semiconductor structure 110 thereby increasing switching speeds of the bottom gate FeFET structure. With an increase in switching speeds, the bottom gate FeFET structure may be turned "ON" quicker because mobile charge carriers may move through the semiconductor structure 110 easier. As a result, data may be stored onto or read from the ferroelectric layer 108 more easily and reliably.

Figure 2D:
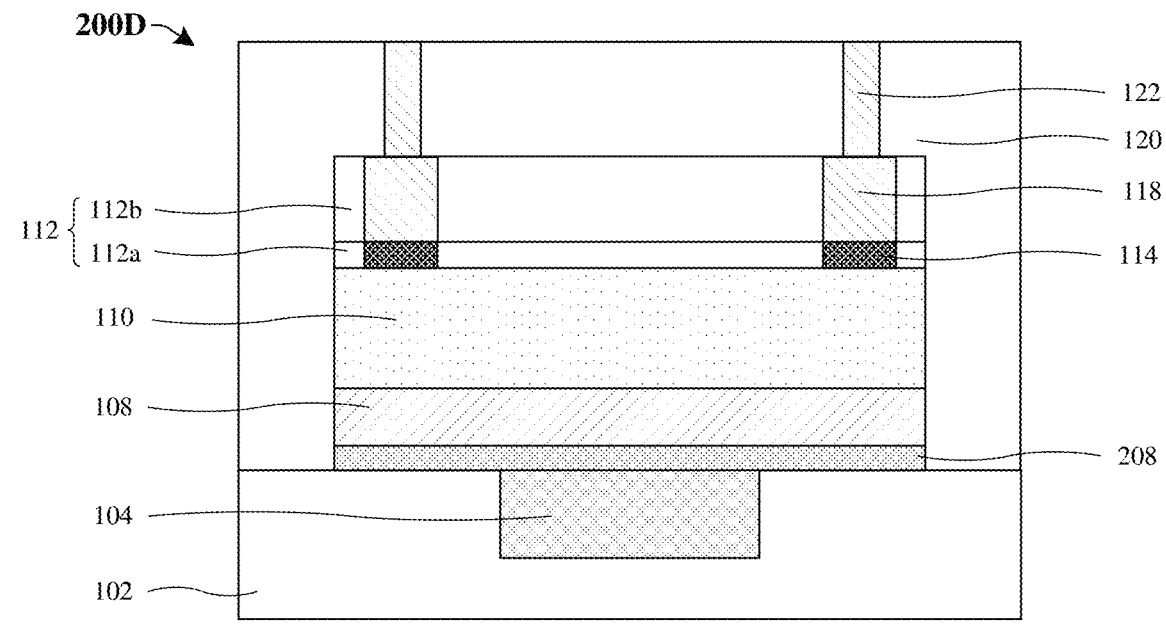

FIG. 2D illustrates a cross-sectional view 200D of some alternative embodiments of the IC chip of FIG. 1. The bottom gate FeFET structure is as described in FIG. 1, except that it further comprises a stress layer 208 disposed between the gate electrode 104 and the ferroelectric layer 108. The stress layer 208 has a coefficient of thermal expansion (CTE) greater than that of the ferroelectric layer 108. For example, in embodiments in which the ferroelectric layer 108 is or comprises hafnium zirconium oxide, the stress layer 208 may have a CTE greater than approximately $8.3 \ 10^{-6} \ k^{-1}$ or some other suitable value. In some embodiments, the stress layer 208 has a CTE of approximately $8.8 \ 10^{-6}k^{-1}$. Other suitable values are, however, amenable. Hence, during operation, when the memory device heats up (or cools down), the stress layer 208 applies tensile stress on the ferroelectric layer 108 and the ferroelectric layer 108 applies compressive stress on the stress layer 208. This causes tensile stress on the ferroelectric layer 108, which distorts the crystalline lattice to promote a formation of orthorhombic phase crystals in the ferroelectric layer 108. By promoting formation of the orthorhombic phase, remanent polarization may be increased.

In some embodiments, the stress layer 208 has a greater CTE than that of the gate electrode 104. In some embodiments, the stress layer 208 applies tensile stress on the gate electrode 104 and the gate electrode 104 applies compressive stress on the stress layer 208. In alternative embodiments, the gate electrode 104 has a smaller CTE than the ferroelectric layer 108, and hence applies tensile stress to the ferroelectric layer 108 to promote a formation of orthorhombic phase crystals. In some embodiments, the gate electrode 104 has a CTE of less than approximately $14 \ 10^{-8}k^{-1}$.

In some embodiments, the stress layer 208 additionally or alternatively provides a tensile stress on the ferroelectric layer 108 by lattice mismatch. In other words, the stress layer 208 has different lattice constants than the ferroelectric layer 108. In some embodiments, the $a_0$ lattice constant of the stress layer 208 is greater than that of the ferroelectric layer 108. In some embodiments, the lattice constants of the stress layer 208 and the ferroelectric layer 108 may differ by about 1.8% to about 3.5%, or some other suitable value.

In some embodiments, the stress layer 208 is or comprises tantalum oxide, potassium oxide, rubidium oxide, barium oxide, strontium oxide, amorphous vanadium oxide, amorphous chromium oxide, amorphous gallium oxide, amorphous iron oxide, amorphous titanium oxide, amorphous indium oxide, yttrium aluminum oxide, bismuth oxide, ytterbium oxide, dysprosium oxide, gadolinium oxide, strontium titanium oxide, dysprosium scandium oxide, terbium scandium oxide, gadolinium scandium oxide, neodymium scandium oxide, neodymium gallium oxide, lanthanum strontium aluminum tantalum oxide (e.g., LSAT), bi-layer epi-electrodes such as lanthanum strontium manganese oxide (e.g., LSMO)/strontium titanium oxide, LSMO/dysprosium scandium oxide, LSMO/terbium scandium oxide, LSMO/gadolinium scandium oxide, LSMO neodymium scandium oxide, LSMO/neodymium gallium oxide, LSMO/LSAT, or some other suitable material(s).

Figure 2E:
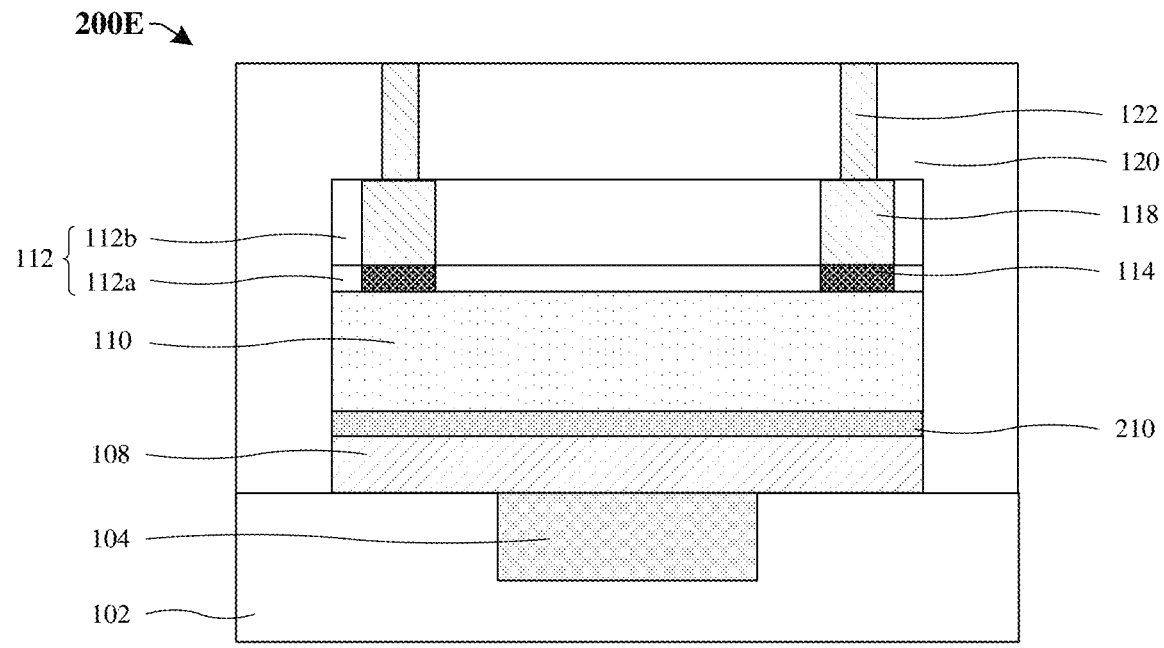

FIG. 2E illustrates a cross-sectional view 200E of some alternative embodiments of the IC chip of FIG. 1. The bottom gate FeFET structure is as described in FIG. 1, except that it further comprises an insulator layer 210 disposed vertically between the semiconductor structure 110 and the ferroelectric layer 108. The insulating layer 210 inhibits oxygen vacancies and/or leakage current. The reduced oxygen vacancies inhibit scattering of current in the semiconductor structure 110 and/or reduce reliability issues from negative bias temperature instability and positive bias temperature instability.

The insulating layer 210 has smaller valence band than the semiconductor structure 110 and has a large valence band offset relative to the semiconductor structure 110 to reduce hole leakage current. Additionally, or alternatively, the insulating layer 210 has higher conduction band than the semiconductor structure 110 and has a large conduction band offset relative to the semiconductor structure 110 to reduce carrier leakage current. The large valence band offset is a valence band offset greater than that between the semiconductor structure 110 and the ferroelectric layer 108. Further, the large valence band offset may, for example, be a valence band offset greater than about 0.4 electron volts (eV), 1 eV, or some other suitable value. If the large valence band offset is too small (e.g., less than about 0.4 eV or some other suitable value), leakage current may be high. The large conduction band offset is a conduction band offset greater than that between the semiconductor structure 110 and the ferroelectric layer 108. Further, the large conduction band offset may, for example, be a conduction band offset greater than about 2.7 eV, 3 eV, or some other suitable value. If the large conduction band offset is too small (e.g., less than about 2.7 eV or some other suitable value), leakage current may be high.

In some embodiments, the insulating layer 210 has a thickness of about 0.1 to 10 nanometers or some other suitable value. In some embodiments, the insulating layer 210 is or comprises a bulk material with or without dopants.

The bulk material may, for example, be or comprise hafnium oxide (e.g., HfO$_2$), tantalum oxide (e.g., Ta$_2$O$_5$), some other suitable material, or any combination of the foregoing. The dopants may, for example, be or comprise silicon (e.g., Si), magnesium (e.g., Mg), aluminum (e.g., Al), yttrium oxide (e.g., Y$_2$O$_3$), lanthanum (e.g., La), strontium (e.g., Sr), gadolinium (e.g., Gd), nitrogen (e.g., N), scandium (e.g., Sc), calcium (e.g., Ca), some other suitable material, or any combination of the foregoing. In some embodiments, the insulating layer 210 is or comprises hafnium oxide (e.g., HfO$_2$) doped with silicon. An atomic percentage of silicon may, for example, be greater than about 10%, about 10-30%, about 30-60%, about 60-90%, or some other suitable percentage. In some embodiments, the insulating layer 210 is or comprises silicon (e.g., Si), magnesium (e.g., Mg), aluminum (e.g., Al), yttrium oxide (e.g., Y$_2$O$_3$), lanthanum (e.g., La), strontium (e.g., Sr), gadolinium (e.g., Gd), nitrogen (e.g., N), scandium (e.g., Sc), calcium (e.g., Ca), some other suitable material, or any combination of the foregoing.

Figure 2F:
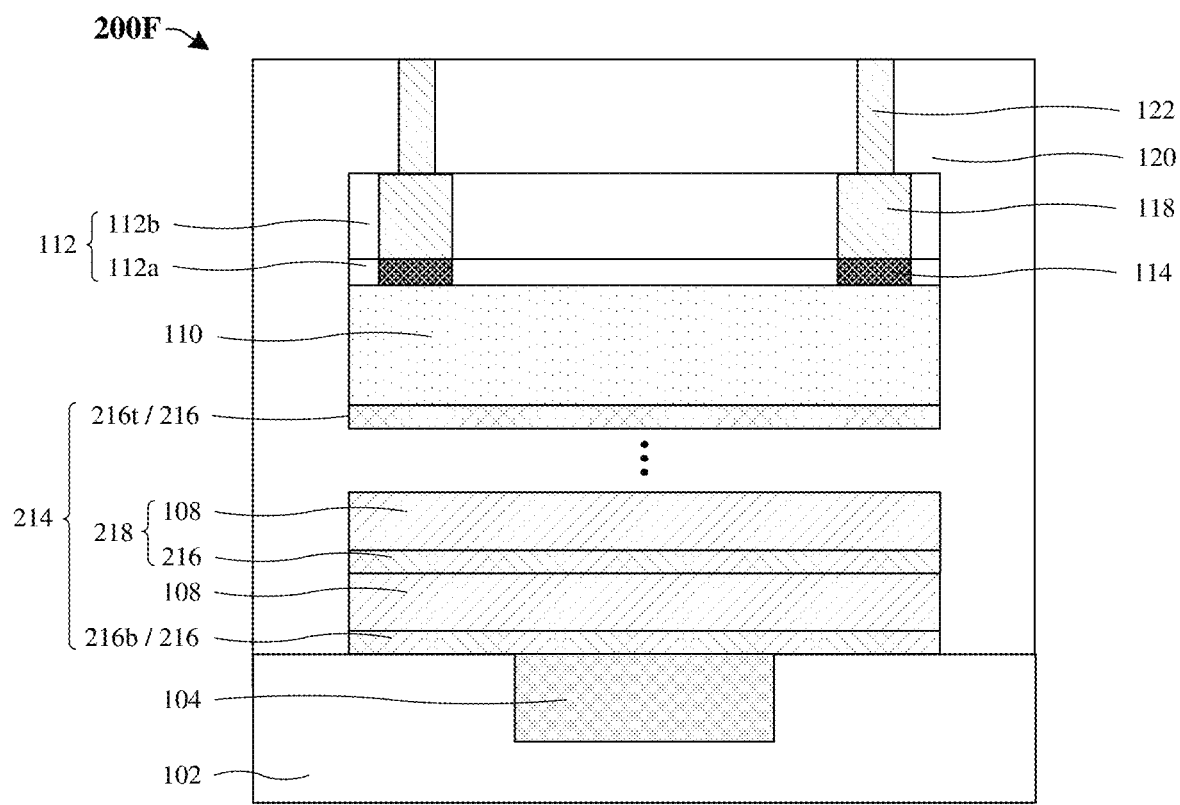

FIG. 2F illustrates a cross-sectional view 200F of some alternative embodiments of the IC chip of FIG. 1. The bottom gate FeFET structure is as described in FIG. 1, except that it further comprises a ferroelectric structure 214. The ferroelectric structure 214 comprises a plurality of restoration layers 216 and a plurality of ferroelectric layers 108. In some embodiments, the restoration layers 216 may also be known as crystalline bounding layers (or bounding layers for short) or surface reconstruction layers. The ferroelectric layers 108 and the restoration layers 216 are vertically stacked, such that the ferroelectric layers 108 alternate periodically with the restoration layers 216. In some embodiments, a top restoration layer 216t overlies the ferroelectric structure 214 and a bottom restoration layer 216b underlies the ferroelectric structure 214.

The ellipsis is used to represent zero or more additional ferroelectric-layer-restoration-layer pairs 218. Further, while the ferroelectric structure 214 is illustrated with at least two ferroelectric layers 108 and at least three restoration layers 216, the ferroelectric structure 214 may only have one restoration layer 216 and/or only two ferroelectric layers 108 in alternative embodiments.

The ferroelectric layers 108 have individual thickness less than individual critical thicknesses. The critical thicknesses correspond to thicknesses at or above which the orthorhombic phase becomes thermodynamically unstable and other phases dominate. For example, the ferroelectric layers 108 may be or comprise hafnium zirconium oxide and may have individual critical thicknesses less than 20-30 nanometers or some other suitable value. Thermodynamic instability may, for example, arise due to crystalline grains becoming too large, such that the individual critical thicknesses may, for example, also correspond to thicknesses at or above which crystalline grains are at or above critical grain sizes.

The restoration layers 216 each provide a break between crystalline lattices of bordering ferroelectric layers 108. As such, the crystalline lattices of the bordering ferroelectric layers 108 are not continuations of each other and hence the restoration layers 216 bound the individual thickness of the ferroelectric layers 108 so as to prevent the individual thicknesses from exceeding the critical thicknesses.

Because of the breaks provided by the restoration layers 216, the ferroelectric layers 108 may be formed vertically stacked and may each be formed with individual thicknesses up to the individual critical thicknesses without regard for each other. This, in turn, allows the total thickness of the ferroelectric structure 214 to be increased beyond the individual critical thicknesses of the ferroelectric layers 108 by increasing the number of ferroelectric layers 108 and the number of restoration layers 216. Hence, the ferroelectric structure 214 may have a larger remanent polarization than would otherwise be possible without the restoration layers 216. For example, the remanent polarization may be greater than or equal to about 22.1 microcoulomb per centimeter squared (e.g., μC/cm$^2$) or some other suitable value.

In some embodiments, the restoration layers 216 have individual thicknesses of about 0.1-5.0 nanometers, about 1-2 nanometers, or some other suitable value. In some embodiments, the restoration layers 216 are single-layer films. In other embodiments, the restoration layers 216 are multi-layer films. In some embodiments, the restoration layers 216 are crystalline. For example, the restoration layers 216 may be single crystalline, quasi-single crystalline, or polycrystalline. In other embodiments, the restoration layers 216 are amorphous. In some embodiments, the restoration layers 216 have different material types. In other embodiments, the restoration layers 216 have the same material type. In some embodiments, the restoration layers 216 comprise one or more metal oxides, silicon oxide (e.g., SiO$_2$), one or more other suitable materials, or any combination of the foregoing, and/or the restoration layers 216 are in the cubic phase, the tetragonal phase, the orthorhombic phase, or any combination of the foregoing. The one or more metal oxides may, for example, be or comprise zirconium oxide (ZrO$_2$), yttrium oxide (e.g., Y$_2$O$_3$), hafnium oxide (e.g., HfO$_2$), aluminum oxide (e.g., Al$_2$O$_3$), hafnium zirconium oxide (e.g., Hf$_x$Zr$_{1-x}$O$_y$, where x is 0-1 and y is greater than 0), some other suitable metal oxide, or any combination of the foregoing. In some embodiments, the restoration layers 216 are ferroelectric materials. For example, the restoration layers 216 may be or comprise zirconium oxide crystallized to the orthorhombic phase. In some embodiments, some or all of the restoration layers 216 are seed layers from which immediately overlying ferroelectric layers 108 are epitaxially grown during formation of the IC chip.

Figure 2G:
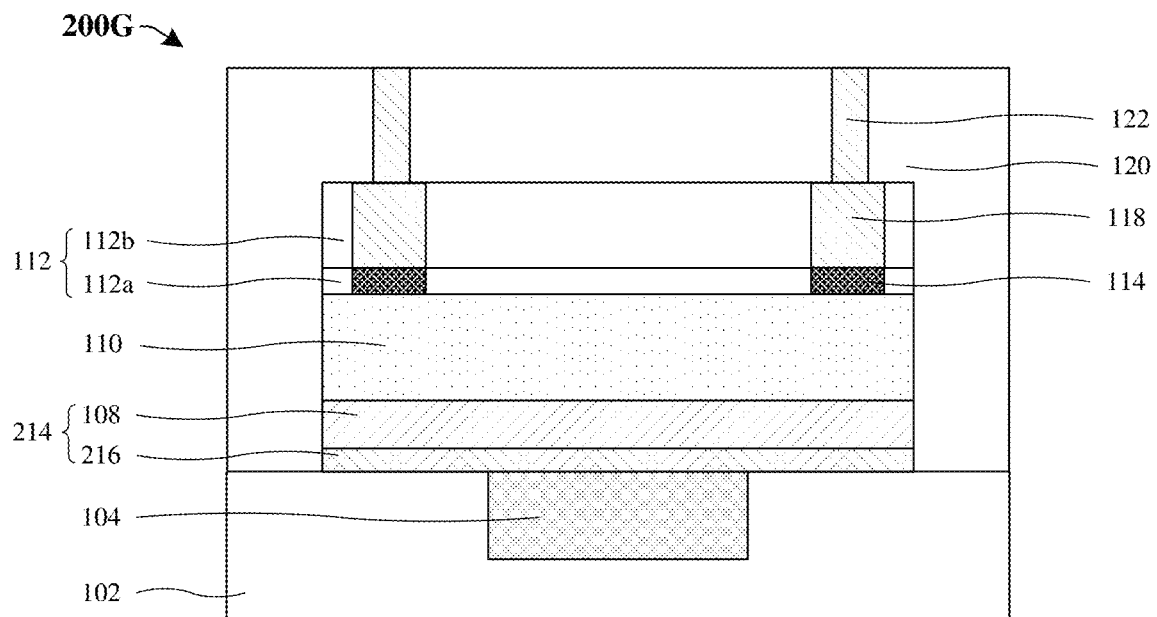

FIG. 2G illustrates a cross-sectional view 200G of some alternative embodiments of the IC chip of FIG. 1. The bottom gate FeFET structure is as described in FIG. 2F, but the ferroelectric structure 214 comprises one restoration layer 216 and one ferroelectric layer 108 vertically stacked over the restoration layer 216.

Figure 2H:
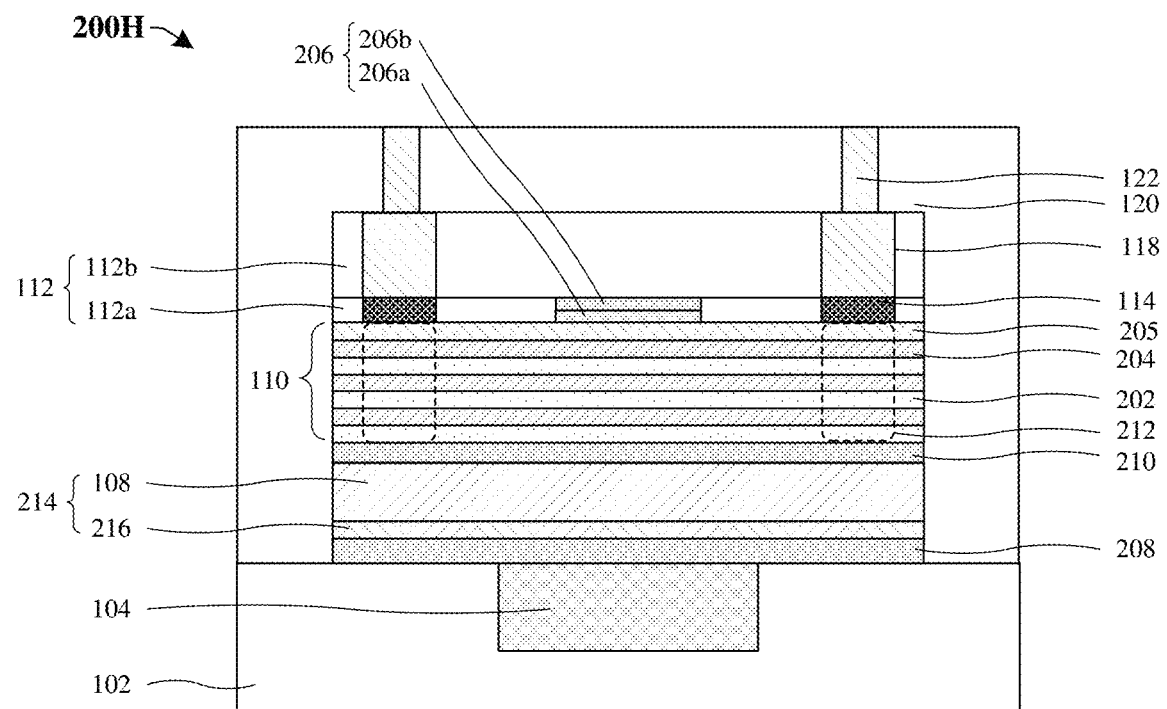

FIG. 2H illustrates a cross-sectional view 200H of some alternative embodiments of the IC chip of FIG. 1. The bottom gate FeFET structure is as described in FIG. 1, except that the bottom gate FeFET structure further comprises the semiconductor structure 110 of FIG. 2A, the plasma treated region 212 of FIG. 2B, the capping structure 206 of FIG. 2C, the stress layer 208 of FIG. 2D, the insulating layer 210 of FIG. 2E, and the ferroelectric structure 214 of FIG. 2G. In alternative embodiments, the plasma treated region 212, the capping structure 206, the stress layer 208, the insulating layer 210, the restoration layer 216, or any combination of the foregoing may be omitted. In alternative embodiments, the ferroelectric structure 214 may be as in FIG. 2F. In alternative embodiments, the semiconductor structure 110 may be as in FIG. 1 or have some other suitable structure.

Figure 3:
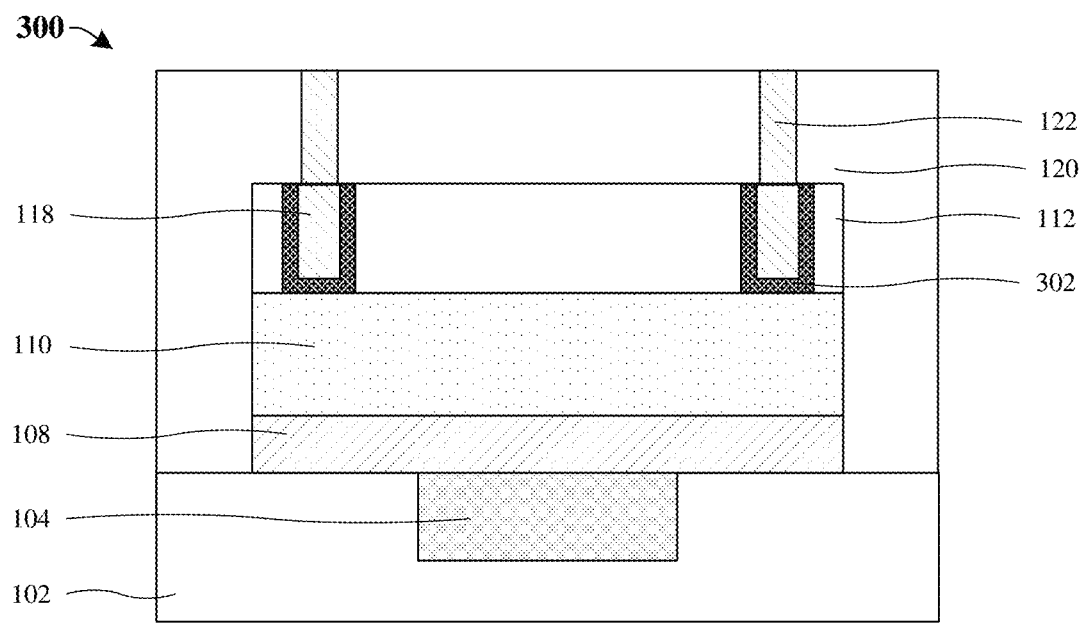
FIG. 3 illustrates a cross-sectional view of some embodiments of an IC chip in which a bottom gate FeFET structure comprises a carrier barrier layer separating a pair of source/drain electrodes from a semiconductor structure and further along sidewalls of the source/drain electrodes.

FIG. 3 illustrates a cross-sectional view 300 of some embodiments of an IC chip in which a bottom gate FeFET structure comprises a carrier barrier layer 302 separating a pair of source/drain electrodes 118 from a semiconductor structure 110 and further disposed along sidewalls of the source/drain electrodes 118. A ferroelectric layer 108, the semiconductor structure 110, and a gate electrode 104 are vertically stacked over a substrate 102, such that the ferroelectric layer 108 is disposed between the gate electrode 104 and the semiconductor structure 110. The pair of source/drain electrodes 118 are laterally separated and respectively disposed on opposite sides of the gate electrode 104. In some embodiments, an ILD structure 120 overlies the pair of source/drain electrodes 118 and the substrate 102. In further embodiments, a plurality of contacts 122 extend through the ILD structure 120 and contact the pair of source/drain electrodes 118. The substrate 102, the gate electrode 104, the ferroelectric layer 108, the semiconductor structure 110, the ILD structure 120, the plurality of contacts 122, all of the foregoing, or any combination of the foregoing may, for example, be as described in FIG. 1.

A passivation structure 112 extends between sidewalls of the carrier barrier layer 302 and laterally separates a first segment of the carrier barrier layer 302 from a second segment of the carrier barrier layer 302. Each segment of the carrier barrier layer 302 comprises a vertically extending portion disposed between inner sidewalls of the passivation structure 112 and the pair of source/drain electrodes 118, and further comprises a laterally extending portion disposed between the semiconductor structure 110 and the pair of source/drain electrodes 118.

The bottom gate FeFET structure operates as described in FIG. 1. In some embodiments, the carrier barrier layer 302 functions similarly to the carrier barrier layer 114 of FIG. 1. By including the carrier barrier layer 302 along sidewalls of the pair of source/drain electrodes 118, the carrier barrier layer 302 prevents carriers from going around the carrier barrier layer 302 and to sidewalls of the pair of source/drain electrodes 118. In some embodiments, the carrier barrier layer 302 is configured to form a rectifying Schottky barrier between the semiconductor structure 110 and the pair of source/drain electrodes 118. In further embodiments, a Schottky barrier height between the semiconductor structure 110 and the pair of source/drain electrodes 118 ranges from about 0.30 eV to 0.50 eV, about 0.30 eV to 0.45 eV, about 0.35 eV to 0.50 eV, or another suitable value. In some embodiments, the carrier barrier layer 302 is or otherwise comprises a same material and has a same thickness as described for the carrier barrier layer 114 of FIG. 1.

Figure 4:
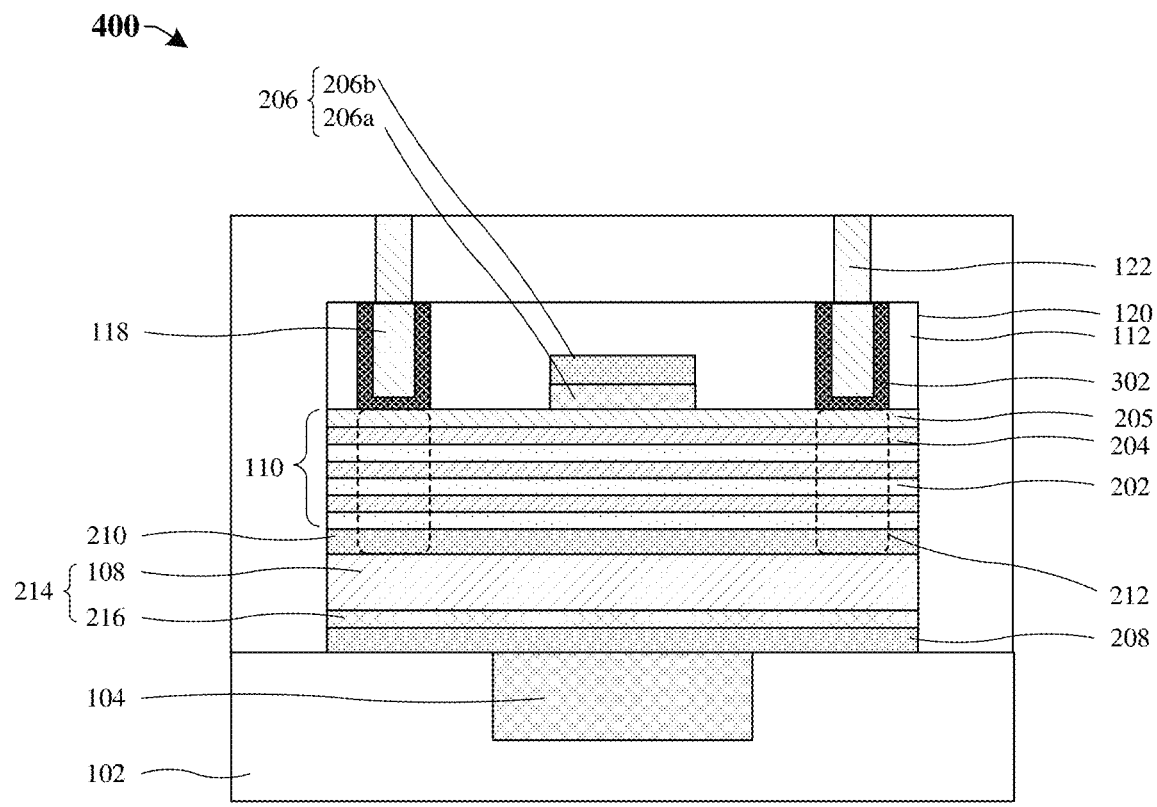
FIG. 4 illustrates a cross-sectional view of some alternative embodiments of the IC chip of FIG. 3.

FIG. 4 illustrates a cross-sectional view 400 of some alternative embodiments of the IC chip of FIG. 3. The bottom gate FeFET structure is as described in FIG. 3, but further comprises the semiconductor structure 110 of FIG. 2A, the plasma treated region 212 of FIG. 2B, the capping structure 206 of FIG. 2C, the stress layer 208 of FIG. 2D, the insulating layer 210 of FIG. 2E, and the ferroelectric structure 214 of FIG. 2G. In alternative embodiments, the plasma treated region 212, the capping structure 206, the stress layer 208, the insulating layer 210, the restoration layer 216, or any combination of the foregoing may be omitted. In alternative embodiments, the ferroelectric structure 214 may be as in FIG. 2F. In alternative embodiments, the semiconductor structure 110 may be as in FIG. 1 or have some other suitable structure.

Figure 5:
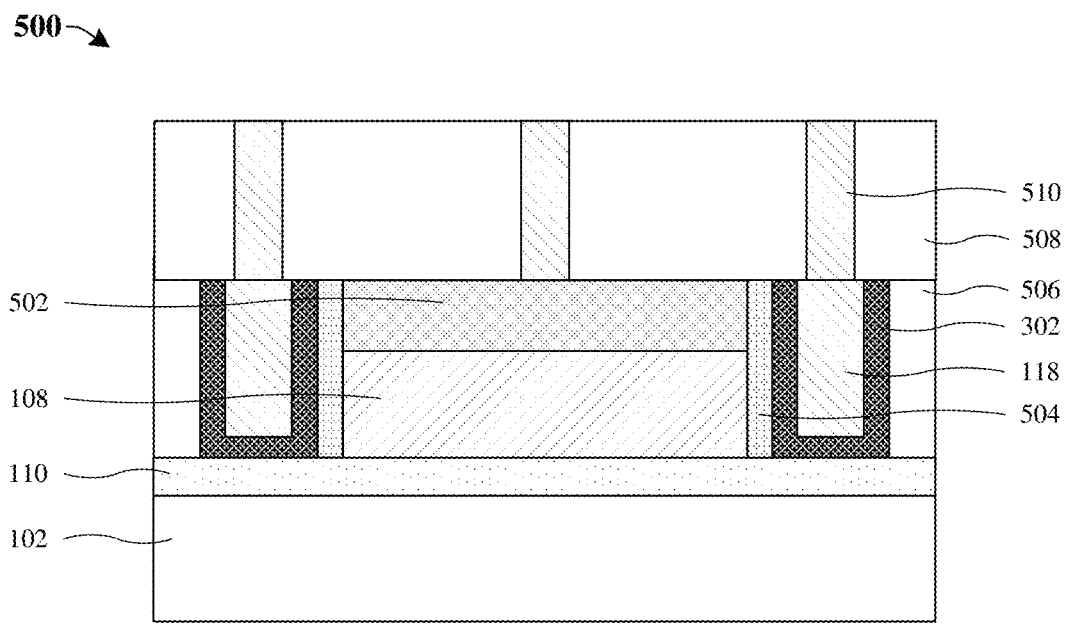
FIG. 5 illustrates a cross-sectional view of some embodiments of an IC chip in which a top gate FeFET structure comprises a carrier barrier layer separating a pair of source/drain electrodes from a semiconductor structure and further along sidewalls of the source/drain electrodes.

FIG. 5 illustrates a cross-sectional view 500 of some embodiments of an IC chip in which a top gate FeFET structure comprises a carrier barrier layer 302 separating a pair of source/drain electrodes 118 from a semiconductor structure 110 and further along sidewalls of the source/drain electrodes 118. A ferroelectric layer 108, the semiconductor structure 110, and a gate electrode 502 are vertically stacked over a substrate 102, such that the ferroelectric layer 108 is disposed between the gate electrode 502 and the semiconductor structure 110. The pair of source/drain electrodes 118 are laterally separated and respectively disposed on opposite sides of the gate electrode 502, and the carrier barrier layer 302 is disposed between the source/drain electrodes 118 and the semiconductor structure 110. The gate electrode 502 is stacked over the ferroelectric layer 108. In some embodiments, the top gate FeFET structure is a columnar structure, such that sidewalls of the gate electrode 502 and the ferroelectric layer 108 are vertically aligned and laterally between sidewalls of the semiconductor structure 110 and the substrate 102. The pair of source/drain electrodes 118 are disposed on a same side of the semiconductor structure 110 as the gate electrode 502.

The carrier barrier layer 302 comprises a pair of segments separated by the ferroelectric layer 108 and the gate electrode 502. Each segment of the carrier barrier layer 302 comprises a first vertically extending portion disposed between sidewalls of the ferroelectric layer 108 and the pair of source/drain electrodes 118. The first vertically extending portion of the carrier barrier layer 302 is further disposed between sidewalls of the gate electrode 502 and the pair of source/drain electrodes 118. Each segment of the carrier barrier layer 302 further comprises a laterally extending portion disposed between the semiconductor structure 110 and the pair of source/drain electrodes 118. In some embodiments, the carrier barrier layer 302 further comprises a second vertically extending portion disposed between the pair of source/drain electrodes 118 and a first ILD structure 506, such that the carrier barrier layer 302 is laterally between the first ILD structure 506 and the ferroelectric layer 108.

In some embodiments, sidewalls of the gate electrode 502 and sidewalls of the ferroelectric layer 108 are separated from the carrier barrier layer 302 by a sidewall spacer 504. In some embodiments, the sidewall spacer 504 continuously extends from a top surface of the carrier barrier layer 302 a bottom surface of the carrier barrier layer 302. In some embodiments, a plurality of contacts 510 are disposed in a second ILD structure 508 overlying the gate electrode 502 and the pair of source/drain electrodes 118. The plurality of contacts 510 are electrically coupled to the pair of source/drain electrodes 118 and the gate electrode 502

The top gate FeFET structure operates similar to the bottom gate FeFET structure of FIG. 1. The remanent polarization of the ferroelectric layer 108 is employed to represent a bit of data. To write, a set voltage or a reset voltage is applied from the gate electrode 502 to the semiconductor structure 110 (e.g., via the pair of source/drain electrodes 118). The set voltage sets the remanent polarization of the ferroelectric layer 108 to a first state (e.g., a logical '1'), whereas the reset voltage sets the remanent polarization to a second state (e.g., a logical '0'). The threshold voltage varies with the state of the remanent polarization. Therefore, to read, a read voltage less than the coercive voltage and between the different threshold voltage states is applied from the gate electrode 502 to the source one of the source/drain electrodes 118. Depending on whether the semiconductor structure 110 conducts, the remanent polarization is in the first or second state.

The carrier barrier layer 302 is disposed between the pair of source/drain electrodes 118 and the semiconductor structure 110, and thus produces a carrier barrier between the pair of source/drain electrodes 118 and the semiconductor structure 110. In embodiments in which the top gate FeFET structure is an n-type device, the carrier barrier is an electron barrier. In embodiments in which the top gate FeFET structure is a p-type device, the carrier barrier is a hole barrier. The carrier barrier increases the threshold voltage of the top gate FeFET structure, meaning that the top gate FeFET structure may depend on little or zero voltage to be maintained in the off state, and hence a power consumption of the IC chip may be reduced. In some embodiments, the carrier barrier layer 302 may be identical to that of the bottom gate FeFET structure of FIG. 3 in both structure and functionality.

In some embodiments, the gate electrode 502 is or comprises titanium nitride (e.g., TiN), tantalum nitride (e.g., TaN), platinum (e.g., Pt), titanium (e.g., Ti), tantalum (e.g., Ta) tungsten (e.g., W), iron (e.g., Fe), nickel (e.g., Ni), beryllium (e.g., Be), chromium (e.g., Cr), cobalt (e.g., Co), antimony (e.g., Sb), iridium (e.g., Jr), molybdenum (e.g., Mo), osmium (e.g., Os), thorium (e.g., Th), vanadium (e.g., V), some other suitable metal(s), or any alloy or combination of the foregoing. In some embodiments, the gate electrode 502 has a thickness of about 15 nanometers, about 15-500 nanometers, or some other suitable thickness. In some embodiments, the gate electrode 502 has a smaller coefficient of thermal expansion than an underlying layer (e.g., the ferroelectric layer 108), such that the gate electrode 502 applies tensile stress on the underlying layer. In the event that the underlying layer is the ferroelectric layer 108, the tensile stress promotes the orthorhombic phase, which increases remanent polarization.

In some embodiments, the first ILD structure 506 and the second ILD structure 508 are or comprise, for example, nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the plurality of contacts 510 are or otherwise comprise, for example, aluminum, titanium, tantalum, tungsten, gold, ruthenium, some other suitable conductive material(s), or any combination of the foregoing. In some embodiments, the sidewall spacer 504 is or comprises silicon nitride, silicon dioxide, some other suitable dielectric material(s), or a combination of the foregoing. In some embodiments, the substrate 102 is or comprises silicon, silicon germanium, a group III-V material, a group II-VI material, some other suitable semiconductor material, or any combination of the foregoing. The group III-V material may, for example, be or comprise gallium arsenide (e.g., GaAs), gallium arsenide indium (e.g., GaAsIn), some other suitable group III-V material, or any combination of the foregoing. The group II-VI material may, for example, be or comprise zinc oxide (e.g., ZnO), magnesium oxide (e.g., MgO), gadolinium oxide (e.g., GdO), some other suitable II-VI material, or any combination of the foregoing.

FIGS. 6A-6D illustrate cross-sectional views of some alternative embodiments of the IC chip of FIG. 5 in which the top gate FeFET structure is varied.

Figure 6A:
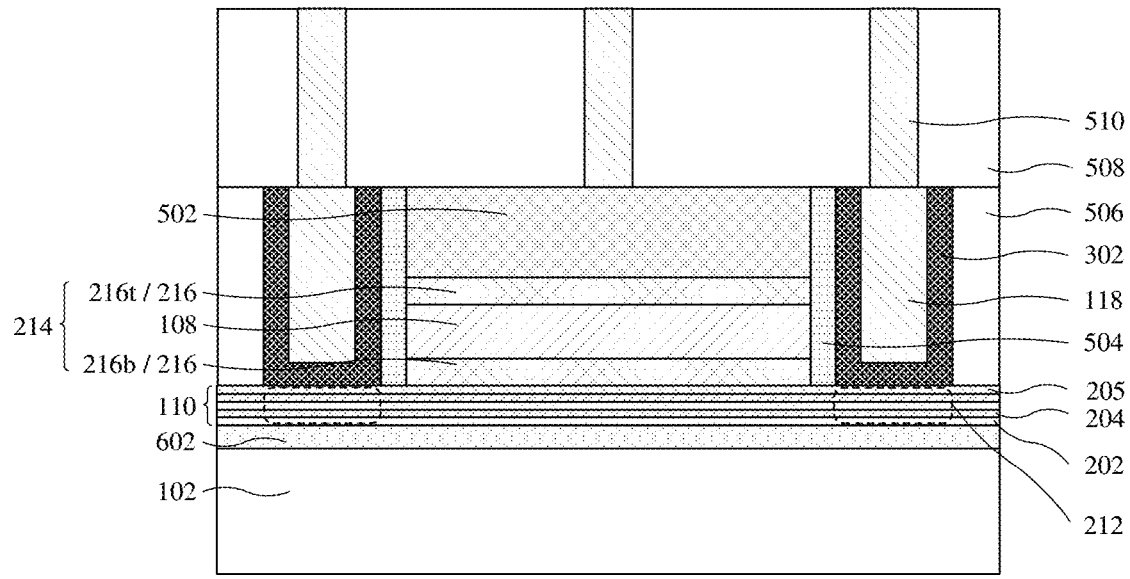
FIGS. 6A-6D illustrate cross-sectional views of some alternative embodiments of the IC chip of FIG. 5.

FIG. 6A illustrates a cross-sectional view 600A of some alternative embodiments of the IC chip of FIG. 5. The IC chip is as described in FIG. 5, but further comprises a ferroelectric structure 214 and a buffer layer 602. Further, the semiconductor structure 110 is as described in FIG. 2B.

The buffer layer 602 is disposed between the semiconductor structure 110 and the substrate 102, and is configured to separate the semiconductor structure 110 from the substrate 102 to accommodate a difference in their crystallographic structures. In some embodiments, the buffer layer 602 is or comprises silicon, gallium, a group III-V material, some other suitable material(s) that provide(s) a transition from lattice constants of the substrate 102 to lattice constants of the semiconductor structure 110, or a combination of the foregoing. The ferroelectric structure 214 comprises a ferroelectric layer 108 disposed vertically between a bottom restoration layer 216b and a top restoration layer 216t. The restoration layers 216 promote a ferroelectricity of the ferroelectric layer 108 by promoting growth of orthorhombic-phase crystals. In alternative embodiments, one or both of the restoration layers 216 is/are omitted. In some embodiments, the bottom restoration layer 216b may be referred to as a bottom seed layer. The top restoration layer 216t and the bottom restoration layer 216b are as described in FIG. 2F.

Figure 6B:
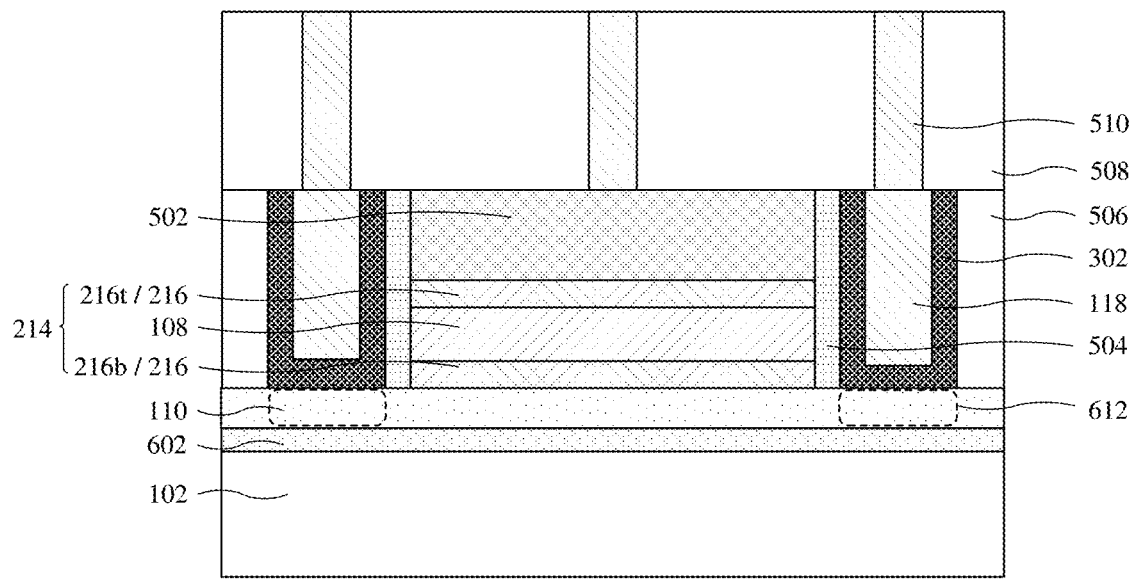

FIG. 6B illustrates cross-sectional view 600B of some alternative embodiments of the IC chip of FIG. 5. The IC chip is as described in FIG. 6A, but the semiconductor structure 110 is varied. The semiconductor structure 110 is silicon based and comprises a pair of doped (e.g., n-type or p-type) regions 612. In such embodiments, the buffer layer 602 is or comprises an oxide (e.g., silicon oxide), a nitride (e.g., silicon nitride), or some other suitable dielectric material(s). In some embodiments, the buffer layer 602, the substrate 102, and the semiconductor structure 110 define a silicon-on-insulator (SOI) substrate.

Figure 6C:
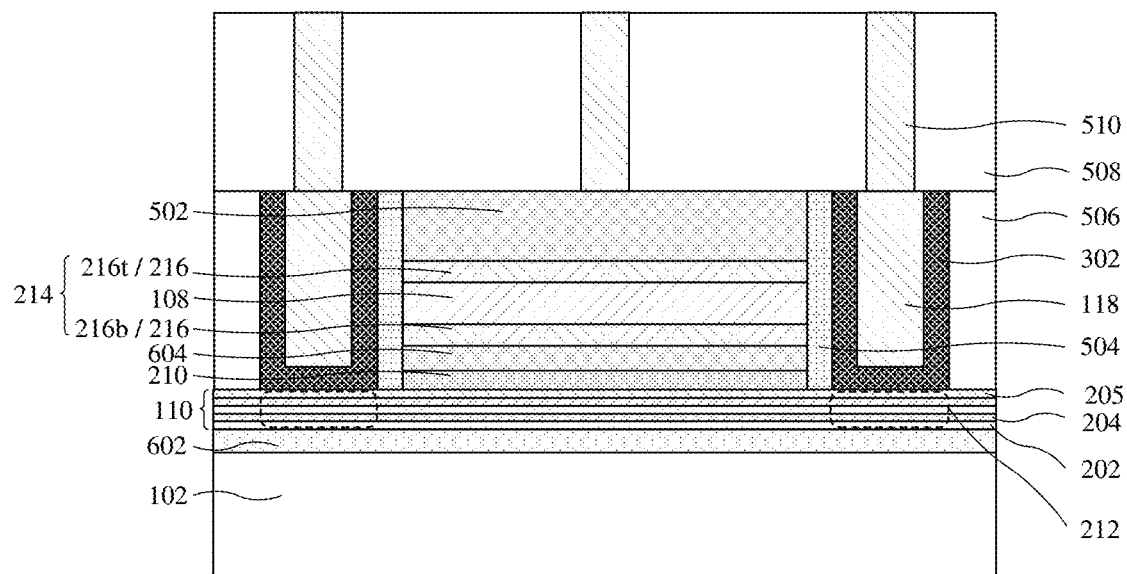

FIG. 6C illustrates cross-sectional view 600C of some alternative embodiments of the IC chip of FIG. 5. The IC chip is as described in FIG. 6A, but further comprises a floating gate 604 and an insulating layer 210. The floating gate 604 is disposed between the semiconductor structure 110 and the ferroelectric structure 214. The insulating layer 210 is disposed between the floating gate 604 and the semiconductor structure 110. In some embodiments, the floating gate 604 changes the effective area of the ferroelectric structure 214, such that the remanent polarization may be saturated at a lower voltage. The insulating layer 210 inhibits oxygen vacancies and/or leakage current. The insulating layer 210 is as described in FIG. 2E. In some embodiments, the floating gate 604 is or comprises titanium nitride (e.g., TiN), tantalum nitride (e.g., TaN), platinum (e.g., Pt), titanium (e.g., Ti), tantalum (e.g., Ta) tungsten (e.g., W), iron (e.g., Fe), nickel (e.g., Ni), beryllium (e.g., Be), chromium (e.g., Cr), cobalt (e.g., Co), antimony (e.g., Sb), iridium (e.g., Jr), molybdenum (e.g., Mo), osmium (e.g., Os), thorium (e.g., Th), vanadium (e.g., V), some other suitable metal(s), or any alloy or combination of the foregoing.

Figure 6D:
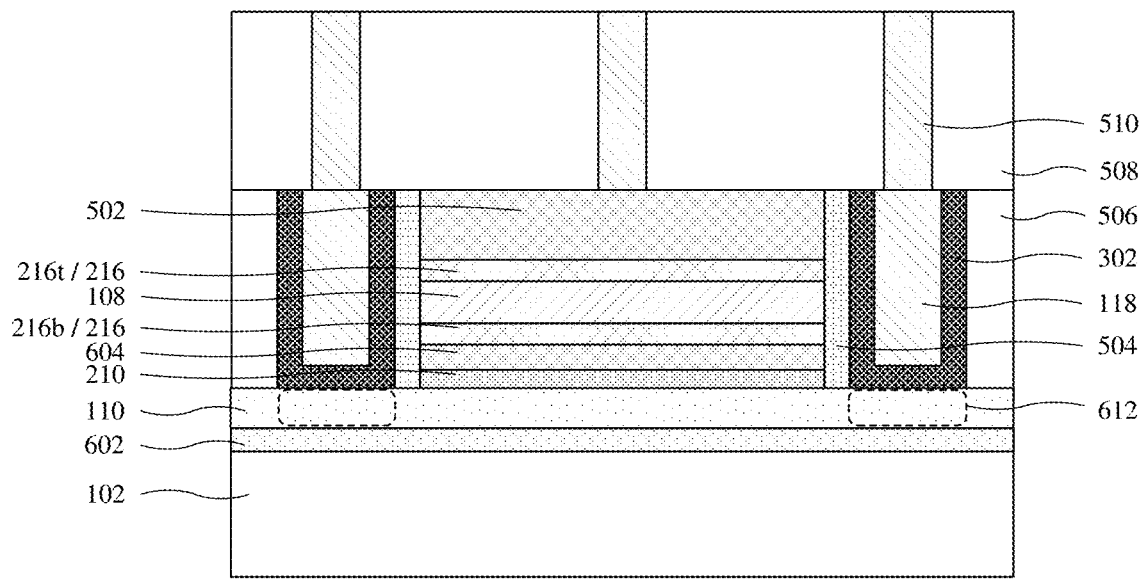

FIG. 6D illustrates cross-sectional view 600D of some alternative embodiments of the IC chip of FIG. 5. The IC chip is as described in FIG. 6B, but further comprises a floating gate 604 and an insulating layer 210. The floating gate 604 and the insulating layer 210 are as described in FIG. 6C.

FIGS. 7-18, 19A-19E, and 20A-20D illustrate a series of cross-sectional views of some embodiments of a method for forming an IC chip in which a bottom gate FeFET structure comprises a carrier barrier layer separating a pair of source/drain electrodes from a semiconductor structure. Although FIGS. 7-18, 19A-19E, and 20A-20D are described in relation to a method, it will be appreciated that the structures disclosed in FIGS. 7-18, 19A-19E, and 20A-20D are not limited to such a method, but instead may stand alone as structures independent of the method.

Figure 7:
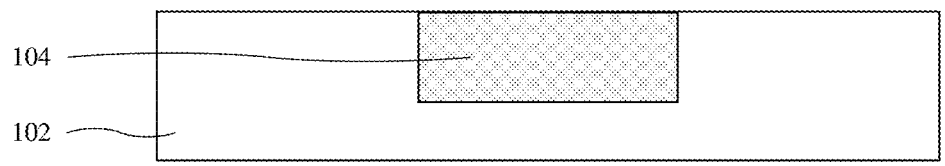
FIGS. 7-18, 19A-19E, and 20A-20D illustrate a series of cross-sectional views of some embodiments of a method for forming an IC chip in which a bottom gate FeFET structure comprises a carrier barrier layer separating a pair of source/drain electrodes from a semiconductor structure.

As illustrated by the cross-sectional view 700 of FIG. 7, a gate electrode 104 is formed inset into a top of a substrate 102. In some embodiments, the gate electrode 104 may be formed between inner sidewalls of the substrate 102. A process for forming the gate electrode 104 may be or comprise: patterning the substrate 102 to form an opening; depositing a conductive layer filling the opening and covering the substrate 102; and planarizing the conductive layer to localize the conductive layer to the opening. Other suitable processes are, however, amenable. The deposing may, for example, be performed by direct current (DC) sputtering, physical vapor deposition (PVD), chemical vapor deposition (CVD), atomic layer deposition (ALD), some other suitable deposition process, or any combination of the foregoing. In some embodiments, the gate electrode 104 has a thickness of about 15-500 nanometers or some other suitable thickness. In some embodiments, the gate electrode 104 and the substrate 102 are as described with regard to FIG. 1.

Figure 8:
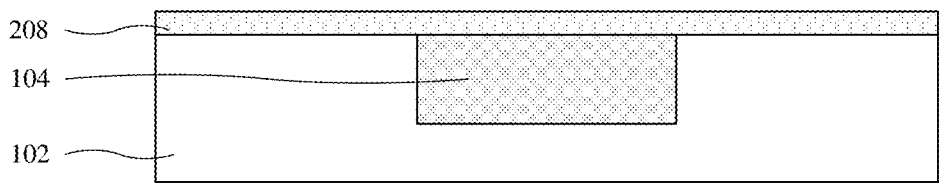

As illustrated by the cross-sectional view 800 of FIG. 8, a stress layer 208 is formed over the gate electrode 104. The stress layer 208 may, for example, be configured to provide a tensile stress on a subsequently formed ferroelectric layer, which distorts the crystalline lattice to promote a formation of orthorhombic phase crystals in the subsequently formed ferroelectric layer. By promoting formation of the orthorhombic phase, remanent polarization may be increased. The stress may, for example, be caused by different coefficients of thermal expansion between the stress layer 208 and the subsequently formed ferroelectric layer, or by a difference in lattice constants between the stress layer 208 and the subsequently formed ferroelectric layer. A process for forming the stress layer 208 may, for example, be or comprise depositing by CVD, PVD, ALD, pulsed laser deposition (PLD), some other suitable deposition process, or any combination of the foregoing. In some embodiments, the process further comprises in-situ thermal annealing to enhance crystallinity of the stress layer 208. By in-situ, it is meant that the thermal annealing is performed in a same process chamber that the stress layer 208 is deposited in without moving the substrate 102 between the depositing and the annealing. The in-situ thermal annealing may, for example, be performed at about 300-700 degrees Celsius or some other suitable temperature, and/or may, for example, be performed for about 0.5-10 minutes or some other suitable amount of time. Further, the in-situ thermal annealing may, for example, be performed by substrate heating, by infrared heating with heaters at sidewalls of a process chamber, or by some other suitable type of heating. In some embodiments, a process for forming the stress layer 208 comprises a PLD process that deposits quasi-monocrystalline metal oxides. In some embodiments, the stress layer 208 has a thickness of about 0.5-5.0 nanometers or some other suitable value. In some embodiments, the stress layer 208 is as described with regard to FIG. 2D.

Figure 9:
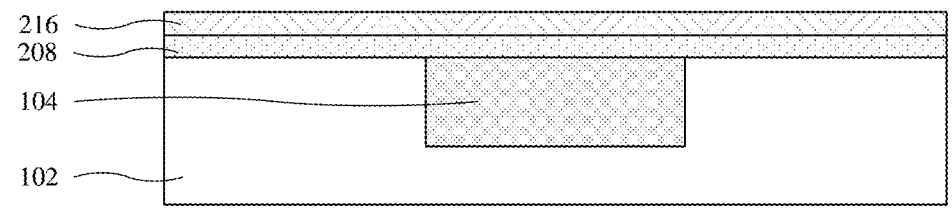

As illustrated by the cross-sectional view 900 of FIG. 9, a restoration layer 216 is formed over the stress layer 208. In some embodiments, a process for forming the restoration layer 216 is or comprises depositing the restoration layer 216 by ALD and/or some other suitable deposition process. The ALD may, for example, be performed at about 300-800 degrees Celsius, about 300-550 degrees Celsius, about 550-800 degrees Celsius, or some other suitable temperature. In some embodiments, the process further comprises in-situ thermal annealing to enhance crystallinity of the restoration layer 216. By in-situ, it is meant that the thermal annealing is performed in a same process chamber that the restoration layer 216 is deposited in without moving the substrate 102 between the depositing and the annealing. The in-situ thermal annealing may, for example, be performed at about 400-700 degrees Celsius or some other suitable temperature, and/or may, for example, be performed for about 1-5 minutes or some other suitable amount of time. Further, the in-situ thermal annealing may, for example, be performed by substrate heating, by infrared heating with heaters at sidewalls of a process chamber, or by some other suitable type of heating. In some embodiments, the restoration layer 216 has a thickness of about 0.1-5.0 nanometers, about 1-2 nanometers, or some other suitable value. In some embodiments, the restoration layer 216 is as described with regard to FIG. 2G.

Figure 10:
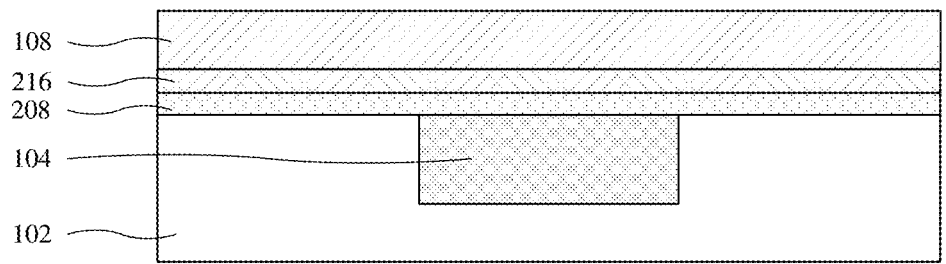

As illustrated by the cross-sectional view 1000 of FIG. 10, a ferroelectric layer 108 is formed over the restoration layer 216. In some embodiments, an alternating stack of ferroelectric layers 108 and restoration layers 216 may be formed to define a multilayer ferroelectric structure as described in FIG. 2F to increase a thickness of the ferroelectric structure and thus increase a remanent polarization. In some embodiments, the stress layer 208 is configured to provide a tensile stress on the ferroelectric layer 108 to enhance the orthorhombic phase crystallinity. In some embodiments, the restoration layer 216 is configured to promote the orthorhombic phase crystallinity of the ferroelectric layer 108 and thus increase the remanent polarization. In some first embodiments, a process for forming the ferroelectric layer 108 comprises depositing the ferroelectric layer 108 as an amorphous layer and then crystallizing the ferroelectric layer 108 with a thermal anneal. The thermal anneal may, for example, be performed at about 300-800 degrees Celsius or some other suitable temperature. In some second embodiments, the process for forming the ferroelectric layer 108 comprises depositing the ferroelectric layer 108 crystallized. The depositing for the first and/or second embodiments may, for example, be or comprise ALD and/or some other suitable deposition process. The ALD may, for example, be performed at or above about 300 degrees Celsius or at some other suitable temperature. In some embodiments, the ferroelectric layer 108 is epitaxially grown from the restoration layer 216, such that the restoration layer 216 serves as a seed for a crystalline lattice of the ferroelectric layer 108. In some embodiments, the ferroelectric layer 108 has a thickness of about 1-40 nanometers, about 1-20 nanometers, about 20-30 nanometers, about 20-40 nanometers, or some other suitable value. In some embodiments, the ferroelectric layer 108 is as described in FIG. 1.

Figure 11:
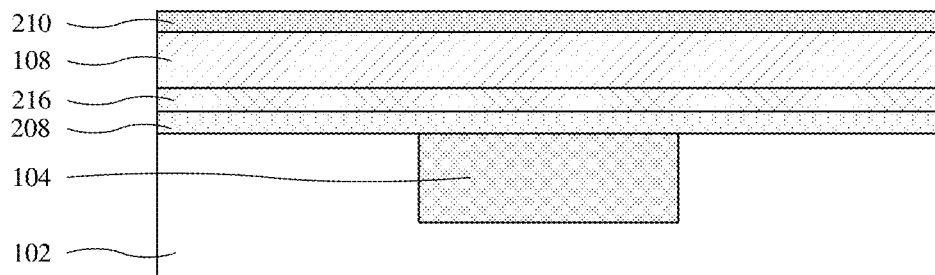

As illustrated by the cross-sectional view 1100 of FIG. 11, an insulating layer 210 is deposited over the ferroelectric layer 108. The insulating layer 210 inhibits oxygen vacancies and/or leakage current at a subsequently formed semiconductor structure to enhance performance. A process for forming the insulating layer 210 may, for example, be or comprise depositing the insulating layer 210. The depositing may, for example, be performed by CVD, PVD, ALD, some other suitable deposition process, or any combination of the foregoing. In some embodiments, the process further comprises doping the insulating layer 210 concurrently with or after the depositing. In some embodiments, the insulating layer 210 has a thickness of about 0.1 to 10 nanometers or some other suitable value. In some embodiments, the insulating layer 210 is as described with regard to FIG. 2E.

Figure 12:
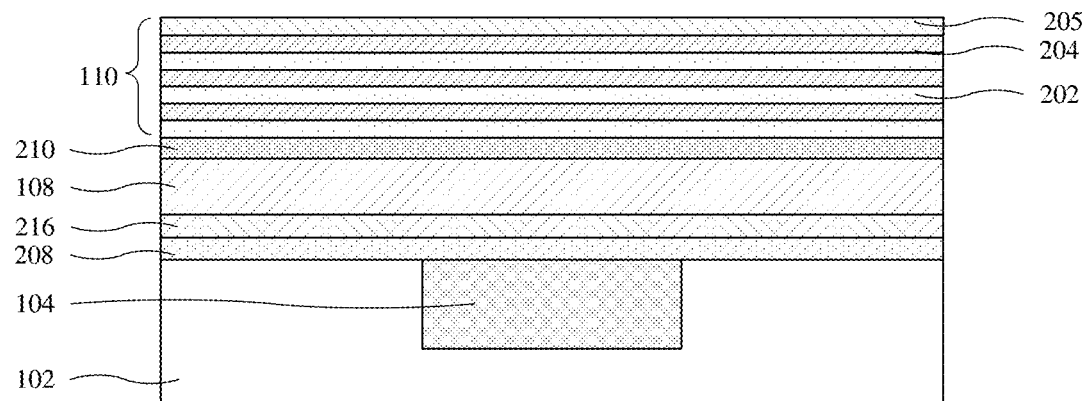

As illustrated by the cross-sectional view 1200 of FIG. 12, a semiconductor structure 110 is deposited over the insulating layer 210, wherein the semiconductor structure 110 comprises a stack of cocktail layers 202 comprising a mixture of first and second materials and first semiconductor layers 204 comprising a third material. The depositing may, for example, be performed by ALD or some other suitable deposition process. In some of such embodiments, a bottommost layer of the semiconductor structure 110 comprises one of the cocktail layers 202. Further, in some embodiments, a topmost layer of the semiconductor structure 110 comprises a second semiconductor layer 205 comprising the first material, but not the second or third materials. In some embodiments, the semiconductor structure 110 may be formed in a reaction chamber using solid precursors.

In some first embodiments, a first solid precursor and a second solid precursor are activated at the same time (e.g., co-pulsed). In some of such embodiments, after an inert gas source activates the first and second solid precursors, oxygen vapor is introduced into the reaction chamber. In some of such embodiments, the oxygen vapor reacts with a precursor mixture vapor from the first and second solid precursors in the reaction chamber to form the cocktail layer 202 on the insulating layer 210 by ALD. In some of such embodiments, the cocktail layer 202 comprises a mixture of first and second materials that are metal oxides.

In some second embodiments, the first solid precursor and the second solid precursor are mixed in a low-pressure vessel to form a solid precursor cocktail. The solid precursor cocktail is subsequently activated by an inert gas source and exposed to oxygen vapor to form the cocktail layer 202 on the insulating layer by ALD.

The first semiconductor layer 204 is then formed over the cocktail layer 202 by ALD using the third solid precursor. In some embodiments, these steps are repeated multiple times to form an alternating stack of cocktail layers 202 and first semiconductor layers 204 over the insulating layer 210. The second semiconductor layer 205 is then deposited by ALD using the first solid precursor.

In some of such embodiments, the first, second, and third materials of the semiconductor structure 110 are metal oxides. In some of such embodiments, the first, second, and third solid precursors may comprise a first metal, a second metal, and a third metal, respectively, corresponding to the first, second, and third materials of the semiconductor structure 110. For example, in some embodiments, the first material may comprise gallium, hafnium, zirconium, titanium, aluminum, tantalum, strontium, barium, scandium, magnesium, lanthanum, gadolinium, or some other suitable metal. In some embodiments, where the first material comprises gallium, the first precursor of the first solid precursor may comprise, for example, a suitable solid precursor comprising gallium.

In some embodiments, the second material comprises indium, tin, zinc, arsenic, or some other suitable metal. In some of such embodiments, where the second material comprises indium, the second solid precursor may comprise, for example, trimethyl-indium, triethyl-indium, or some other suitable solid precursor comprising indium. In some other embodiments, the third material comprises zinc or some other metal. In some embodiments, the third solid precursor comprises, for example, diethylzinc, dimethylzinc, zinc acetate, or some other suitable solid precursor.

Figure 13:
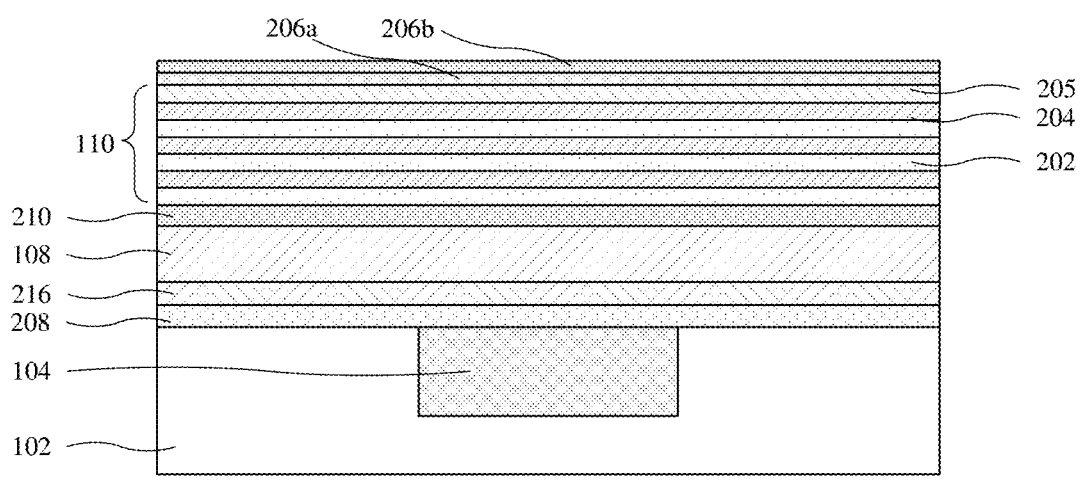

As illustrated by the cross-sectional view 1300 of FIG. 13, a first metal layer 206a and a second metal layer 206b are formed over the semiconductor structure 110. In some embodiments, the first metal layer 206a comprises a first metal material that has a higher affinity for oxygen than the metals in the semiconductor structure 110. A process for forming the first metal layer 206a may be or comprise depositing the first metal layer 206a by DC sputtering, PVD, CVD, ALD, some other suitable deposition process, or any combination of the foregoing. A process for forming the second metal layer 206b may be or comprise depositing the second metal layer 206b by DC sputtering, PVD, CVD, ALD, some other suitable deposition process, or any combination of the foregoing. In some embodiments, the second metal layer 206b is less reactive to oxygen than the first metal layer 206a to prevent oxidation of the first metal layer 206a.

Figure 14:
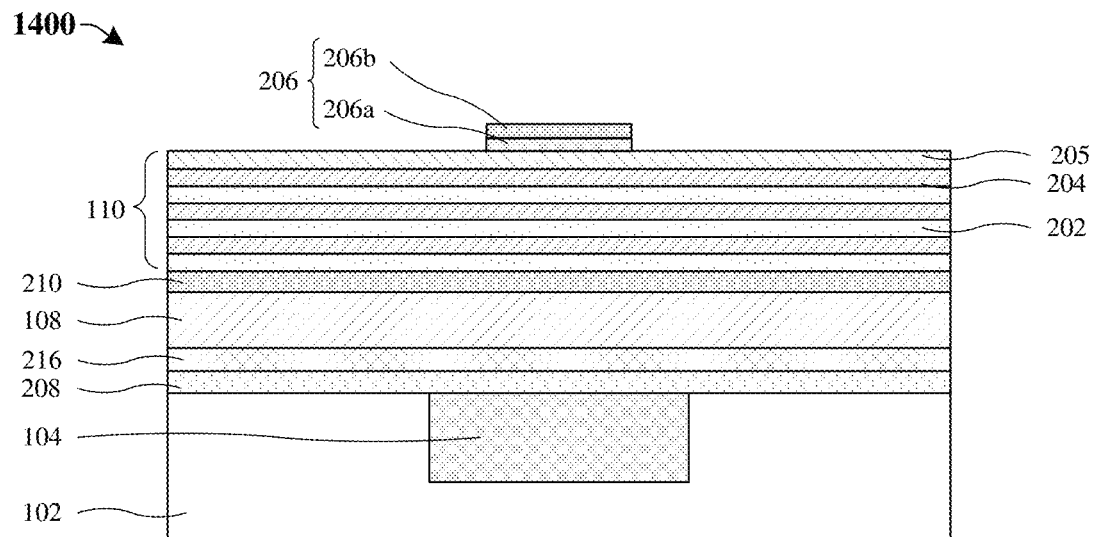

As illustrated by the cross-sectional view 1400 of FIG. 14, the first metal layer 206a and the second metal layer 206b are patterned to define a capping structure 206 with sidewalls that are laterally separated from sidewalls of the semiconductor structure 110. The capping structure 206 is configured to increase charge mobility in the semiconductor structure 110. The patterning may, for example, be performed by a photolithography/etching process or some other suitable patterning process.

Figure 15:
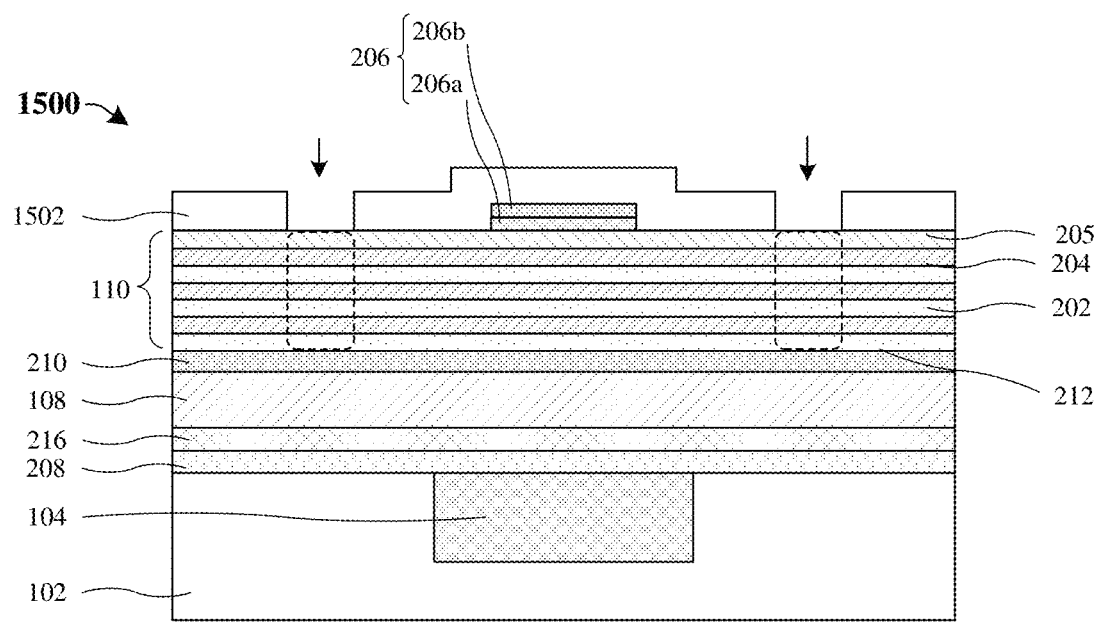

As illustrated by the cross-sectional view 1500 of FIG. 15, a masking structure 1502 is formed over the semiconductor structure 110 and the capping structure 206. The forming may comprise depositing a masking layer and subsequently patterning the masking layer by a photolithography/etching process or some other suitable process. A plasma treatment is then performed on exposed portions of the semiconductor structure 110 to define plasma treated regions 212 of the semiconductor structure 110. The plasma treated regions 212 reduce a contact resistance between the semiconductor structure 110 and the subsequently formed pair of source/drain electrodes. The plasma treated regions 212 further reduce a body resistance of the semiconductor structure 110. In some embodiments, the plasma treatment is performed with, for example, helium, argon, hydrogen, or some other suitable forming gas(es). The masking structure 1502 is then removed by a removal process. The removal process may comprise, for example, a dry etch, a wet etch, a planarization process, or the like.

Figure 16:
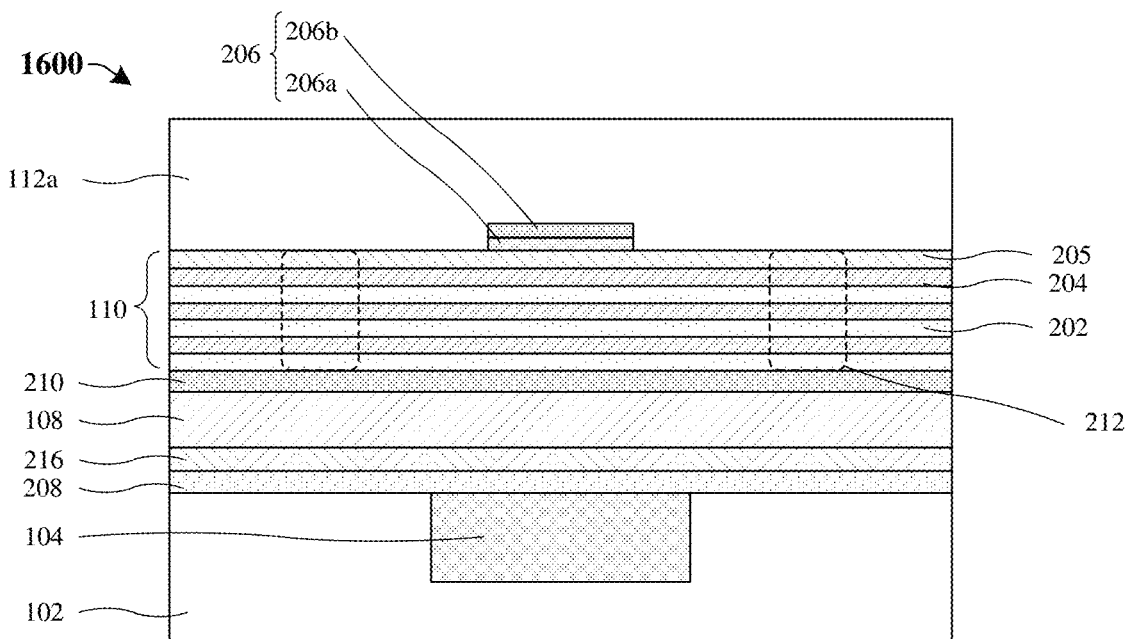

As illustrated by the cross-sectional view 1600 of FIG. 16, a first passivation layer 112a is formed over the semiconductor structure 110 and the capping structure 206. A process for forming the first passivation layer 112a may, for example, be or comprise depositing the first passivation layer 112a and subsequently performing a planarization into a top of the first passivation layer 112a to flatten a top surface of the first passivation layer 112a. Other suitable processes are, however, amenable. The depositing may, for example, be performed by CVD, PVD, ALD, some other suitable deposition process, or any combination of the foregoing.

Figure 17:
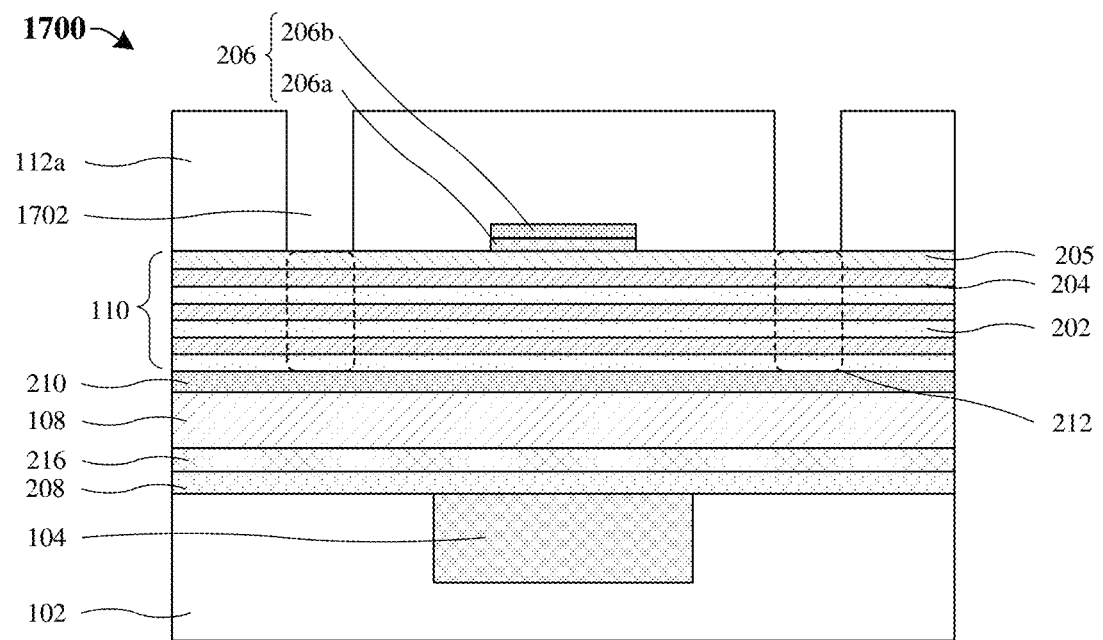

As illustrated by the cross-sectional view 1700 of FIG. 17, the first passivation layer 112a is patterned to form a pair of openings 1702. In some embodiments, the pair of openings 1702 extend from a top surface of the first passivation layer 112a to a bottom surface of the first passivation layer 112a and leave a portion of the semiconductor structure 110 exposed. In some embodiments, the pair of openings 1702 directly overlie the plasma treated regions 212. The patterning may, for example, be performed by a photolithography/etching process or some other suitable patterning process. Etching of the photolithography/etching process may, for example, a dry etch, a wet etch, some other suitable process, or a combination of the foregoing.

Figure 18:
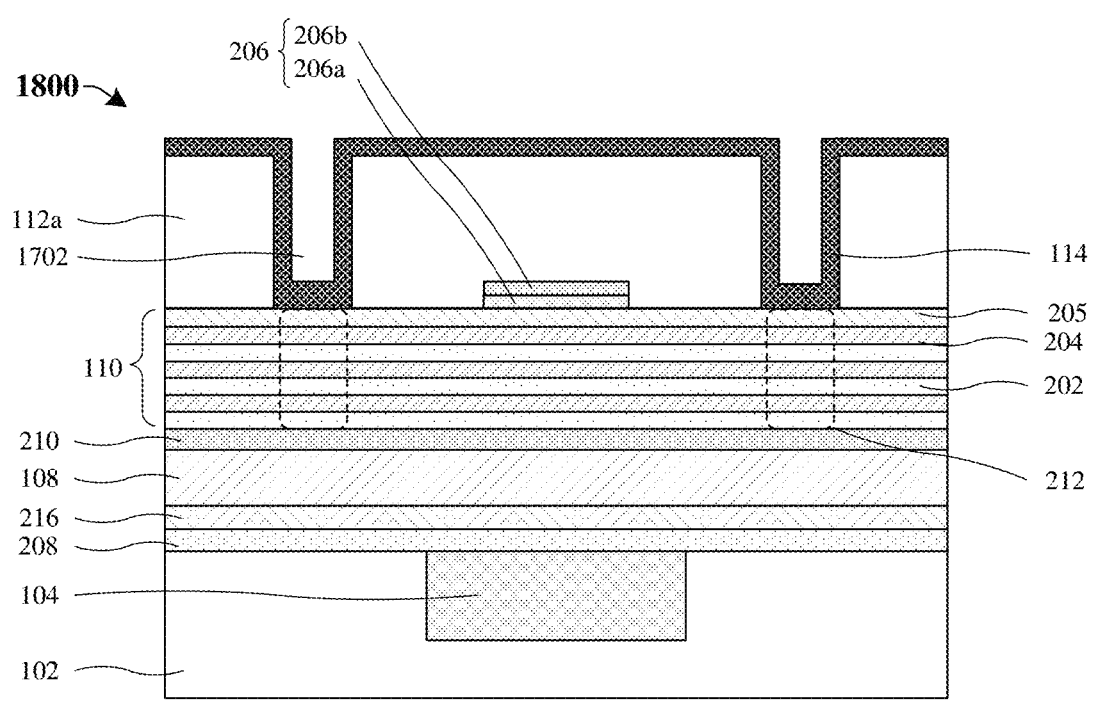

As illustrated by the cross-sectional view 1800 of FIG. 18, a carrier barrier layer 114 is conformally deposited over the first passivation layer 112a and into the pair of openings 1702. The depositing may, for example, be performed by CVD, PVD, ALD, some other suitable deposition process, or any combination of the foregoing.

By including the carrier barrier layer 114 between a subsequently formed pair of source/drain electrodes and the semiconductor structure 110, the carrier barrier layer 114 produces a carrier barrier between the pair of subsequently formed source/drain electrodes and the semiconductor structure 110 that increases the threshold voltage of the bottom gate FeFET structure. In embodiments in which the bottom gate FeFET structure is an n-type device, the carrier barrier is an electron barrier. In embodiments in which the bottom gate FeFET structure is a p-type device, the carrier barrier is a hole barrier. If the threshold voltage was negative, the bottom gate FeFET structure would depend on a constant voltage at the gate electrode 104 to maintain the bottom gate FeFET structure in an off state. To the extent that the threshold voltage would be negative without the carrier barrier layer 114, the increase in threshold voltage may shift the threshold voltage positive, which leads to a decrease in power consumption of the IC. In some embodiments, the carrier barrier layer 114 is as described in FIG. 1.

Figure 19A:
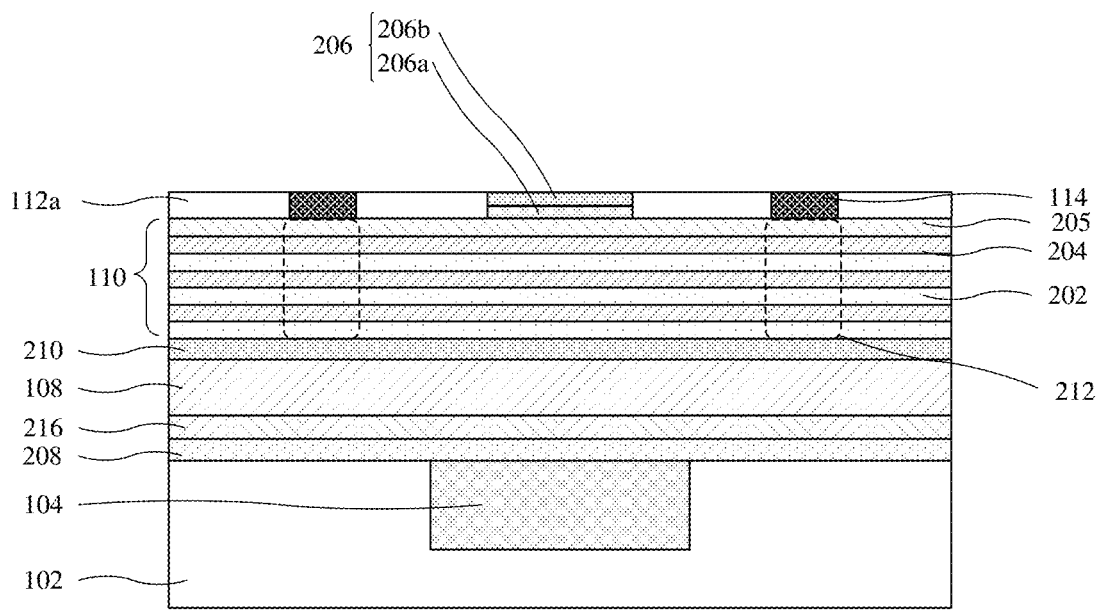

As illustrated by the cross-sectional view 1900A of FIG. 19A, the carrier barrier layer 114 and the first passivation layer 112a of FIG. 19A undergo a thinning down process. The thinning down process defines a pair of barrier segments of a carrier barrier layer 114 disposed between inner sidewalls of the first passivation layer 112a. After the thinning down process, a top surface of the carrier barrier layer 114 is level with a top surface of the first passivation layer 112a continuously from a first sidewall of the first passivation layer 112a to a second sidewall of the first passivation layer 112a opposing the first sidewall. The thinning down process may comprise, for example, etching (e.g., a dry etch, a wet etch, etc.), a planarization process (e.g., chemical-mechanical planarization (CMP)), or the like.

Figure 19B:
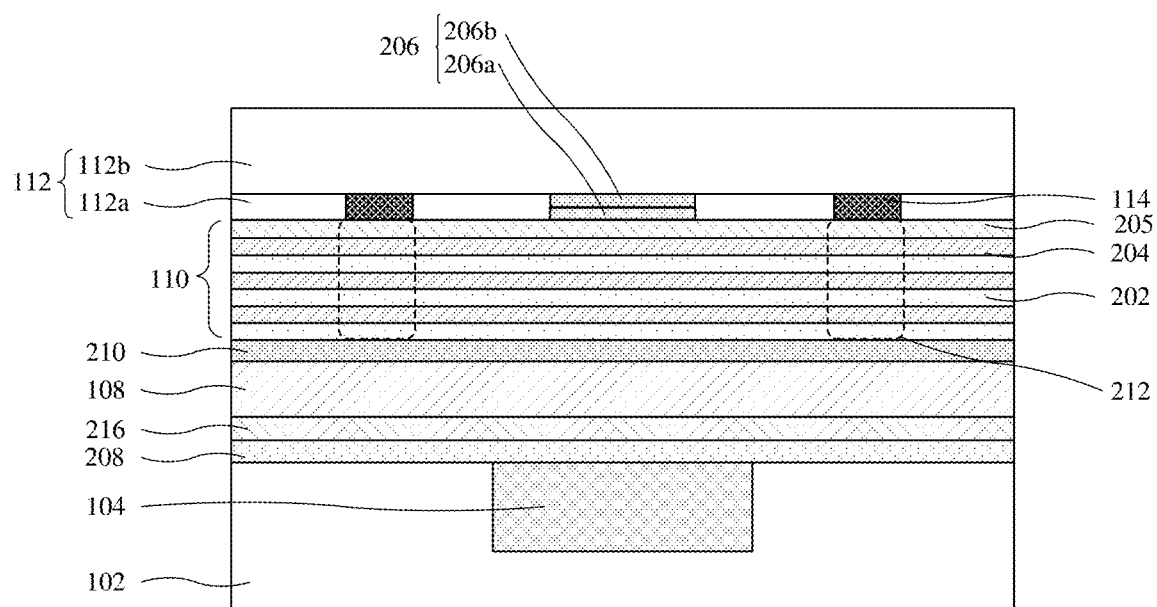

As illustrated by the cross-sectional view 1900B of FIG. 19B, a second passivation layer 112b is formed over the first passivation layer 112a and the capping structure 206. The first passivation layer 112a and the second passivation layer 112b define a passivation structure 112. A process for forming the second passivation layer 112b may, for example, be or comprise depositing the second passivation layer 112b. The depositing may, for example, be performed by CVD, PVD, ALD, some other suitable deposition process, or any combination of the foregoing.

Figure 19C:
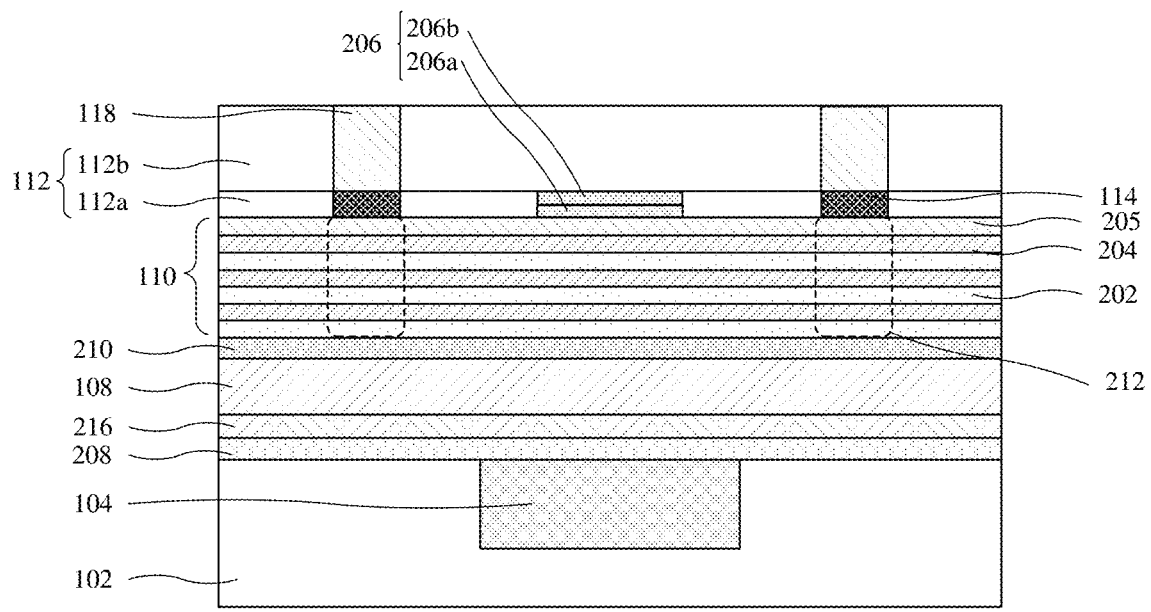

As illustrated by the cross-sectional view 1900C of FIG. 19C, a pair of source/drain electrodes 118 is formed directly over the pair of barrier segments of the carrier barrier layer 114. A process for forming the pair of source/drain electrodes 118 may, for example, be or comprise: patterning the second passivation layer 112b to form a pair of openings respectively exposing the barrier segments; depositing a conductive layer filling the openings and covering the second passivation layer 112b; and planarizing the conductive layer to level a top surface of the conductive layer with that of the second passivation layer 112b. The patterning may, for example, be performed by a photolithography/etching process or some other suitable patterning process. The etching of the photolithography/etching process may comprise, for example, a dry etch, a wet etch, or some other suitable process. The depositing may, for example, be performed by CVD, PVD, ALD, some other suitable deposition process, or any combination of the foregoing.

Figure 19D:
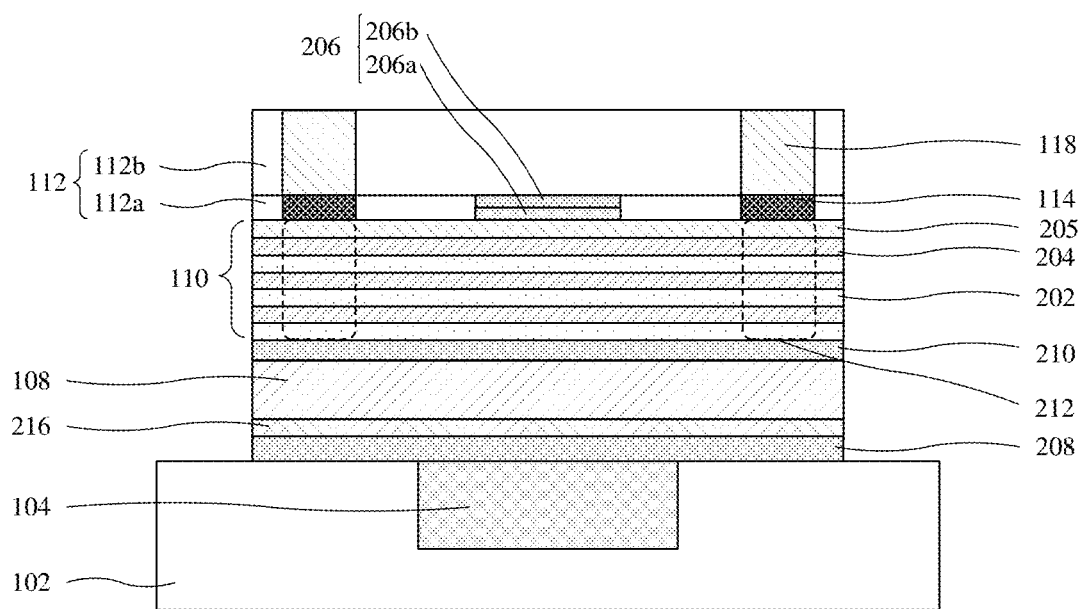

As illustrated by the cross-sectional view 1900D of FIG. 19D, the stress layer 208, the restoration layer 216, the ferroelectric layer 108, the insulating layer 210, the semiconductor structure 110, and the passivation structure 112 are patterned to form a columnar structure and to remove peripheral portions. The patterning may, for example, be performed by a photolithography/etching process or some other suitable process. The patterning may, for example, comprise a dry etch, a wet etch, or some other suitable removal process.

Figure 19E:
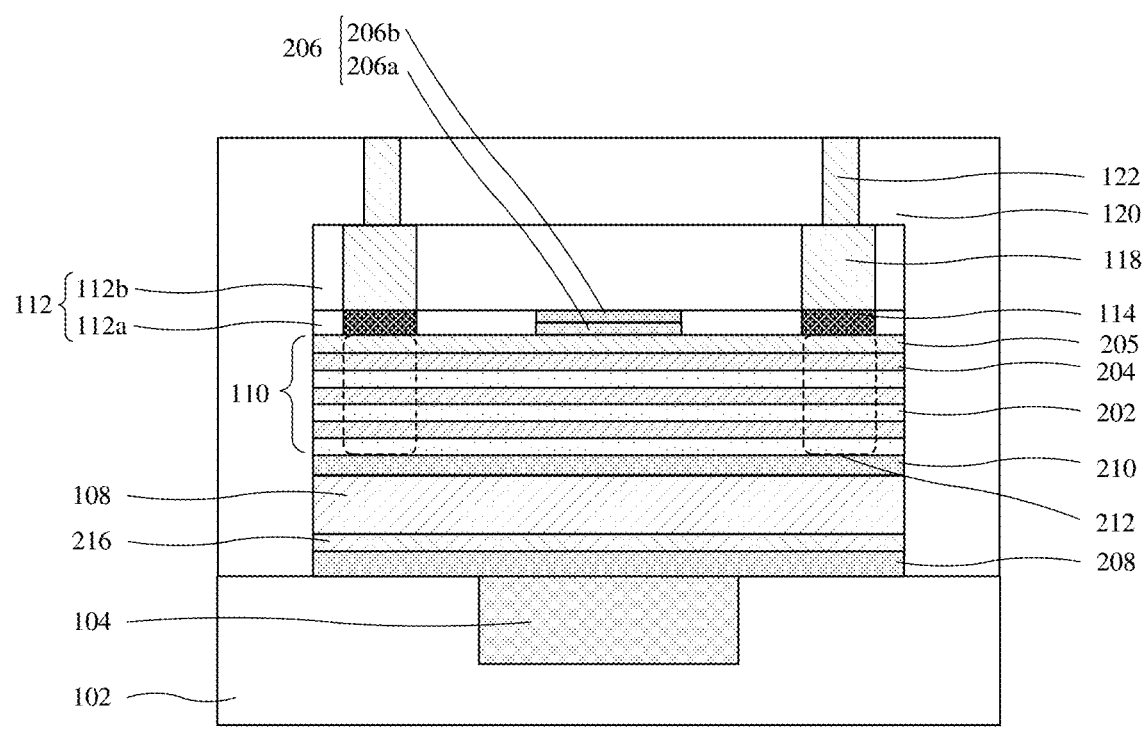

As illustrated by the cross-sectional view 1900E of FIG. 19E, an ILD structure 120 is formed over the columnar structure and the substrate 102. Further, a plurality of contacts 122 are formed, extending through the ILD structure 120 to contact the pair of source/drain electrodes 118. The ILD structure 120 and the plurality of contacts 122 may be formed by, for example, a damascene process or some other suitable process.

FIGS. 19A-19E illustrate first embodiments of the method proceeding from FIGS. 7-18. In second embodiments of the method, the acts described hereafter with regard to FIGS. 20A-20D are instead performed in place of the acts described above with regard to FIGS. 19A-19E. In other words, second embodiments of the method proceed from FIGS. 7-18 to FIGS. 20A-20D while skipping FIGS. 19A-19E.

Figure 20A:
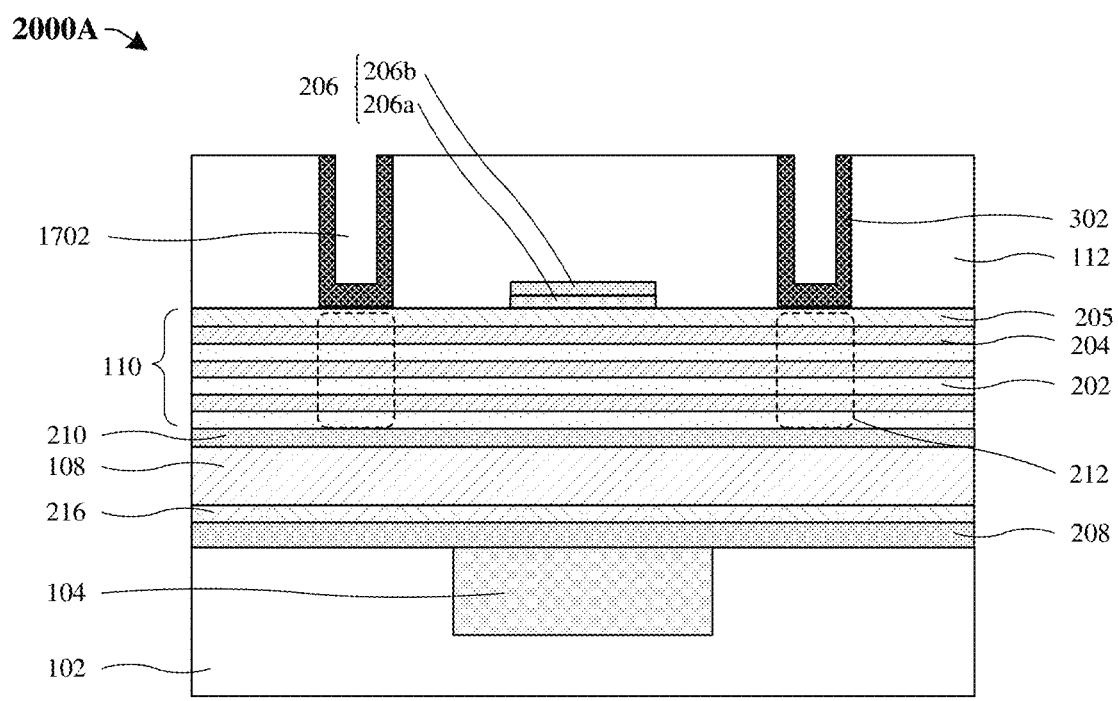

As illustrated by the cross-sectional view 2000A of FIG. 20A, the carrier barrier layer 114 and the first passivation layer 112a of FIG. 20A undergo a thinning down process. The thinning down process defines a pair of barrier segments of a carrier barrier layer 302 disposed between inner sidewalls of a passivation structure 112. Each segment of the carrier barrier layer 302 comprises a vertically extending portion disposed along inner sidewalls of the passivation structure 112, and a laterally extending portion disposed along the semiconductor structure 110. The thinning down process may comprise, for example, etching (e.g., a dry etch, a wet etch, etc.), a planarization process (e.g., chemical-mechanical planarization (CMP)), or the like.

Figure 20B:
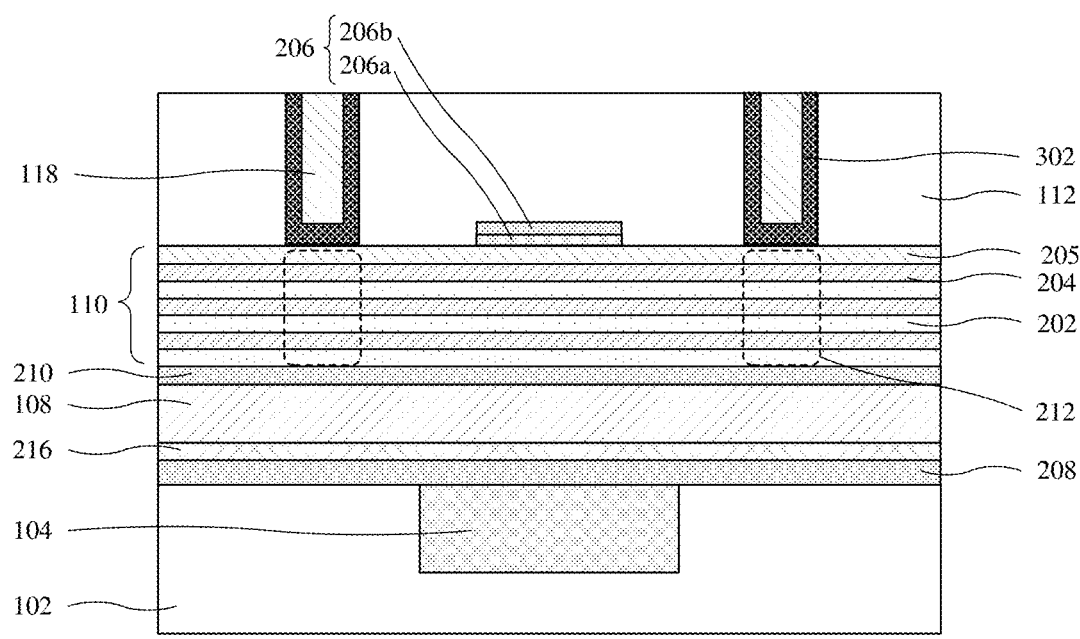

As illustrated by the cross-sectional view 2000B of FIG. 20B, a pair of source/drain electrodes 118 is formed in the pair of openings 1702. The pair of source/drain electrodes 118 are formed between inner sidewalls of the pair of barrier segments of the carrier barrier layer 302. A process for forming the pair of source/drain electrodes 118 may, for example, be or comprise: depositing a conductive layer filling the openings and covering the passivation structure 112; and planarizing the conductive layer to level a top surface of the conductive layer with that of the passivation structure 112. The patterning may, for example, be performed by a photolithography/etching process or some other suitable patterning process. The depositing may, for example, be performed by CVD, PVD, ALD, some other suitable deposition process, or any combination of the foregoing.

Figure 20C:
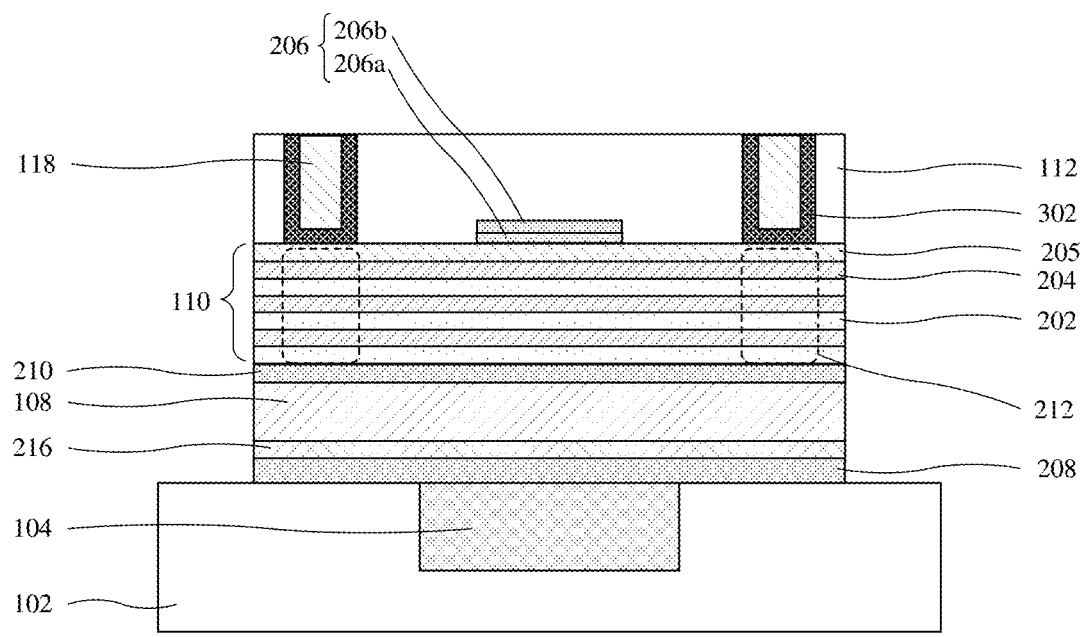

As illustrated by the cross-sectional view 2000C of FIG. 20C, the stress layer 208, the restoration layer 216, the ferroelectric layer 108, the insulating layer 210, the semiconductor structure 110, and the passivation structure 112 are patterned to form a columnar structure and to remove peripheral portions. The patterning may, for example, be performed by a photolithography/etching process or some other suitable process. The patterning may, for example, comprise a dry etch, a wet etch, or some other suitable removal process.

Figure 20D:
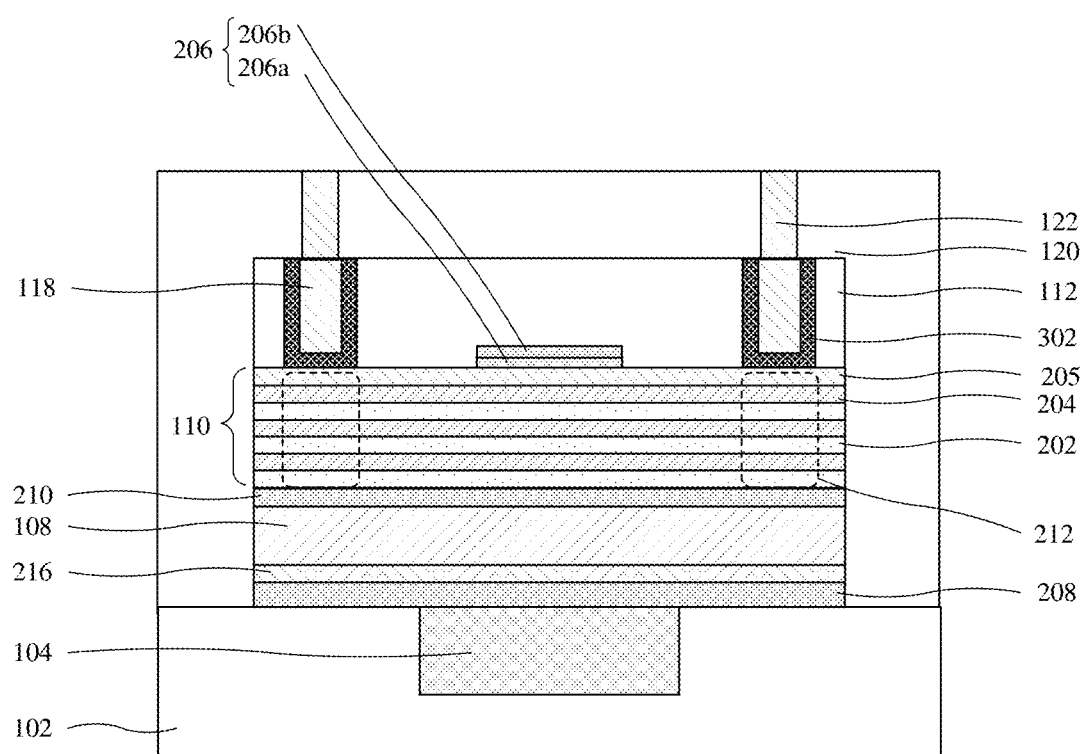

As illustrated by the cross-sectional view 2000D of FIG. 20D, an ILD structure 120 is formed over the columnar structure and the substrate 102. Further, a plurality of contacts 122 are formed, extending through the ILD structure 120 to contact the pair of source/drain electrodes 118. The ILD structure 120 and the plurality of contacts 122 may be formed by, for example, a damascene process or some other suitable process.

Figure 21:
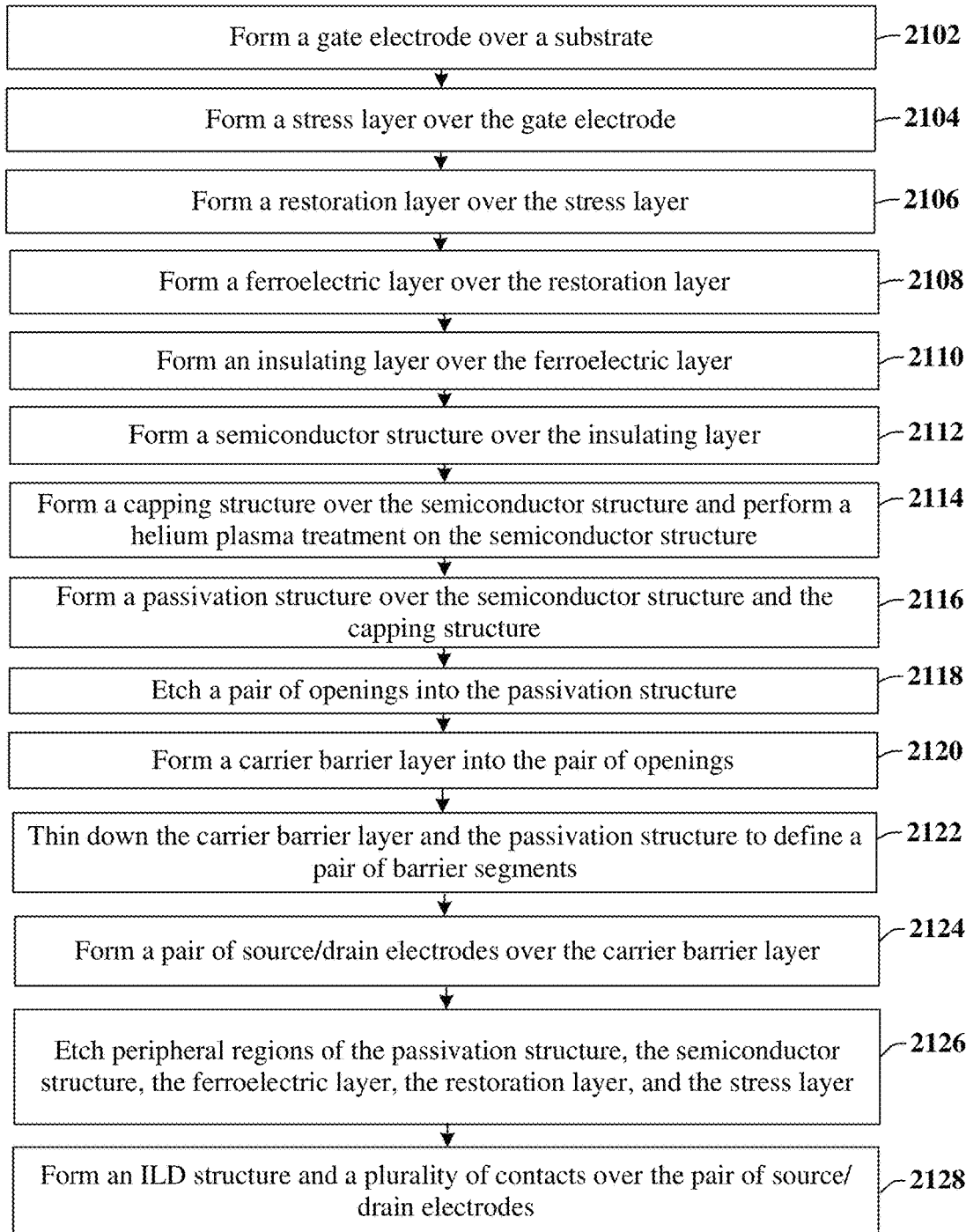
FIG. 21 illustrates a block diagram of some embodiments of the method of FIGS. 7-18, 19A-19E, and 20A-20D.

With respect to FIG. 21 a flowchart 2100 illustrating some embodiments of a method for forming an IC chip in which a bottom gate FeFET structure comprises a carrier barrier layer separating a pair of source/drain electrodes from a semiconductor structure is provided. The method may, for example, correspond to the method of FIGS. 7-18, 19A-19E, and 20A-20D.

While the disclosed flowchart 2100 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases. It will be appreciated that one or more of the method steps relating to the formation of the stress layer, the restoration layer, the insulating layer, the stacked semiconductor structure, the plasma treated region, and the capping structure may be omitted.

At act 2102, a gate electrode is formed over a substrate. See, for example, FIG. 7.

At act 2104, a stress layer is formed over the gate electrode. See, for example, FIG. 8.

At act 2106, a restoration layer is formed over the stress layer. See, for example, FIG. 9.

At act 2108, a ferroelectric layer is formed over the restoration layer. See, for example, FIG. 10.

At act 2110, an insulating layer is formed over the ferroelectric layer. See, for example, FIG. 11.

At act 2112, a semiconductor structure is formed over the insulating layer. See, for example, FIG. 12.

At act 2114, a capping structure is formed over the semiconductor structure and a plasma treatment is performed on the semiconductor structure. See, for example, FIGS. 13-15.

At act 2116, a passivation structure is formed over the semiconductor structure and the capping structure. See, for example, FIG. 16.

At act 2118, the passivation structure is patterned to form a pair of openings. See, for example, FIG. 17.

At act 2120, a carrier barrier layer is formed into the pair of openings. See, for example, FIG. 18.

At act 2122, the carrier barrier layer and the passivation structure are thinned down to define a pair of barrier segments. See, for example, FIGS. 19A and 20A.

At act 2124, a pair of source/drain electrodes is formed over the carrier barrier layer. See, for example, FIGS. 19C and 20B.

At act 2126, peripheral regions of the passivation structure, the semiconductor structure, the ferroelectric layer, the restoration layer, and the stress layer are patterned to form a columnar structure. See, for example, FIGS. 19D and 20C.

At act 2128, an ILD structure and a plurality of contacts are formed over the pair of source/drain electrodes. See, for example, FIGS. 19E and 20D.

FIGS. 22-37 illustrate a series of cross-sectional views of some embodiments of a method for forming an IC chip in which a top gate FeFET structure comprises a carrier barrier layer separating a pair of source/drain electrodes from a semiconductor structure and further extending along sidewalls of the source/drain electrodes. Although FIGS. 22-37 are described in relation to a method, it will be appreciated that the structures disclosed in FIGS. 22-37 are not limited to such a method, but instead may stand alone as structures independent of the method.

Figure 22:
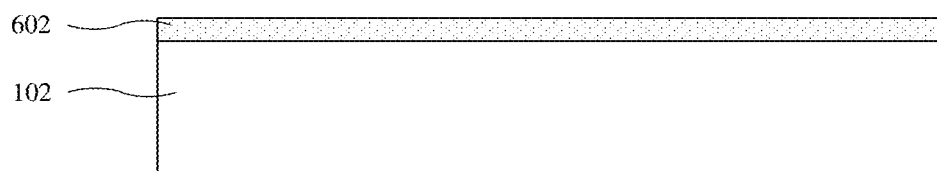
FIGS. 22-37 illustrate a series of cross-sectional views of some embodiments of a method for forming an IC chip in which a top gate FeFET structure comprises a carrier barrier layer separating a pair of source/drain electrodes from a semiconductor structure and further along sidewalls of the source/drain electrodes.

As illustrated by the cross-sectional view 2200 of FIG. 22, a buffer layer 602 is formed over a substrate 102. In some embodiments, the buffer layer 602 is configured to separate a subsequently formed semiconductor structure from the substrate 102 to accommodate a difference in their crystallographic structures. In at least some of such embodiments, the subsequently formed semiconductor structure is or comprises amorphous Indium-Gallium-Zinc-Oxide (a-IGZO) or the like. A process for forming the buffer layer 602 may, for example, be or comprise depositing the buffer layer 602. The depositing may, for example, be performed by CVD, PVD, ALD, some other suitable deposition process, or any combination of the foregoing.

Figure 23:
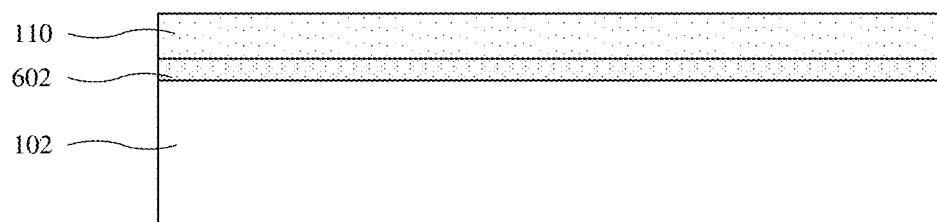

As illustrated by the cross-sectional view 2300 of FIG. 23, a semiconductor structure 110 is formed over the buffer layer 602. In some embodiments, the semiconductor structure 110 is or comprises amorphous Indium-Gallium-Zinc-Oxide (a-IGZO), a group III-V material, a group II-VI material, some other suitable semiconductor material, or any combination of the foregoing. In such embodiments, the semiconductor structure 110 is formed according to the acts described in FIG. 12. The group III-V material may, for example, be or comprise gallium arsenide (e.g., GaAs), gallium arsenide indium (e.g., GaAsIn), some other suitable group III-V material, or any combination of the foregoing. The group II-VI material may, for example, be or comprise zinc oxide (e.g., ZnO), magnesium oxide (e.g., MgO), gadolinium oxide (e.g., GdO), some other suitable II-VI material, or any combination of the foregoing.

In some embodiments, the semiconductor structure 110 is or comprises silicon, silicon germanium, some other suitable semiconductor material(s), or any combination of the foregoing. In embodiments in which the semiconductor structure 110 is silicon-based, the semiconductor structure 110, the buffer layer 602, and the substrate 102 define an SOI substrate. In at least some of such embodiments, the SOI substrate may be provided in lieu of the formation steps of FIGS. 22-23. In some embodiments, the semiconductor structure 110 has a thickness ranging from about 2 nanometers to 70 nanometers, 10 nanometers to 40 nanometers, or some other suitable value. In some embodiments, the semiconductor structure 110 is as described with regard to FIGS. 6A-6B.

Figure 24:
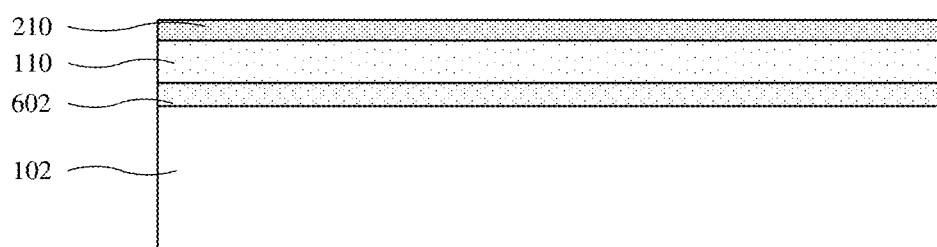

As illustrated by the cross-sectional view 2400 of FIG. 24, an insulating layer 210 is formed over the semiconductor structure 110. The insulating layer 210 inhibits oxygen vacancies and/or leakage current at the semiconductor structure 110 to enhance performance. A process for forming the insulating layer 210 may, for example, be or comprise depositing the insulating layer 210. The depositing may, for example, be performed by CVD, PVD, ALD, some other suitable deposition process, or any combination of the foregoing. In some embodiments, the process further comprises doping the insulating layer 210 concurrently with or after the depositing. In some embodiments, the insulating layer 210 has a thickness of about 0.1 to 10 nanometers or some other suitable value. In some embodiments, the insulating layer 210 is as described with regard to FIGS. 6C-6D.

Figure 25:
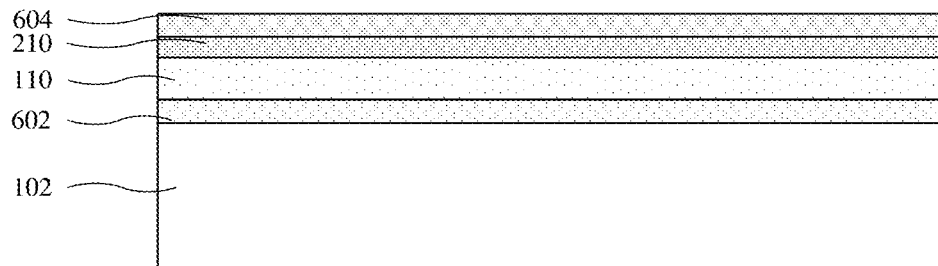

As illustrated by the cross-sectional view 2500 of FIG. 25, a floating gate 604 is formed over the insulating layer 210. A process for forming the floating gate 604 may, for example, be or comprise depositing the floating gate 604. The depositing may, for example, be performed by DC sputtering, CVD, PVD, ALD, some other suitable deposition process, or any combination of the foregoing.

Figure 26:
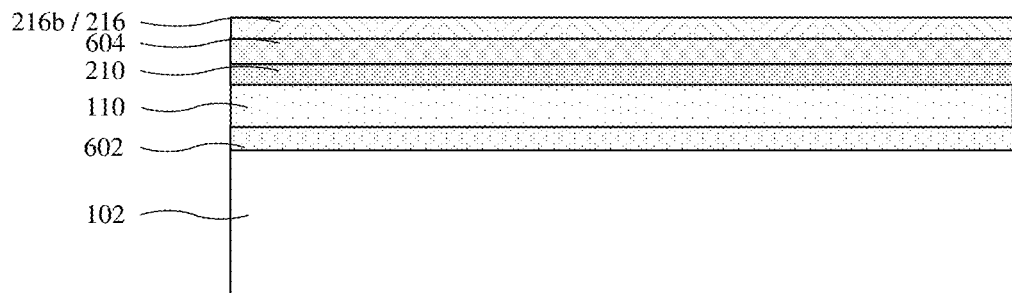

As illustrated by the cross-sectional view 2600 of FIG. 26, a bottom restoration layer 216b is formed over the floating gate 604. In some embodiments, a process for forming the bottom restoration layer 216b is as described with respect to FIG. 9. In some embodiments, the bottom restoration layer 216b is as described with regard to FIGS. 6C-6D.

Figure 27:
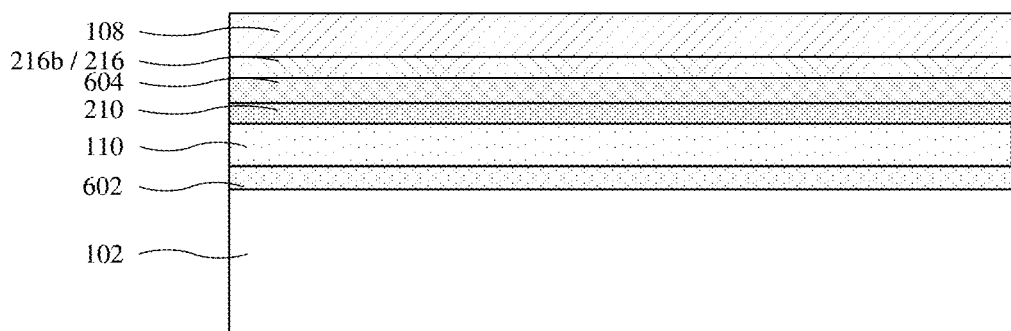

As illustrated by the cross-sectional view 2700 of FIG. 27, a ferroelectric layer 108 is formed over the bottom restoration layer 216b. In some embodiments, an alternating stack of ferroelectric layers 108 and restoration layers 216 may be formed to define a multilayer ferroelectric structure as described in FIG. 2F to increase a thickness of the ferroelectric structure and thus increase the remanent polarization. In some embodiments, the restoration layer 216 is configured to promote the orthorhombic phase crystallinity of the ferroelectric layer 108 and thus increase the remanent polarization. In some first embodiments, a process for forming the ferroelectric layer 108 is as described with respect to FIG. 10. In some embodiments, the ferroelectric layer 108 is as described in FIG. 5.

Figure 28:
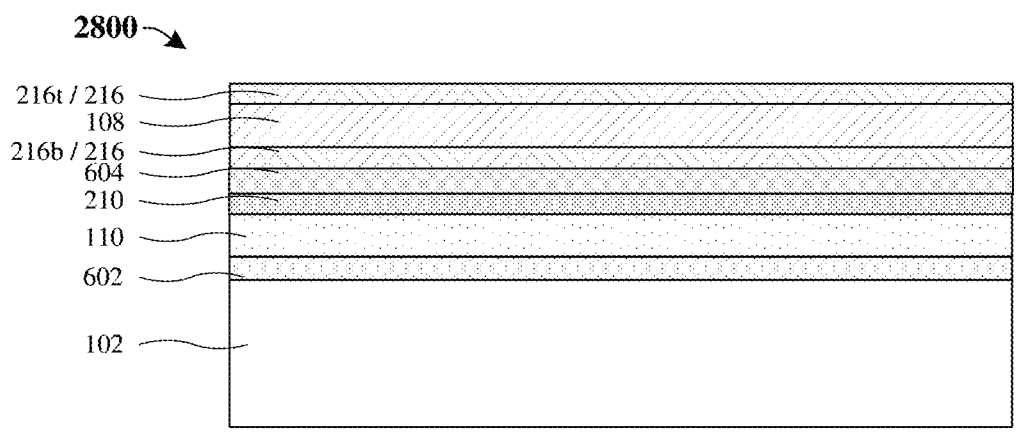

As illustrated by the cross-sectional view 2800 of FIG. 28, a top restoration layer 216t is formed over the ferroelectric layer 108. The top restoration layer 216t is formed with a same process by which the restoration layer 216 is formed in FIG. 9. In some embodiments, the top restoration layer 216t is as described in FIGS. 6C-6D. The inclusion of the top restoration layer 216t further promotes a formation of orthorhombic phase crystals in the ferroelectric layer 108, which further increases the remanent polarization.

Figure 29:
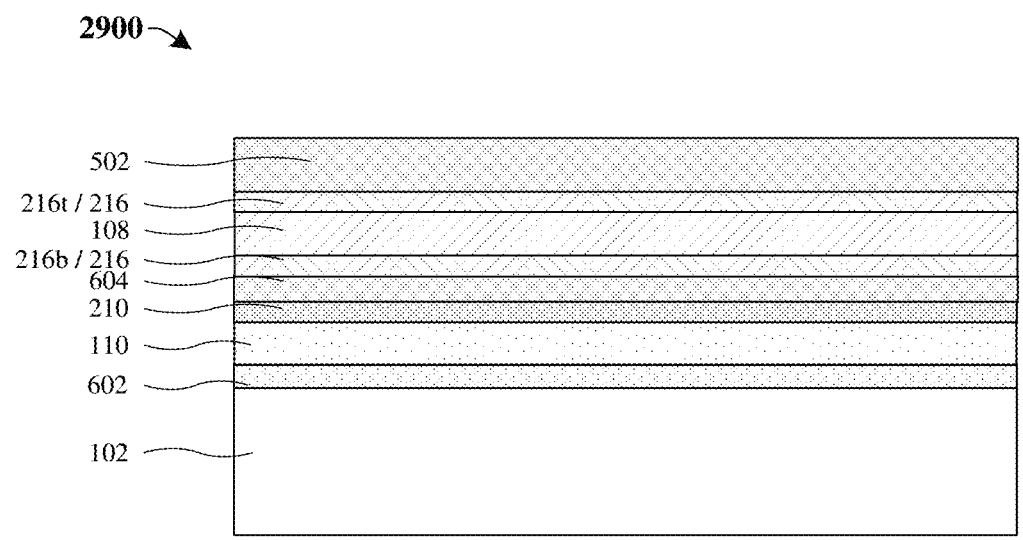

As illustrated by the cross-sectional view 2900 of FIG. 29, a gate electrode 502 is formed over the top restoration layer 216t. A process for forming the gate electrode 502 may be or comprise depositing the gate electrode 502 by DC sputtering, PVD, CVD, ALD, some other suitable deposition process, or any combination of the foregoing. In some embodiments, the gate electrode 502 has a thickness of about 15-500 nanometers or some other suitable thickness. In some embodiments, the gate electrode 502 is as described with regard to FIG. 5.

Figure 30:
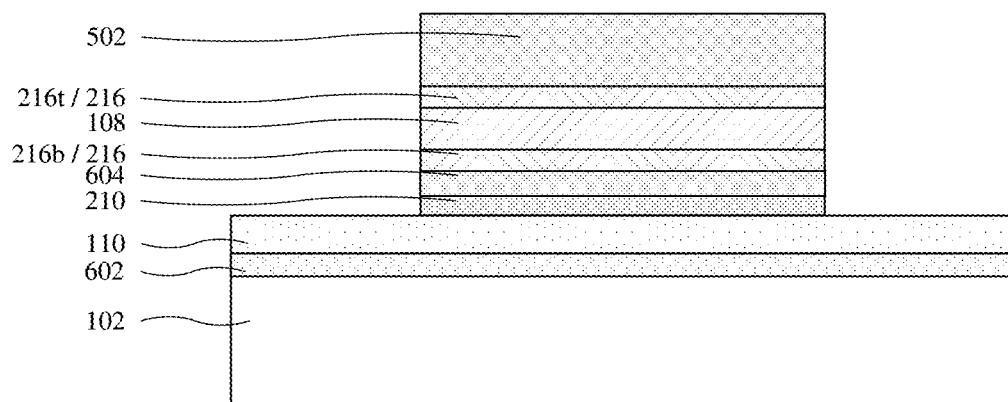

As illustrated by the cross-sectional view 3000 of FIG. 30, the ferroelectric layer 108, the floating gate 604, the insulating layer 210, and the gate electrode 502 are patterned to define a columnar structure over the semiconductor structure 110. The patterning may, for example, comprise: forming a mask over the gate electrode 502; etching according to a pattern of the mask; and removing the mask. The etching may, for example, be performed by a dry etch, a wet etch, or some other suitable patterning process.

Figure 31:
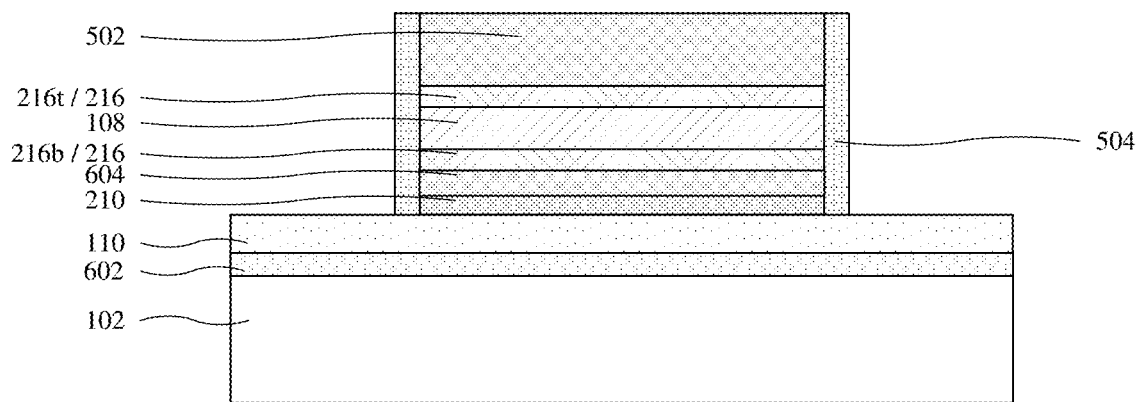

As illustrated by the cross-sectional view 3100 of FIG. 31, a sidewall spacer 504 is formed on sidewalls of the columnar gate stack. A process for forming the sidewall spacer 504 may be or comprise: depositing a spacer layer covering the columnar gate stack and on sidewalls of the columnar gate stack; and etching back the spacer layer to localize the spacer layer to the sidewalls. The depositing may, for example, be performed by PVD, CVD, ALD, some other suitable deposition process, or any combination of the foregoing. The spacer layer may, for example, be or comprise silicon nitride, silicon oxide, some other suitable dielectric, or any combination of the foregoing. In some embodiments, the sidewall spacer 504 is as described with regard to FIG. 5.

Figure 32:
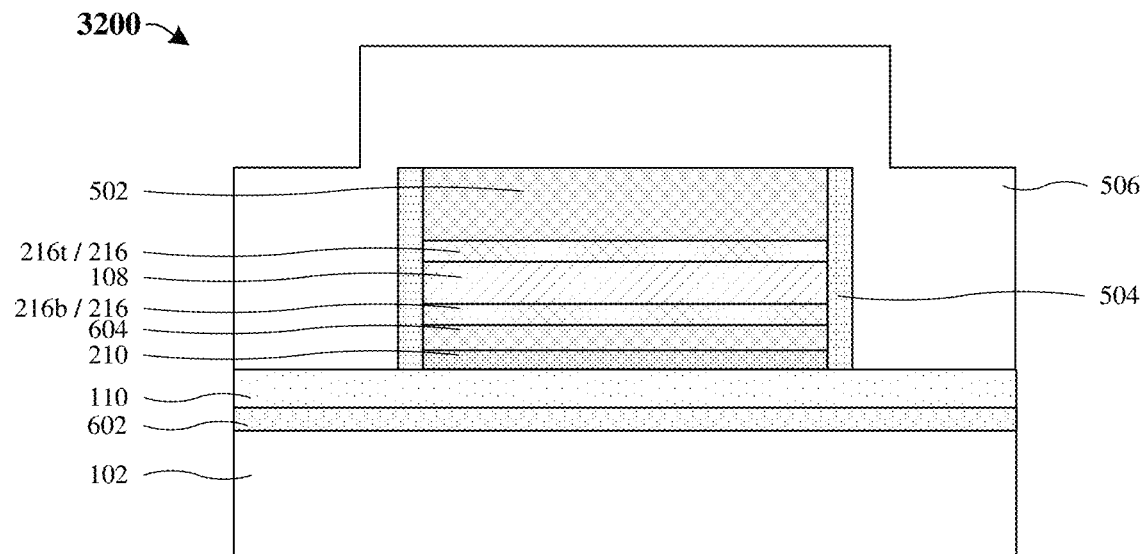

As illustrated by the cross-sectional view 3200 of FIG. 32, a first ILD structure 506 is conformally formed over and surrounding the columnar gate stack. A process for forming the first ILD structure 506 may be or comprise depositing the first ILD structure 506 by PVD, CVD, ALD, some other suitable deposition process, or any combination of the foregoing. In some embodiments, the first ILD structure 506 is as described with regard to FIG. 5.

Figure 33:
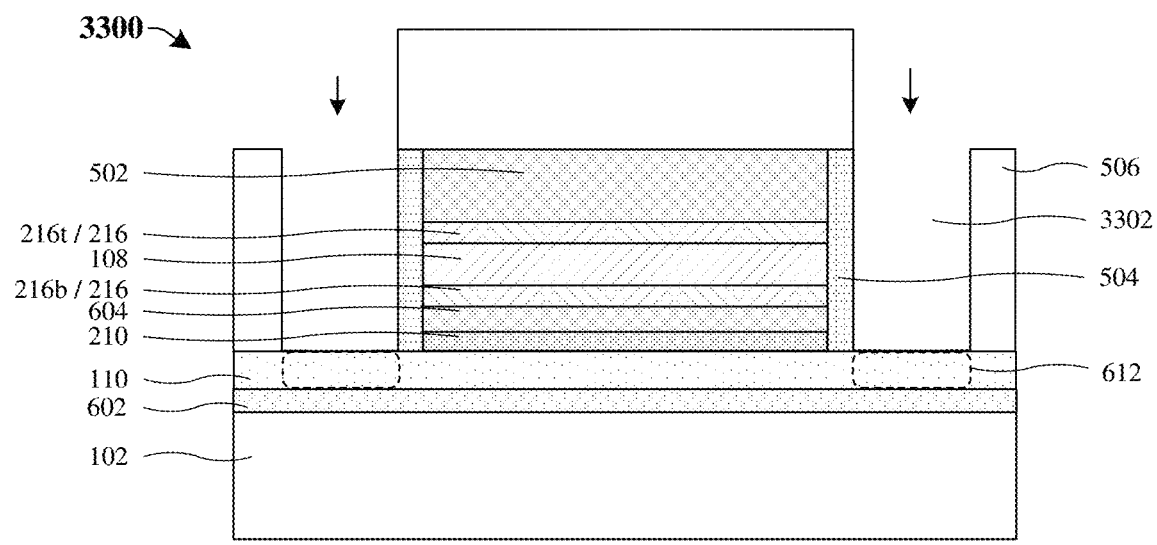

As illustrated by the cross-sectional view 3300 of FIG. 33, the first ILD structure 506 is patterned to form a pair of openings 3302. In some embodiments, the pair of openings 3302 extend from a top surface of the first ILD structure 506 to a bottom surface of the first ILD structure 506 and leave a portion of the semiconductor structure 110 exposed. The patterning may, for example, comprise a photolithography/etching process or some other suitable patterning process. The etch of the photolithography/etching process may, for example, be performed by a dry etch, a wet etch, some other suitable etch, or a combination of the foregoing. In some embodiments in which the semiconductor structure 110 is silicon-based, exposed portions of the semiconductor structure 110 are doped by, for example, ion implantation of n-type dopants or p-type dopants, or some other suitable doping process, thereby forming doped regions 612 of the semiconductor structure 110. The doped regions 612 may, for example, be n-type or p-type. See, for example, FIG. 6B. In alternative embodiments, the semiconductor structure 110 undergoes a plasma treatment to form plasma treated regions. The semiconductor structure 110 may be treated by, for example, helium, argon, hydrogen, or some other suitable forming gas(es). See, for example, FIG. 6A.

Figure 34:
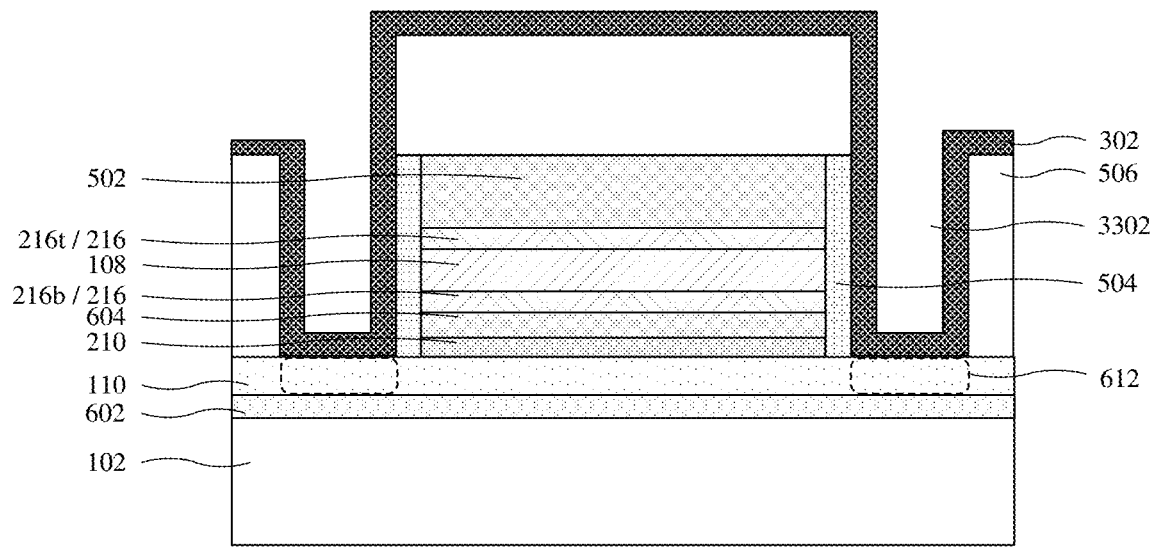

As illustrated by the cross-sectional view 3400 of FIG. 34, a carrier barrier layer 302 is formed into the pair of openings 3302. The carrier barrier layer 302 is formed over the semiconductor structure 110, over the gate electrode 502, along sidewalls of the sidewall spacer 504, and along sidewalls of the first ILD structure 506. A process for forming the carrier barrier layer 302 may, for example, be or comprise depositing the carrier barrier layer 302 and subsequently performing a planarization to localize the carrier barrier layer 302 to the openings 3302. The depositing may, for example, be performed by CVD, PVD, ALD, some other suitable deposition process, or any combination of the foregoing. The planarization may, for example, be performed by a CMP or some other suitable planarization process.

By including the carrier barrier layer 302 between a subsequently formed pair of source/drain electrodes and the semiconductor structure 110, the carrier barrier layer 302 produces a carrier barrier between the pair of subsequently formed source/drain electrodes and the semiconductor structure 110 that increases the threshold voltage of the top gate FeFET structure. In embodiments in which the top gate FeFET structure is an n-type device, the carrier barrier is an electron barrier. In embodiments in which the top gate FeFET structure is a p-type device, the carrier barrier is a hole barrier. If the threshold voltage would be negative without the carrier barrier layer 302, the top gate FeFET structure would depend on a constant negative voltage at the gate electrode 104 to maintain the top gate FeFET structure in an off state. Thus, the increase in threshold voltage may shift the threshold voltage positive, which leads to a decrease in power consumption of the IC. In some embodiments, the carrier barrier layer 302 is as described in FIG. 5.

Figure 35:
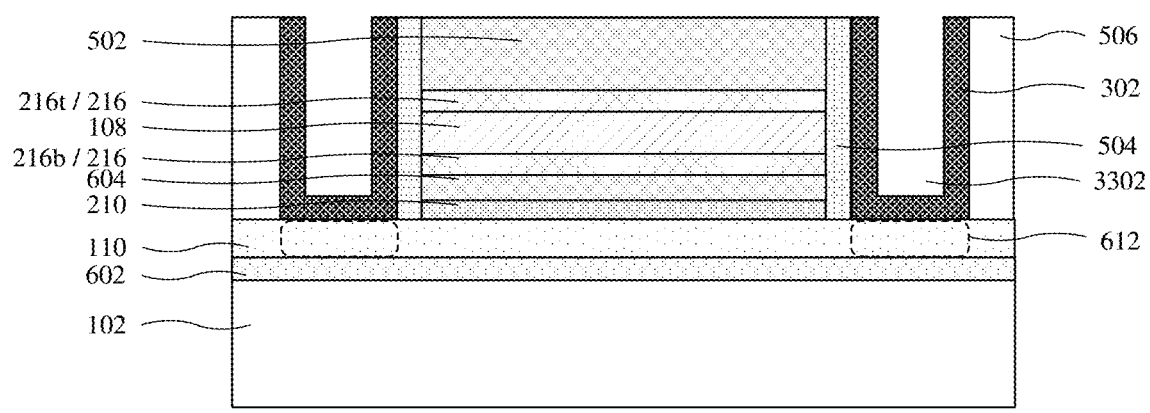

As illustrated by the cross-sectional view 3500 of FIG. 35, the first ILD structure 506 and the carrier barrier layer 302 are thinned down, thereby defining a pair of barrier segments of the carrier barrier layer 302. In some embodiments, a top surface of the first ILD structure 506 and a top surface of the carrier barrier layer 302 are aligned with a top surface of the gate electrode 502. The thinning down process may comprise, for example, etching (e.g., a dry etch, a wet etch, etc.), a planarization process (e.g., chemical-mechanical planarization (CMP)), or the like.

Figure 36:
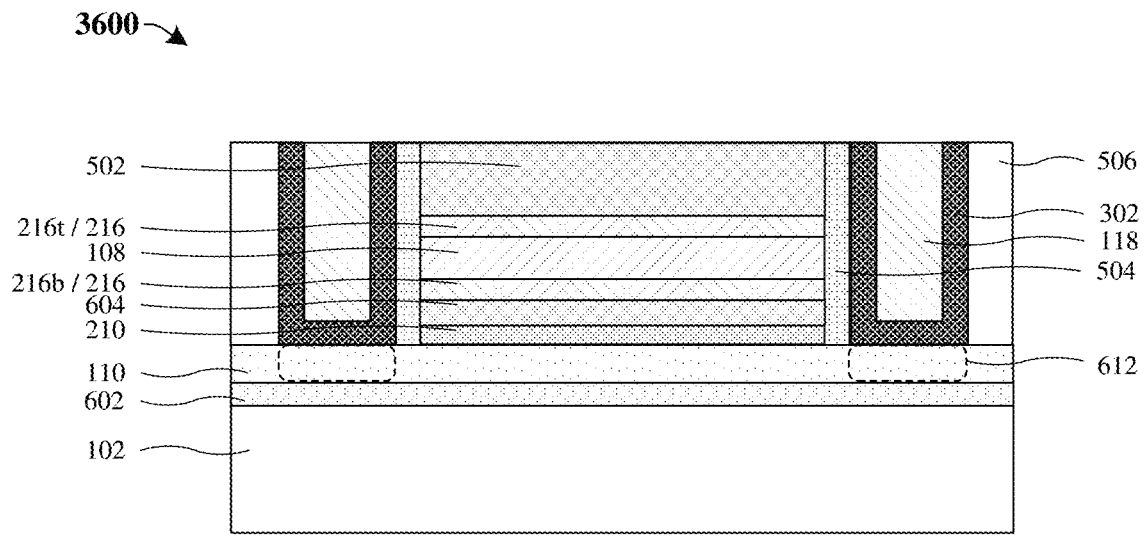

As illustrated by the cross-sectional view 3600 of FIG. 36, a pair of source/drain electrodes 118 is formed in the pair of openings 3302. The pair of source/drain electrodes 118 are formed between inner sidewalls of the pair of barrier segments of the carrier barrier layer 302. A process for forming the pair of source/drain electrodes 118 may, for example, be or comprise depositing the pair of source/drain electrodes 118 into the pair of openings 3302 and subsequently performing a planarization to localize the source/drain electrodes 118 to the openings 3302. The depositing may, for example, be performed by CVD, PVD, ALD, some other suitable deposition process, or any combination of the foregoing. The planarization may, for example, be performed by a CMP or some other suitable planarization process.

Figure 37:
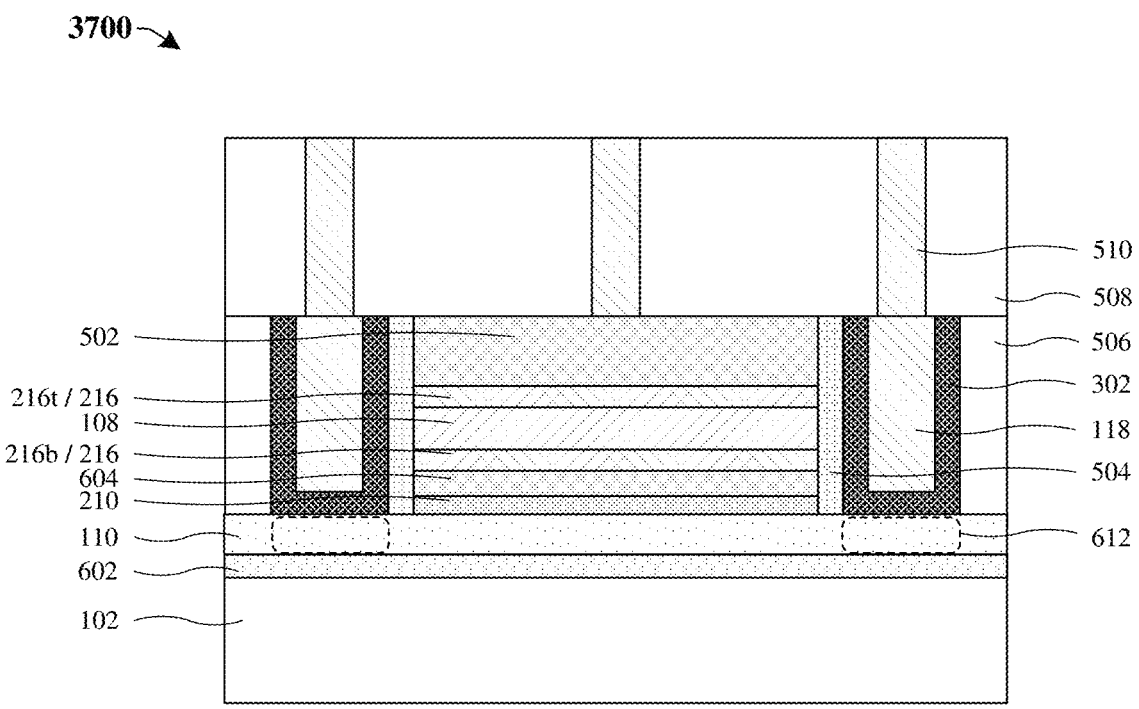

As illustrated by the cross-sectional view 3700 of FIG. 37, a second ILD structure 508 is formed over the pair of source/drain electrodes 118 and the gate electrode 502, and a plurality of contacts 510 is formed, extending through the second ILD structure 508 to contact the pair of source/drain electrodes 118 and the gate electrode 502. The second ILD structure 508 and the plurality of contacts 510 may be formed by, for example, a damascene process, or some other suitable process.

Figure 38:
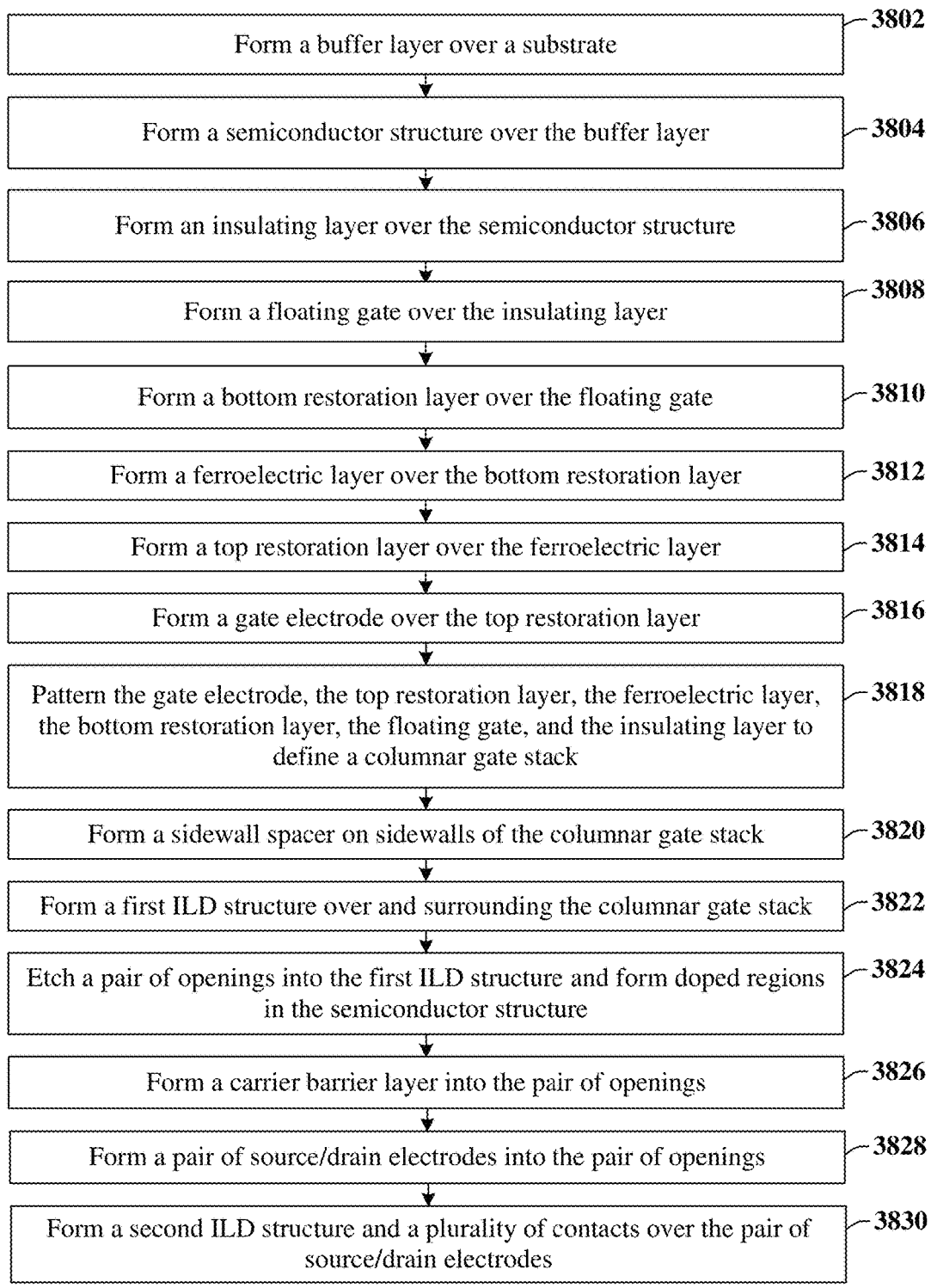
FIG. 38 illustrates a block diagram of some embodiments of the method of FIGS. 22-37.

With respect to FIG. 38 a flowchart 3800 illustrating some embodiments of a method for forming an IC chip in which a top gate FeFET structure comprises a carrier barrier layer separating a pair of source/drain electrodes from a semiconductor structure and further along sidewalls of the source/drain electrodes is provided. The method may, for example, correspond to the method of FIGS. 22-37.

While the disclosed flowchart 3800 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases. It will be appreciated that one or more of the method steps relating to the formation of the insulating layer and the floating gate may be omitted to form the IC chip of FIGS. 6A-6B. It will further be appreciated that one or more of the method steps relating to the formation of the restoration layer and the plasma treated region may also be omitted.

At act 3802, a buffer layer is formed over a substrate. See, for example, FIG. 22.

At act 3804, a semiconductor structure is formed over the buffer layer. See, for example, FIG. 23.

At act 3806, an insulating layer is formed over the semiconductor structure. See, for example, FIG. 24.

At act 3808, a floating gate is formed over the insulating layer. See, for example, FIG. 25. In alternative embodiments, the floating gate and/or the insulating layer is not formed.

At act 3810, a bottom restoration layer is formed over the floating gate. See, for example, FIG. 26.

At act 3812, a ferroelectric layer is formed over the bottom restoration layer. See, for example, FIG. 27.

At act 3814, a top restoration layer is formed over the ferroelectric layer. See, for example, FIG. 28.

At act 3816, a gate electrode is formed over the top restoration layer. See, for example, FIG. 29.

At act 3818, the gate electrode, the top restoration layer, the ferroelectric layer, the bottom restoration layer, the floating gate, and the insulating layer are patterned to define a columnar gate stack. See, for example, FIG. 30.

At act 3820, a sidewall spacer is formed on sidewalls of the columnar gate stack. See, for example, FIG. 31.

At act 3822, a first ILD structure is formed over and surrounding the columnar gate stack. See, for example, FIG. 32.

At act 3824, a pair of openings are etched into the first ILD structure and doped regions are formed in the semiconductor structure. See, for example, FIG. 33.

At act 3826, a carrier barrier layer is formed into the pair of openings. See, for example, FIG. 34.

At act 3828, a pair of source/drain electrodes are formed into the pair of openings. See, for example, FIG. 36.

At act 3830, a second ILD structure and a plurality of contacts are formed over the pair of source/drain electrodes. See, for example, FIG. 37.

Figure 39:
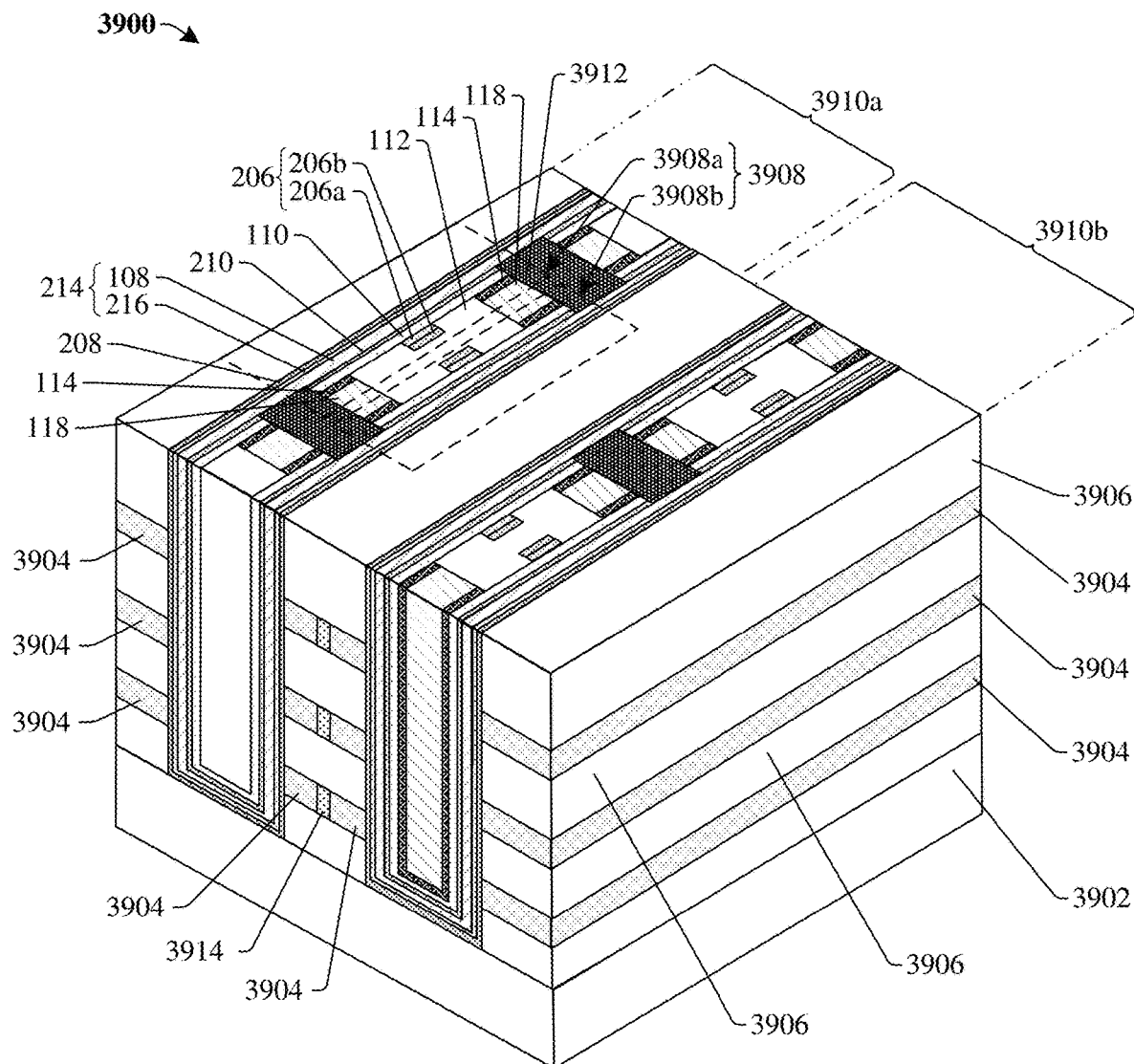
FIG. 39 illustrates a three-dimensional (3D) view of some embodiments of an IC chip in which a 3D FeFET structure comprises a carrier barrier layer separating a pair of source/drain electrodes from a semiconductor structure.

FIG. 39 illustrates a three-dimensional (3D) view 3900 of some embodiments of an IC chip in which a 3D FeFET structure comprises a carrier barrier layer 114 separating a pair of source/drain electrodes 118 from a semiconductor structure 110. A plurality of word lines 3904 are vertically stacked alternatingly with a plurality of dielectric layers 3906 over a substrate 3902. In some embodiments, the plurality of word lines 3904 may be separated from one another by a filler layer 3914. In some embodiments, a number of word lines 3904 vertically stacked over one another may be two or more.

The 3D FeFET structure comprises a first memory cell 3908a comprising a word line 3904. A stress layer 208 is disposed along an inner sidewall of the word line 3904. A ferroelectric structure 214 is disposed along an inner sidewall of the stress layer 208. An insulating layer 210 is disposed along an inner sidewall of the ferroelectric structure 214. The stress layer 208, the ferroelectric structure 214, and the insulating layer 210 are as described with respect to FIG. 2H in function and composition. In alternative embodiments, the ferroelectric structure 214 may be as described with respect to FIG. 2F in function and composition. A semiconductor structure 110 is disposed along an inner sidewall of the insulating layer 210. The semiconductor structure 110 is as described with respect to FIG. 1 in function and composition. In alternative embodiments, the semiconductor structure 110 may be as described with respect to FIG. 2A in function and composition. In some of such embodiments, the semiconductor structure 110 may comprise a plasma treated region as described in FIG. 2B.

A passivation structure 112 is disposed along an inner sidewall of the semiconductor structure 110. The passivation structure 112 is as described with respect to FIG. 3 in function and composition. A capping structure 206 is disposed between the passivation structure 112 and the semiconductor structure 110. The capping structure 206 is as described with respect to FIG. 2C in function and composition. A pair of source/drain electrodes 118 are disposed on opposite sides of the passivation structure 112, and are as described with respect to FIG. 1 in function and composition. A carrier barrier layer 114 separates the semiconductor structure 110 and the pair of source/drain electrodes 118. The carrier barrier layer 114 is as described with respect to FIG. 1 in function and composition. In alternative embodiments, the carrier barrier layer 114 may further separate the passivation structure 112 from the pair of source/drain electrodes 118. In some embodiments, the stress layer 208, the ferroelectric structure 214, the insulating layer 210, the semiconductor structure 110, and the carrier barrier layer 114 may comprise laterally extending portions stacked along an upper surface of the substrate 3902.

The carrier barrier layer 114 produces a carrier barrier between the pair of source/drain electrodes 118 and the semiconductor structure 110. In embodiments in which the 3D FeFET structure is an n-type device, the carrier barrier is an electron barrier. In embodiments in which the 3D FeFET structure is a p-type device, the carrier barrier is a hole barrier. The carrier barrier increases the threshold voltage of the 3D FeFET structure, meaning that the 3D FeFET structure may depend on little or zero voltage to be maintained in the off state, and hence a power consumption of the IC chip may be reduced.

In some embodiments, during operation of the first memory cell 3908a, to write, a set voltage or a reset voltage is applied from the word line 3904 to the semiconductor structure 110 and the ferroelectric structure 214. The set voltage sets the ferroelectric structure 214 to a first state (e.g., a logical '1'), whereas the reset voltage sets the data storage layer to a second state (e.g., a logical '0'). The ferroelectric structure 214 is employed to store a bit of data as the first state or the second state. To read, a read voltage is applied to the word line 3904. The read voltage may be between a threshold voltage of the first state and a threshold voltage of the second state, such that the read voltage would cause the semiconductor structure 110 to conduct in one state but not the other. Thus, the state of the bit of data can be read through drain current flowing between the pair of source/drain electrodes 118.

The first memory cell 3908a shares the passivation structure 112 and the pair of source/drain electrodes 118 with a second memory cell 3908b that is structurally and operationally similar, such that the first memory cell 3908a and the second memory cell 3908b form a memory cell pair 3908. The 3D FeFET structure is separated into a first column of memory cell pairs 3910a and a second column of memory cell pairs 3910b that are structurally and operationally similar. Memory cell pairs 3908 of respective columns of memory cell pairs 3910a, 3910b are separated by an isolation structure 3912. In some embodiments, the 3D FeFET structure may comprise more than two columns of memory cells. In some embodiments, the number of memory cell pairs 3908 vertically stacked over one another may be equal to the number of word lines 3904 vertically stacked over one another (e.g., two or more). In some embodiments, the plurality of word lines 3904 extend in a same direction as the columns of memory cell pairs 3910a, 3910b.

In some embodiments, the substrate 3902 is or comprises silicon, silicon germanium, a group III-V material, a group II-VI material, some other suitable semiconductor material, or any combination of the foregoing. In some embodiments, the plurality of word lines 3904 is or comprises, for example, titanium nitride (e.g., TiN), tantalum nitride (e.g., TaN), platinum (e.g., Pt), titanium (e.g., Ti), tantalum (e.g., Ta) tungsten (e.g., W), iron (e.g., Fe), nickel (e.g., Ni), beryllium (e.g., Be), chromium (e.g., Cr), cobalt (e.g., Co), antimony (e.g., Sb), iridium (e.g., Jr), molybdenum (e.g., Mo), osmium (e.g., Os), thorium (e.g., Th), vanadium (e.g., V), some other suitable metal(s), or any alloy or combination of the foregoing. In some embodiments, the plurality of dielectric layers 3906 may be or otherwise comprise, for example, an oxide or some other suitable material(s). In some embodiments, the isolation structure 3912 may be or otherwise comprise, for example, silicon oxycarbide, silicon oxycarbonitride, aluminum oxide, hafnium dioxide, lanthanum oxide, some other suitable oxide-doped or metal oxide material(s). In some embodiments, the filler layer 3914 may be or otherwise comprise, for example, a nitride (e.g., silicon nitride, silicon oxynitride), or some other suitable material(s).

Accordingly, in some embodiments, the present disclosure relates to an integrated circuit (IC) chip including a memory cell, wherein the memory cell includes a gate electrode, a ferroelectric structure, a semiconductor structure, wherein the semiconductor structure is vertically stacked with the gate electrode and the ferroelectric structure, and wherein the ferroelectric structure is between the gate electrode and the semiconductor structure, a pair of source/drain electrodes laterally separated and respectively on opposite sides of the semiconductor structure, and a carrier barrier layer separating the source/drain electrodes from the semiconductor structure.

In other embodiments, the present disclosure relates to a method for forming an integrated circuit (IC) chip including forming a gate electrode over a substrate, forming a ferroelectric structure over the gate electrode, forming a semiconductor structure over the ferroelectric structure, forming a carrier barrier layer over the semiconductor substrate, wherein the carrier barrier layer includes a pair of barrier segments respectively on opposite sides of the gate electrode, and forming a pair of source/drain electrodes directly over the pair of barrier segments of the carrier barrier layer.

In yet other embodiments, the present disclosure relates to a method for forming an integrated circuit (IC) chip including forming a semiconductor structure over a substrate, forming a ferroelectric structure over the semiconductor structure, forming a gate electrode over the ferroelectric structure, patterning the ferroelectric structure and the gate electrode to form a columnar gate stack, forming an interlayer dielectric (ILD) structure over the semiconductor structure and surrounding sidewalls of the columnar gate stack, forming a carrier barrier layer including a pair of barrier segments respectively on opposite sides of the columnar gate stack and over the semiconductor structure, and forming a pair of source/drain electrodes directly over the pair of barrier segments of the carrier barrier layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) chip comprising a memory cell, the memory cell comprising:
   a gate electrode;
   a ferroelectric structure;
   a semiconductor structure, wherein the semiconductor structure is vertically stacked with the gate electrode and the ferroelectric structure, and wherein the ferroelectric structure is between the gate electrode and the semiconductor structure;
   a pair of source/drain electrodes laterally spaced apart over the semiconductor structure; and a carrier barrier layer comprising a first semiconductor, the first semiconductor directly under the pair of source/drain electrodes and separating the pair of source/drain electrodes from the semiconductor structure, wherein the first semiconductor is over a topmost surface of the semiconductor structure.

2. The IC chip of claim 1, wherein bottommost surfaces of the pair of source/drain electrodes are directly on the first semiconductor and spaced over the topmost surface of the semiconductor structure.

3. The IC chip of claim 1, wherein the semiconductor structure comprises a second semiconductor different than the first semiconductor, wherein the pair of source/drain electrodes are directly over the second semiconductor, and wherein the first semiconductor is directly over the second semiconductor.

4. The IC chip of claim 1, further comprising:
   an insulator layer arranged between the ferroelectric structure and the semiconductor structure and configured to inhibit oxygen vacancies at an interface between the ferroelectric structure and the semiconductor structure.

5. The IC chip of claim 1, further comprising:
   a stress layer arranged between the gate electrode and the ferroelectric structure and configured to apply tensile stress to the ferroelectric structure.

6. The IC chip of claim 1, wherein the ferroelectric structure comprises:
   a plurality of seed layers; and
   a plurality of ferroelectric layers, wherein the plurality of seed layers is alternatingly stacked with the plurality of ferroelectric layers, and wherein a bottom seed layer of the plurality of seed layers separates the plurality of ferroelectric layers from the gate electrode.

7. The IC chip of claim 1, wherein the semiconductor structure comprises a plurality of cocktail layers alternatingly stacked with a plurality of first semiconductor layers,
   wherein the cocktail layers comprise a mixture of a first material and a second material, and
   wherein the first semiconductor layers comprise a third material different than the first and second materials.

8. The IC chip of claim 1, further comprising:
   a capping structure arranged over the semiconductor structure, laterally between the pair of source/drain electrodes, and configured to reduce defects at a topmost surface of the semiconductor structure and to increase charge mobility of the semiconductor structure.

9. The IC chip of claim 1, wherein the carrier barrier layer forms a Schottky barrier at a first interface with the pair of source/drain electrodes.

10. The IC chip of claim 1, wherein the first semiconductor extends along sidewalls of the pair of source/drain electrodes and over a topmost surface of the ferroelectric structure.

11. An integrated chip comprising:
    a substrate;
    a ferroelectric layer over the substrate;
    a gate electrode on a first side of the ferroelectric layer;
    a semiconductor layer on a second side of the ferroelectric layer, opposite the first side, the semiconductor layer comprising a first semiconductor;
    a pair of source/drain electrodes laterally spaced apart and directly over the first semiconductor; and
    a carrier barrier layer comprising a second semiconductor different than the first semiconductor, the second semiconductor directly between the first semiconductor and the pair of source/drain electrodes, the second semiconductor directly between the ferroelectric layer and the pair of source/drain electrodes.

12. The integrated chip of claim 11, wherein the second semiconductor is directly between bottom surfaces of the pair of source/drain electrodes and a top surface of the ferroelectric layer, wherein the carrier barrier layer comprises a first barrier segment and a second barrier segment laterally spaced apart over the semiconductor layer.

13. The integrated chip of claim 12, further comprising:
    a passivation layer directly between the first barrier segment and the second barrier segment and extending from a sidewall of the first barrier segment to a sidewall of the second barrier segment.

14. The integrated chip of claim 11, wherein the second semiconductor extends along bottom surfaces and sidewalls of the pair of source/drain electrodes.

15. The integrated chip of claim 14, wherein, wherein the gate electrode and the ferroelectric layer are laterally between the pair of source/drain electrodes, and wherein the second semiconductor is directly between the sidewalls of the pair of source/drain electrodes and sidewalls of the ferroelectric layer.

16. The integrated chip of claim 15, further comprising:
    a sidewall spacer layer directly between the second semiconductor and sidewalls of the gate electrode.

17. An integrated chip comprising:
    a substrate;
    a gate electrode disposed at a first height over an upper surface of the substrate;
    a semiconductor layer disposed at a second height over the upper surface of the substrate, different than the first height, the semiconductor layer comprising a first semiconductor;
    a ferroelectric layer directly between the gate electrode and the semiconductor layer;
    a first source/drain electrode and a second source/drain electrode laterally spaced apart directly over a top surface of the first semiconductor of the semiconductor layer, the first source/drain electrode and the second source/drain electrode comprising a metal; and
    a carrier barrier layer comprising a first barrier segment and a second barrier segment, wherein the first barrier segment and the second barrier segment comprise a second semiconductor different than the first semiconductor, wherein the second semiconductor of the first barrier segment separates a bottom surface of the first source/drain electrode from the top surface of the first semiconductor of the semiconductor layer, wherein the second semiconductor of the second barrier segment separates a bottom surface of the second source/drain electrode from the top surface of the first semiconductor of the semiconductor layer, and wherein the second semiconductor of the first barrier segment and the second barrier segment is over a topmost surface of the ferroelectric layer.

18. The integrated chip of claim 17, wherein the second height is greater than the first height, and wherein the integrated chip further comprises:
    a passivation structure directly between the first source/drain electrode and the second source/drain electrode and directly between the second semiconductor of the first barrier segment and the second semiconductor of the second barrier segment, wherein the passivation structure extends along a sidewall of the first source/drain electrode, a sidewall of the second semiconductor of the first barrier segment, a sidewall of the second source/drain electrode, and a sidewall of the second semiconductor of the second barrier segment.

19. The integrated chip of claim 17, wherein the first height is greater than the second height, wherein the gate electrode and the ferroelectric layer are laterally between the first source/drain electrode and the second source/drain electrode, wherein the second semiconductor of the first barrier segment separates a sidewall of the first source/drain electrode from a first sidewall of the gate electrode and a first sidewall of the ferroelectric layer, and wherein the second semiconductor of the second barrier segment separates a sidewall of the second source/drain electrode from a second sidewall of the gate electrode and a second sidewall of the ferroelectric layer.

20. The integrated chip of claim 17, wherein the second semiconductor of the first barrier segment directly contacts the bottom surface of the first source/drain electrode and the top surface of the first semiconductor of the semiconductor layer, and wherein the second semiconductor of the second barrier segment directly contacts the bottom surface of the second source/drain electrode and the top surface of the first semiconductor of the semiconductor layer.

\* \* \* \* \*